(12) United States Patent
Wu et al.

(10) Patent No.: US 12,354,543 B2
(45) Date of Patent: Jul. 8, 2025

(54) PIXEL CIRCUIT, DRIVING METHOD OF PIXEL CIRCUIT AND DISPLAY APPARATUS

(71) Applicants: Hefei BOE Joint Technology Co., Ltd., Anhui (CN); BOE TECHNOLOGY GROUP CO., LTD., Beijing (CN)

(72) Inventors: Liu Wu, Beijing (CN); Xuehuan Feng, Beijing (CN); Yongqian Li, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/262,121

(22) PCT Filed: May 30, 2022

(86) PCT No.: PCT/CN2022/096097
§ 371 (c)(1),
(2) Date: Jul. 19, 2023

(87) PCT Pub. No.: WO2023/230800
PCT Pub. Date: Dec. 7, 2023

(65) Prior Publication Data
US 2024/0395198 A1    Nov. 28, 2024

(51) Int. Cl.
*G09G 3/3233* (2016.01)
*G11C 19/28* (2006.01)

(52) U.S. Cl.
CPC .......... *G09G 3/3233* (2013.01); *G11C 19/28* (2013.01); *G09G 2300/0852* (2013.01);
(Continued)

(58) Field of Classification Search
CPC ......... G09G 3/3233; G09G 2300/0852; G09G 2300/0861; G09G 2310/0286; G09G 2310/08; G09G 2320/043; G11C 19/28
See application file for complete search history.

(56) References Cited

U.S. PATENT DOCUMENTS

| | | | |
|---|---|---|---|
| 9,870,734 B2* | 1/2018 | Yang | G09G 3/3233 |
| 2014/0300281 A1* | 10/2014 | Chaji | G09G 3/3233 |
| | | | 315/161 |

(Continued)

FOREIGN PATENT DOCUMENTS

| CN | 108399889 A | 8/2018 |
|---|---|---|
| CN | 108877664 A | 11/2018 |

(Continued)

*Primary Examiner* — Stephen G Sherman
(74) *Attorney, Agent, or Firm* — XSENSUS LLP

(57) ABSTRACT

A pixel circuit includes: a driving sub-circuit, a sensing sub-circuit, a light-emitting control sub-circuit, a sensing control sub-circuit, a light-emitting device and a sensing terminal. The driving sub-circuit includes a first terminal and a second terminal coupled to the light-emitting device, and is configured to write a data signal into the driving sub-circuit in response to a first scan signal and control an electrical signal flowing through the driving sub-circuit according to the data signal. The sensing sub-circuit is configured to connect the second terminal to the sensing terminal in response to a second scan signal. The light-emitting control sub-circuit is configured to connect a first voltage terminal to the first terminal in response to a light-emitting control signal. The sensing control sub-circuit is configured to connect a second voltage terminal to the first terminal in response to a sensing control signal provided by a sensing control terminal.

16 Claims, 39 Drawing Sheets

(52) U.S. Cl.
CPC ............. *G09G 2300/0861* (2013.01); *G09G 2310/0286* (2013.01); *G09G 2310/08* (2013.01); *G09G 2320/043* (2013.01)

(56) References Cited

U.S. PATENT DOCUMENTS

| | | |
|---|---|---|
| 2015/0042630 A1 | 2/2015 | Lee |
| 2015/0371716 A1* | 12/2015 | Shao .................... G11C 19/287 |
| | | 327/109 |
| 2017/0193960 A1* | 7/2017 | Peng ...................... G11C 19/28 |
| 2019/0325822 A1* | 10/2019 | Li ......................... G09G 3/3233 |
| 2019/0325823 A1 | 10/2019 | Yang et al. |
| 2020/0184886 A1 | 6/2020 | Chun |
| 2021/0335234 A1 | 10/2021 | Yin |
| 2022/0309970 A1 | 9/2022 | Yu et al. |
| 2023/0247868 A1 | 8/2023 | Yamanaka |

FOREIGN PATENT DOCUMENTS

| | | |
|---|---|---|
| CN | 110520922 A | 11/2019 |
| CN | 111179855 A | 5/2020 |
| CN | 111292685 A | 6/2020 |
| CN | 113160739 A | 7/2021 |
| CN | 114360433 A | 4/2022 |
| WO | 2021240574 A1 | 12/2021 |

\* cited by examiner

PIXEL CIRCUIT, DRIVING METHOD OF PIXEL CIRCUIT AND DISPLAY APPARATUS

CROSS-REFERENCE TO RELATED APPLICATION

This application is a national phase entry under 35 USC 371 of International Patent Application No. PCT/CN2022/096097 filed on May 30, 2022, which is incorporated herein by reference in its entirety.

TECHNICAL FIELD

The present disclosure relates to the field of display technologies, and in particular, to a pixel circuit, a driving method of a pixel circuit and a display apparatus.

BACKGROUND

In the display field, organic light-emitting diode (OLED) display apparatuses have advantages such as self-luminescence, high contrast, low energy consumption, wide viewing angle, fast response speed, wide temperature range.

SUMMARY

In an aspect, a pixel circuit is provided. The pixel circuit includes: a driving sub-circuit, a sensing sub-circuit, a light-emitting control sub-circuit, a sensing control sub-circuit, a light-emitting device and a sensing terminal. The driving sub-circuit includes a first terminal and a second terminal coupled to the light-emitting device, and is configured to write a data signal into the driving sub-circuit in response to a first scan signal and control an electrical signal flowing through the first terminal and the second terminal of the driving sub-circuit according to the data signal. The sensing sub-circuit is configured to connect the second terminal of the driving sub-circuit to the sensing terminal in response to a second scan signal. The light-emitting control sub-circuit is configured to connect a first voltage terminal to the first terminal of the driving sub-circuit in response to a light-emitting control signal. The sensing control sub-circuit is configured to connect a second voltage terminal to the first terminal of the driving sub-circuit in response to a sensing control signal provided by a sensing control terminal.

In some embodiments, the first voltage terminal is coupled to the second voltage terminal.

In some embodiments, the sensing control sub-circuit includes a first transistor. The first transistor includes a gate, a first electrode and a second electrode; in the first transistor, the gate is coupled to the sensing control terminal, the first electrode is coupled to the second voltage terminal, and the second electrode is coupled to the first terminal of the driving sub-circuit.

In some embodiments, the light-emitting control sub-circuit includes a second transistor. The second transistor includes a gate, a first electrode and a second electrode; in the second transistor, the gate is configured to receive the light-emitting control signal, the first electrode is coupled to the first voltage terminal, and the second electrode is coupled to the first terminal of the driving sub-circuit.

In some embodiments, in the case where the sensing control sub-circuit includes the first transistor, a width-to-length ratio of the first transistor is greater than that of the second transistor.

In some embodiments, the driving sub-circuit includes a third transistor, a driving transistor and storage capacitor.

The third transistor includes a gate, a first electrode and a second electrode; in the third transistor, the gate is configured to receive the first scan signal, and the first electrode is configured to receive the data signal.

The driving transistor includes a gate, a first electrode and a second electrode; in the driving transistor, the gate is coupled to the second electrode of the third transistor, the first electrode serves as the first terminal of the driving sub-circuit, and the second electrode serves as the second terminal of the driving sub-circuit and is coupled to the light-emitting device.

The storage capacitor includes a first end and a second end; the first end and the second end of the storage capacitor are respectively coupled to the gate and the second electrode of the driving transistor.

In some embodiments, the sensing sub-circuit includes a fourth transistor. The fourth transistor includes a gate, a first electrode and a second electrode; in the fourth transistor, the gate is configured to receive the second scan signal, the first electrode is coupled to the second terminal of the driving sub-circuit, and the second electrode is coupled to the sensing terminal.

In another aspect, a driving method of the pixel circuit is provided. The driving method of the pixel circuit includes: transmitting, by the sensing control sub-circuit, a voltage applied to the second voltage terminal to the first terminal of the driving sub-circuit in response to the sensing control signal being at a valid voltage; writing, by the driving sub-circuit, the data signal into the driving sub-circuit in response to the first scan signal; writing, by the sensing sub-circuit, a sensing signal applied to the sensing terminal into the second terminal of the driving sub-circuit in response to the second scan signal; gradually changing a voltage of the sensing signal until the driving sub-circuit reaches an off state; and detecting a voltage of the second terminal of the driving sub-circuit.

In some embodiments, in a case where the sensing control sub-circuit includes the first transistor, the driving sub-circuit includes the third transistor and the driving transistor, and the sensing sub-circuit includes the fourth transistor, the first transistor is turned on in response to the sensing control signal being at the valid voltage, so as to transmit the voltage of the second voltage terminal to the first electrode of the driving transistor.

The third transistor is turned on in response to the first scan signal being at a valid voltage, so as to write the data signal into the gate of the drive transistor; and the fourth transistor is turned on in response to the second scan signal being at a valid voltage, so as to transmit the sensing signal received by the sensing terminal to the second electrode of the driving transistor.

The voltage of the sensing signal is gradually changed until a voltage difference between the gate and the second electrode of the driving transistor is substantially equal to a threshold voltage of the driving transistor; and the voltage of the second electrode of the driving transistor is detected.

In yet another aspect, a display apparatus is provided. The display apparatus includes data lines, first pixel circuits, and second pixel circuits. The first pixel circuits and the second pixel circuits each are the pixel circuit in the above embodiments; and both a first pixel circuit in the first pixel circuits and a second pixel circuit in the second pixel circuits are coupled to a data line in the data lines.

In some embodiments, a sensing control terminal of the first pixel circuit is coupled to a sensing control terminal of the second pixel circuit.

In some embodiments, the display apparatus further includes a shift register circuit. The shift register circuit is configured to: output an Nth stage first scan signal and an Nth stage second scan signal to the first pixel circuit; and output an Mth stage first scan signal and an Mth stage second scan signal to the second pixel circuit. The shift register circuit is further configured to output the sensing control signal to at least one of a sensing control terminal of the first pixel circuit and a sensing control terminal of the second pixel circuit. M and N are different natural numbers.

In some embodiments, the shift register circuit includes a first input sub-circuit, Mth stage output sub-circuit, a sensing control signal output sub-circuit and an Nth stage output sub-circuit. The first input sub-circuit is configured to, in response to an input signal applied to a first signal input terminal, set an Nth stage pull-up node and an Mth stage pull-up node to be at a valid voltage.

The Mth stage output sub-circuit is configured to, in response to the valid voltage at the Mth stage pull-up node, transmit an Mth stage first clock signal applied to an Mth stage first clock signal terminal to an Mth stage first output terminal as the Mth stage first scan signal, and transmit an Mth stage second clock signal applied to an Mth stage second clock signal terminal to an Mth stage second output terminal as the Mth stage second scan signal. Both the Mth stage first output terminal and the Mth stage second output terminal are coupled to the second pixel circuit.

The sensing control signal output sub-circuit is configured to, in response to the valid voltage at the Mth stage pull-up node, transmit an Mth stage third clock signal of an Mth stage third clock signal terminal to a sensing control signal output terminal as the sensing control signal. The sensing control signal output terminal is coupled to at least one of the sensing control terminal of the second pixel circuit and the sensing control terminal of the first pixel circuit.

The Nth stage output sub-circuit is configured to, in response to the valid voltage at the Nth stage pull-up node, transmit an Nth stage first clock signal of an Nth stage first clock signal terminal to an Nth stage first output terminal as the Nth stage first scan signal, and transmit an Nth stage second clock signal applied to an Nth stage second clock signal terminal to an Nth stage second output terminal as the Nth stage second scan signal. Both the Nth stage first output terminal and the Nth stage second output terminal are coupled to the first pixel circuit.

In some embodiments, the sensing control signal output sub-circuit includes a fifth transistor. The fifth transistor includes a gate, a first electrode and a second electrode; in the fifth transistor, the gate is coupled to the Mth stage pull-up node, the first electrode is coupled to the Mth stage third clock signal terminal, and the second electrode is coupled to the sensing control signal output terminal.

In some embodiments, the sensing control signal output sub-circuit further includes a first capacitor. The first capacitor includes a first end and a second end; in the first capacitor, the first end is coupled to the gate of the fifth transistor and the Mth stage pull-up node, and the second end is coupled to the second electrode of the fifth transistor and the sensing control signal output terminal.

In some embodiments, the shift register circuit further includes a shift signal output sub-circuit.

The shift signal output sub-circuit is configured to, in response to the valid voltage at the Nth stage pull-up node, transmit an Nth stage third clock signal applied to an Nth stage third clock signal terminal to a shift signal output terminal.

In some embodiments, the shift register circuit further includes a first reset sub-circuit. The first reset sub-circuit is configured to set the Mth stage pull-up node and the Nth stage pull-up node to be at an invalid voltage in response to a first reset signal of a first reset input terminal.

In some embodiments, the shift register circuit further includes an Mth stage first pull-down control sub-circuit and an Mth stage first noise reduction sub-circuit. The Mth stage first pull-down control sub-circuit is configured to, in response to the valid voltage at the Mth stage pull-up node, set an Mth stage first pull-down node to be at an invalid voltage.

The Mth stage first noise reduction sub-circuit is configured to, in response to the Mth stage first pull-down node being at a valid voltage, set at least one of the Mth stage first output terminal and the Mth stage second output terminal to be at an invalid voltage.

In some embodiments, the Mth stage first pull-down control sub-circuit includes a sixth transistor, a seventh transistor, an eighth transistor and a ninth transistor. The sixth transistor includes a gate, a first electrode and a second electrode; in the sixth transistor, both the gate and the first electrode are coupled to a fifth voltage terminal.

The seventh transistor includes a gate, a first electrode and a second electrode; in the seventh transistor, the gate is coupled to the second electrode of the sixth transistor, the first electrode is coupled to the fifth voltage terminal, and the second electrode is coupled to the Mth stage first pull-down node.

The eighth transistor includes a gate, a first electrode and a second electrode; in the eighth transistor, the gate is coupled to the Mth stage pull-up node, the first electrode is coupled to the second electrode of the seventh transistor and the Mth stage first pull-down node, and the second electrode is coupled to a fourth voltage terminal.

The ninth transistor includes a gate, a first electrode and a second electrode; in the ninth transistor, the gate is coupled to the Mth stage pull-up node, the first electrode is coupled to the second electrode of the sixth transistor and the gate of the seventh transistor, and the second electrode is coupled to a sixth voltage terminal.

The shift register circuit further includes at least one of a first sensing control signal noise reduction sub-circuit and an M stage first pull-up node noise reduction sub-circuit. The first sensing control signal noise reduction sub-circuit is configured to set the sensing control signal output terminal to be at an invalid voltage in response to the valid voltage at the Mth stage first pull-down node. The M stage first pull-up node noise reduction sub-circuit is configured to set the Mth stage pull-up node to be at an invalid voltage in response to the valid voltage at the Mth stage first pull-down node.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
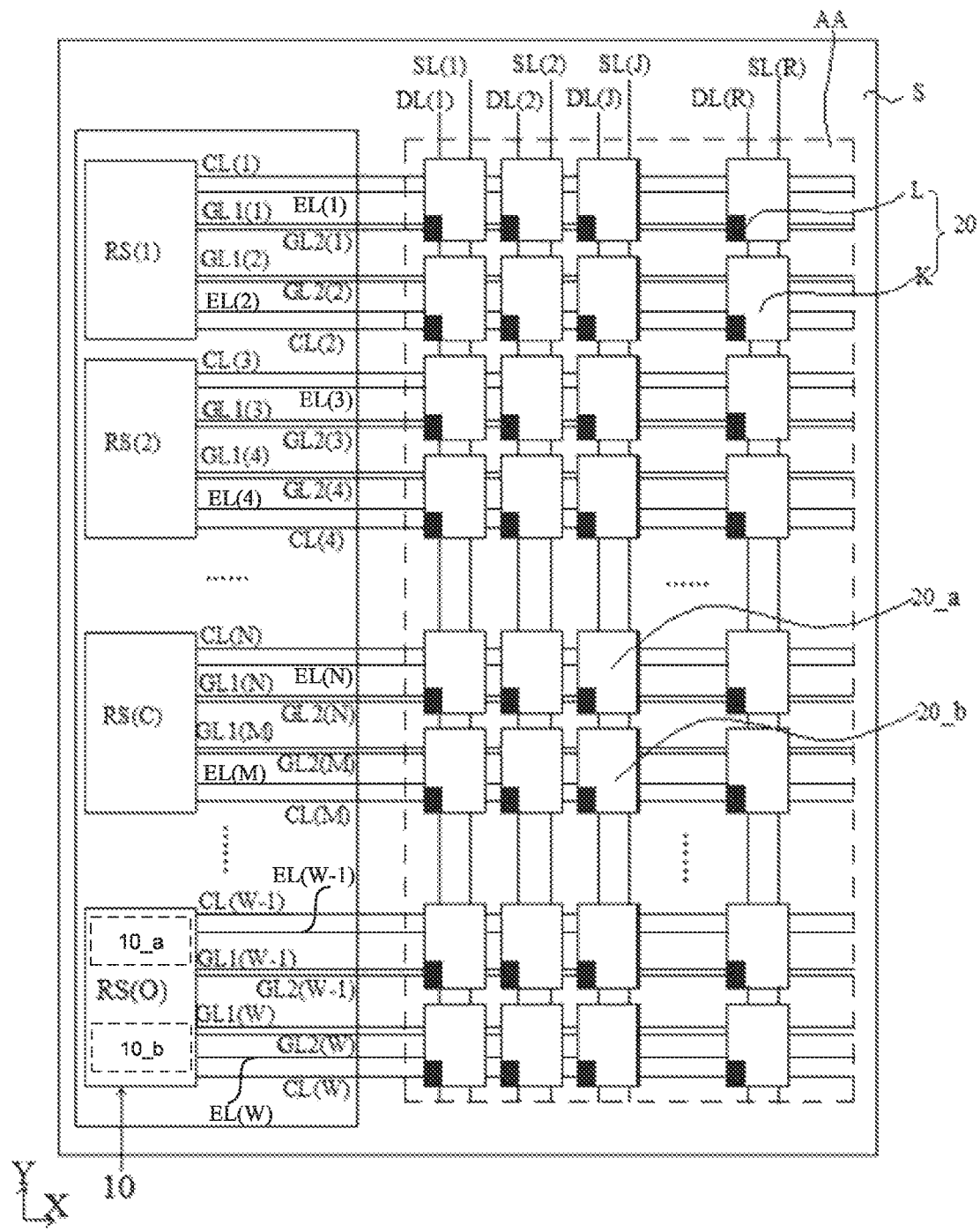
FIG. 1 is a structural diagram of a display panel.

The technical solutions in some embodiments of the present disclosure will be described clearly and completely with reference to the accompanying drawings. Obviously, the described embodiments are merely some but not all of embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a/the plurality of" means two or more unless otherwise specified.

In the description of some embodiments, terms such as "coupled" and "connected" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, depending on the context, the term "if" is optionally construed as "when", "in a case where", "in response to determining" or "in response to detecting". Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The phrase "applicable to" or "configured to" used herein means an open and inclusive expression, which does not exclude devices that are applicable to or configured to perform additional tasks or steps.

The term such as "about", "substantially" or "approximately" as used herein includes a stated value and an average value within an acceptable range of deviation of a particular value. The acceptable range of deviation is determined by a person of ordinary skill in the art in view of measurement in question and errors associated with the measurement of a particular quantity (i.e., limitations of a measurement system).

As used herein, the term such as "parallel", "perpendicular", or "equal" includes a stated condition and a condition similar to the stated condition. A range of the similar condition is in an acceptable range of deviation, and the acceptable range of deviation is determined by a person of ordinary skill in the art in view of measurement in question and errors associated with the measurement of a particular quantity (i.e., the limitation of the measurement system). For example, the term "parallel" or "substantially parallel" includes absolute parallelism and approximate parallelism, and an acceptable range of deviation of the approximate parallelism may be, for example, a deviation within 5°. The term "perpendicular" or "substantially perpendicular" includes absolute perpendicularity and approximate perpendicularity, and an acceptable range of deviation of the approximate perpendicularity may also be, for example, a deviation within 5°. The term "equal" or "substantially equal" includes absolute equality and approximate equality, and an acceptable range of deviation of the approximate equality may be, for example, a difference between two equals being less than or equal to 5% of either of the two equals.

It will be understood that, in a case where a layer or element is referred to be on another layer or substrate, it may be that the layer or element is directly on the another layer or substrate, or it may be that there are intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

Embodiments of the present disclosure provide a display apparatus. The display apparatus may be a product with an image display function. For example, the display apparatus may be a display, a television, a personal computer, a notebook computer, a tablet computer, a billboard, a digital photo frame, a laser printer with a display function, a telephone, a mobile phone, a digital camera, an electronic picture screen, a camcorder, a viewfinder, a monitor, a navigator, a vehicle, a large-area wall, an information search device (e.g., a business search device in a department such as an electronic government, a bank, a hospital or an electric power department), a vehicle-mounted display, or the like. For another example, the display apparatus may also be a display panel (which also called a display screen). As yet another example, in addition to the display panel, the display apparatus may further include other electronic devices, such as a display driver integrated circuit (DDIC). The DDIC is coupled to the display panel and is configured to receive image data and drive the display panel to display corresponding images.

For example, the display panel may be an organic light-emitting diode (OLED) display panel, a quantum dot light-emitting diode (QLED) display panel, or a tiny light-emitting diode (LED, which includes mini LED or micro LED) display panel, etc. The embodiments of the present disclosure are not limited thereto.

FIG. 1 is a structural diagram of a display panel. Referring to FIG. 1, the display panel 100 has a display area AA and a peripheral area S located on at least one side (such as one side, or all four sides) of the display area AA.

The display panel 100 includes a plurality of pixel circuits 20 disposed in the display area AA, a pixel circuit (e.g., each pixel circuit) includes a pixel driving circuit K and a light-emitting device L coupled to each other. The pixel driving circuit K is used to drive the light-emitting device L to emit light. A light exit region of each light-emitting device L may be referred to as a sub-pixel.

For example, the light-emitting device L may be an OLED, a QLED or a tiny LED.

The display panel 100 may include a plurality of light-emitting devices L with different light-emitting colors, for example, including: first light-emitting devices for emitting light of a first color, second light-emitting devices for emitting light of a second color, and third light-emitting devices for emitting light of a third color. The first color, the second color and the third color are three primary colors. For example, the first color is red, the second color is green, and the third color is blue.

With continued reference to FIG. 1, it should be noted that, a plurality of pixel driving circuits K are arranged in an array of n rows and m columns as an example for illustration, but the embodiments of the present invention are not limited thereto, and the plurality of pixel driving circuits K may also be arranged in other way. Pixel driving circuits K arranged in a line along a horizontal direction X are referred to as a same row of pixel driving circuits, and pixel circuits 20 including the same row of pixel driving circuits K are referred to as the same row of pixel circuits 20. Pixel driving circuits K arranged in a line along a vertical direction Y are referred to as a same column of pixel driving circuits, and pixel circuits 20 including the same column of pixel driving circuits K are referred to as the same column of pixel circuits 20.

The pixel circuit 20 (or the pixel driving circuit K) includes a plurality of transistor. The transistors included in the pixel circuit 20 may all be N-type transistors or P-type transistors, or may include both N-type transistor(s) and P-type transistor(s), which may be designed according to actual needs. In addition, the transistors included in the pixel circuit 20 may all be low temperature poly-silicon (LTPS) transistors or oxide transistors, or may include both LTPS transistor(s) and oxide transistor(s). For example, the pixel circuit 20 includes P-type LTPS transistor(s) and N-type oxide transistor(s).

In order to describe the solution clearly, a pixel circuit at an Nth row and a Jth column is referred to as a first pixel circuit 20_a, and a pixel circuit at an Mth row and the Jth column is referred to as a second pixel circuit 20_b. The Jth column may be any column in the display panel. The Nth row and the Mth row may be any two rows in the display panel. For example, the Nth row and the Mth row may be two adjacent rows. That is, M may be equal to N+1 or N−1.

With continued reference to FIG. 1, the display panel 100 further includes a plurality of signal lines, and these signal lines are coupled to the pixel driving circuits K mentioned above. These signal lines include: a plurality of first scan signal lines GL1(1) to GL1(W), a plurality of second scan signal lines GL2(1) to GL2(W), a plurality of sensing control signal lines CL(1) to CL(W), a plurality of light-emitting control signal lines EL(1) to EL(W), a plurality of sensing signal lines SL(1) to SL(R), and a plurality of data lines DL(1) to DL(R).

For example, the first scan signal lines GL1, the second scan signal lines GL2, the light-emitting control signal lines EL and the sensing control signal lines CL extend along the horizontal direction X. The number of the first scan signal lines GL1, the number of the second scan signal lines GL2, the number of the light-emitting control signal lines EL and the number of the sensing control signal lines CL may be the same, for example, equal to the total number of rows of pixel circuits (indicated by W). Of course, the number of any type of signal lines in these signal lines may also be smaller than the total number of rows of pixel circuits. For example, pixel driving circuits K in two adjacent rows share one light-emitting control signal line EL. For another example, pixel driving circuits K in two adjacent rows share one sensing control signal line CL.

In some other examples, the first scan signal line GL1 may further be used as the second scan signal line GL2. For example, the display panel 100 may include W scan signal lines, and each scan signal line is used not only as the first scan signal line, but also as the second scan signal line.

The data lines DL and the sensing signal lines SL may extend in the vertical direction Y. The number of the data lines DL and the number of the sensing signal lines SL may be the same, which are both the total number of columns of pixel circuits (indicated by R). Of course, the number of any type of signal lines in these signal lines may also be smaller than the total number of columns of pixel circuits. For example, pixel driving circuits K in two adjacent columns share one sensing signal line SL.

In the display panel 100, pixel circuits in a same row are coupled to a same first scan signal line GL1, a same second scan signal line GL2, a same sensing control signal line CL and a same light-emitting control signal line EL. For example, pixel circuits 20 in the Nth row are coupled to an Nth first scan signal line GL1 (hereinafter, the Nth first scan signal line is denoted as GL1(N)), an Nth second scan signal line GL2(hereinafter, the Nth second scan signal line is denoted as GL2(N)), an Nth sensing control signal line CL(hereinafter, the Nth sensing control signal line is denoted as CL(N)), and an Nth light-emitting control signal line EL(hereinafter, the Nth light-emitting control signal line is denoted as EL(N)). Pixel circuits 20 in a same column are coupled to a same data line DL and a same sensing signal line SL.

With continued reference to FIG. 1, the display panel includes gate driving circuit(s). In some embodiments, a gate driving circuit may be disposed on a side of the scan signal lines (e.g., the first scan signal lines GL1, or the second scan signal lines GL2) along an extending direction thereof, and may provide electrical signals for the pixel driving circuits in the display panel. Thus, the pixel driving circuit drives the light-emitting device L to emit light, so that a corresponding sub-pixel performs display. FIG. 1 shows an example where the gate driving circuit is disposed on a single side of the peripheral area S of the display panel 100, and inputs valid voltages from the single side to the scan signal lines in sequence row by row (the valid voltage is a voltage that enables the transistor coupled to the scan signal line to be turned on, which is, for example, a high voltage). In some other embodiments, gate driving circuits are respectively disposed on two sides of the peripheral area S of the display panel 100 along the extending direction of the scan signal lines, and input effective voltages from the two sides to the scan signal lines in sequence row by row through the gate driving circuits. In some other embodiments, two gate driving circuits are respectively disposed on two sides of the peripheral area S of the display panel 100 along the extending direction of the scan signal lines, and input effective voltages alternately from the two sides to the scan signal lines in sequence row by row through the two gate driving circuits.

The gate driving circuit includes a plurality of shift register circuits 10. In some embodiments, the gate driving circuit may be a gate driver on array (GOA) circuit; and in this case, the shift register circuits 10 are directly integrated into the display panel 100. In this way, a manufacturing cost of the display panel may be reduced; and in addition, a bezel width of the display apparatus may also be narrowed. In some other embodiments, these shift register circuits 10 may be included in a driver chip, and the driver chip is bonded to the display panel 100.

With continued reference to FIG. 1, in some embodiments of the present disclosure, the gate driving circuit includes O stages of shift register circuits (10(1), 10(2) . . . 10(O)) that are cascaded. For example, the total number W of rows of the pixel circuits is an integer multiple of O, such as 2 times, 3 times, or 4 times. In this case, the pixel circuits (e.g., first pixel circuits 20_a) in the Nth row are coupled to a Cth stage shift register circuit 10(C) through the Nth first scan signal line GL1(N), the Nth second scan signal line GL2(N) and the Nth sensing control signal line CL(N). The pixel circuits (e.g., second pixel circuits 20_b) in the Mth row are coupled to the Cth stage shift register circuit 10(C) through the Mth first scan signal line GL1(M), the Mth second scan signal line GL2(M) and the Mth sensing control signal line CL(M). For example, if W is equal to 2 times O, and M is an even number and equal to N+1; and in this case, M is equal to 2 times C (M=2C).

Figure 2:
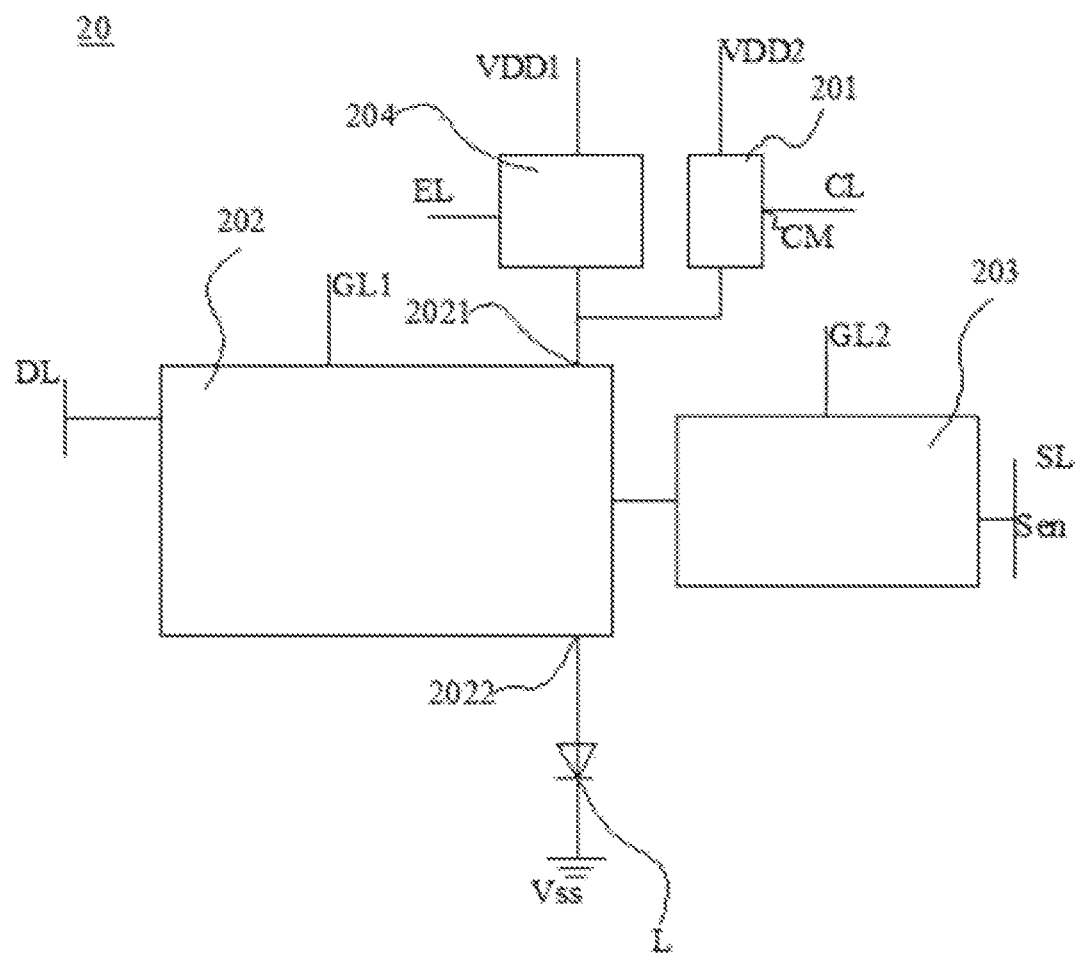
FIG. 2 is a structural diagram of a pixel circuit in FIG. 1.
Figure 3:
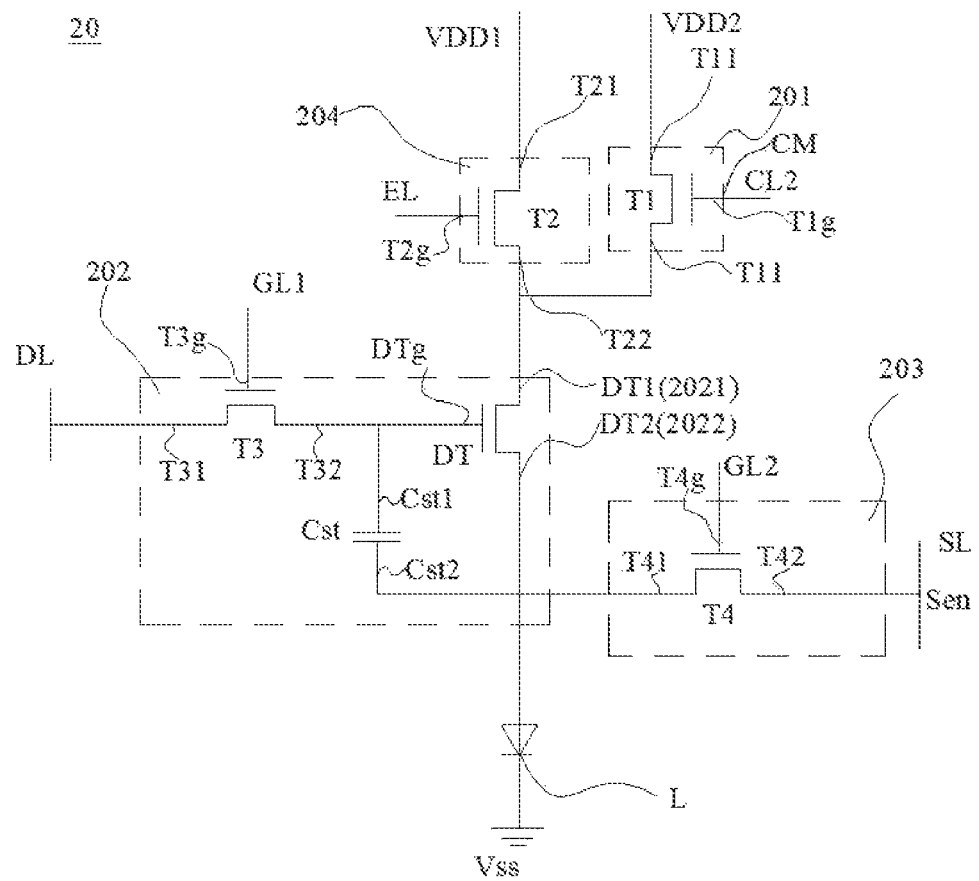
FIG. 3 is a specific structural diagram of the pixel circuit shown in FIG. 2.
Figure 5:
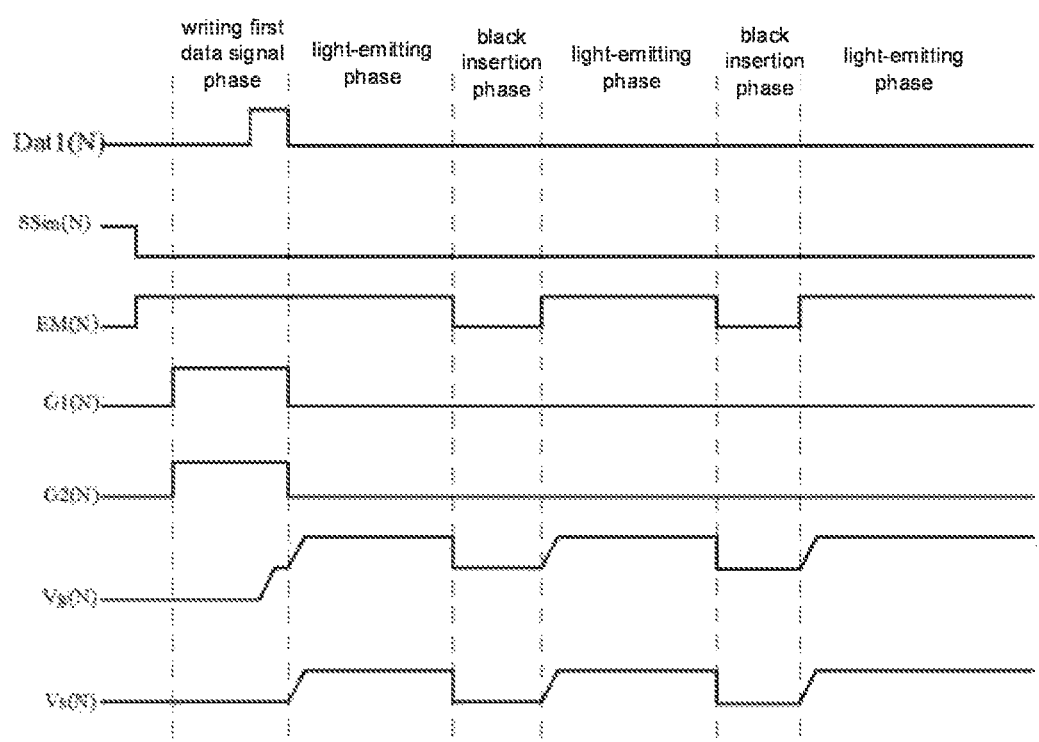
FIG. 5 is a timing diagram of a certain row of pixel circuits.
Figure 8:
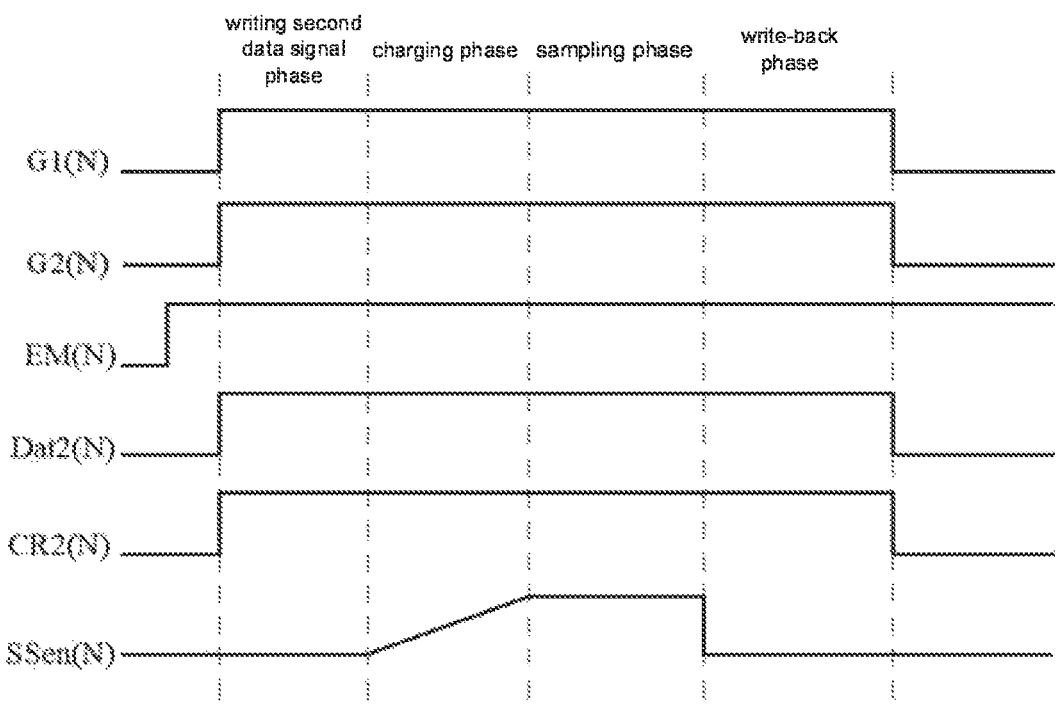
FIG. 8 is a timing diagram of an Nth row of pixel circuits in a sensing phase.

FIG. 2 is a structural diagram of the pixel circuit in FIG. 1. FIG. 3 is a specific structural diagram of the pixel circuit in FIG. 2. Referring to FIGS. 2 and 3, embodiments of the present disclosure provide the pixel circuit 20 (e.g., the first pixel circuit 20_a or the second pixel circuit 20_b), and the pixel circuit 20 includes the light-emitting device L and the pixel driving circuit K (shown in FIG. 1). The pixel driving circuit K (shown in FIG. 1) includes: a driving sub-circuit 202, a sensing sub-circuit 203, a sensing terminal Sen and a light-emitting control sub-circuit 204. In some embodiments, referring to FIG. 2, the driving sub-circuit 202 includes a first terminal 2021 and a second terminal 2022 that is coupled to the light-emitting device L. The driving sub-circuit 202 is configured to write a data signal (provided by the data line DL) into the driving sub-circuit 202 in response to a first scan signal G1 (shown in FIG. 5). For example, the data signal is a first data signal Dat1, which is shown in FIG. 5. For another example, the data signal is a second data signal Dat2, which is shown in FIG. 8. For example, the first scan signal G1 received by the first pixel circuit 20_a is provided by the Nth first scan signal line GL1(N), and the first scan signal G1 received by the second pixel circuit 20_b is provided by the Mth first scan signal line GL1(M). The driving sub-circuit 202 is further configured to control an electrical signal (e.g., a current) flowing through the first terminal 2021 and the second terminal 2022 of the driving sub-circuit 202 according to the data signal (e.g., the first data signal Dat1 or the second data signal Dat2). For example, the first terminal 2021 and the second terminal 2022 of the driving sub-circuit 202 and the light-emitting device L are connected in series between a first voltage terminal VDD1 and a third voltage terminal Vss, so that the driving sub-circuit 202 may control a magnitude of the current flowing through the light-emitting device L. In a case where the data signal received by the driving sub-circuit 202 is the first data signal Dat1, a magnitude of the first data signal Dat1 may be used to adjust a brightness of the light-emitting device L. In a case where the data signal received by the driving sub-circuit 202 is the second data signal Dat2, the light-emitting device L may be in a dark state.

For example, referring to FIG. 3, the driving sub-circuit 202 includes a third transistor T3, a driving transistor DT and a storage capacitor Cst.

The third transistor T3 includes a gate T3g, a first electrode T31 and a second electrode T32. In the third transistor T3, the gate T3g may be coupled to the first scan signal line GL1 and configured to receive the first scan signal G1, and the first electrode T31 may be coupled to the data line DL and configured to receive the data signal (e.g., the first data signal Dat1 or the second data signal Dat2). That is, the third transistor T3 is turned on in response to the first scan signal G1 being at a valid voltage, and transmits the data signal (e.g., the first data signal Dat1 or the second data signal Dat2) from the first electrode T31 to the second electrode T32.

Herein, the valid voltage refers to a voltage for controlling a transistor to be turned on. For example, the transistor is an N-type transistor, and the valid voltage may be at a high level, so that the N-type transistor may be turned on in response to the high level. For another example, the transistor is a P-type transistor, and the valid voltage may be at a low level, so that the P-type transistor may be turned on in response to the low level. For the convenience of the following description, the following description is made by taking an example where the transistor is the N-type transistor and a corresponding valid voltage is at the high level.

The driving transistor DT includes a gate DTg, a first electrode DT1 and a second electrode DT2. The gate DTg of the driving transistor DT is coupled to the second electrode T32 of the third transistor T3, the first electrode DT1 serves as the first terminal 2021 of the driving sub-circuit 202, and the second electrode DT2 serves as the second terminal 2022 of the driving sub-circuit 202. For example, the first electrode DT1 is coupled to the first voltage terminal VDD1, and the second electrode DT2 is coupled to the third voltage terminal Vss. That is, on a path from the first voltage terminal VDD1 to the third voltage terminal Vss, the first electrode DT1 and the second electrode DT2 are arranged in sequence. On this basis, in an example, the light-emitting device L is connected in series between the second electrode DT2 and the third voltage terminal Vss. For example, a first electrode (e.g., an anode) of the light-emitting device L is coupled to the second electrode DT2, and a second electrode (e.g., a cathode) of the light-emitting device L is coupled to the third voltage terminal Vss. In another example, the light-emitting device L is further connected in series between the first electrode DT1 and the first voltage terminal VDD1. In this way, the driving transistor DT controls the magnitude of the current flowing through the light-emitting device L in response to the data signal applied to the gate DTg. For example, the storage capacitor Cst includes a first end Cst1 and a second end Cst2. The first end Cst1 and the second end Cst2 of the storage capacitor Cst are respectively coupled to the gate DTg and the second electrode DT2 of the driving transistor DT, and are configured to maintain a voltage at the gate DTg of the driving transistor DT.

In some embodiments, with continued reference to FIG. 2, the sensing sub-circuit 203 is configured to connect the second terminal 2022 of the driving sub-circuit 202 to the sensing terminal Sen in response to a second scan signal G2 (shown in FIG. 8), so as to transmit a voltage at the sensing terminal Sen to the second terminal 2022 of the driving sub-circuit 202. For example, the second scan signal G2 received by the first pixel circuit 20_a is provided by the Nth second scan signal line GL2(N), and the second scan signal G2 received by the second pixel circuit 20_b is provided by the Mth second scan signal line GL2(M).

For example, with continued reference to refer to FIG. 3, the sensing sub-circuit 203 includes a fourth transistor T4. The fourth transistor T4 includes a gate T4g, a first electrode T41 and a second electrode T42. The gate T4g of the fourth transistor T4 is coupled to the second scan signal line GL2 and configured to receive the second scan signal G2; the first electrode T41 of the fourth transistor T4 is coupled to the second terminal 2022 of the driving sub-circuit 202; and the second electrode T42 is coupled to the sensing terminal Sen. The sensing terminal Sen is coupled to the sensing signal line SL, so that the sensing signal line SL provides the sensing terminal Sen with a sensing signal SSen (shown in FIG. 8). For example, the sensing terminal Sen may be a point on the sensing signal line SL. The fourth transistor T4 is turned on in response to the second scan signal G2 being at a valid voltage, and transmits the voltage at the sensing terminal Sen to the second electrode DT2 of the driving transistor DT, or transmits a voltage at the second electrode DT2 of the driving transistor DT to a sensing chip outside the display panel.

In some embodiments, with continued reference to FIG. 2, the light-emitting control sub-circuit 204 is configured to connect the first voltage terminal VDD1 to the first terminal 2021 of the driving sub-circuit 202 in response to a light-emitting control signal EM (shown in FIG. 7), so as to transmit a voltage at the first voltage terminal VDD1 to the first terminal 2021 of the driving sub-circuit 202. For example, the light-emitting control signal received by the first pixel circuit 20_a is provided by the Nth light-emitting control signal line EL(N), and the light-emitting control signal received by the second pixel circuit 20_b is provided by the Mth light-emitting control signal line EL(M).

For example, with continued reference to FIG. 3, the light-emitting control sub-circuit 204 includes a second transistor T2. The second transistor T2 includes a gate T2g, a first electrode T21 and a second electrode T22. The gate T2g of the second transistor T2 is configured to receive the light-emitting control signal EM, the first electrode T21 is coupled to the first voltage terminal VDD1, and the second electrode T22 is coupled to the first terminal 2021 of the driving sub-circuit 202 (e.g., the first electrode DT1 of the driving transistor DT. In this case, the second transistor T2 is turned on in response to the light-emitting control signal EM being at a valid voltage, and transmits the voltage at the first voltage terminal VDD1 to the first electrode DT1 of the driving transistor DT.

A working principle of the pixel circuit 20 will be described below.

Figure 4:
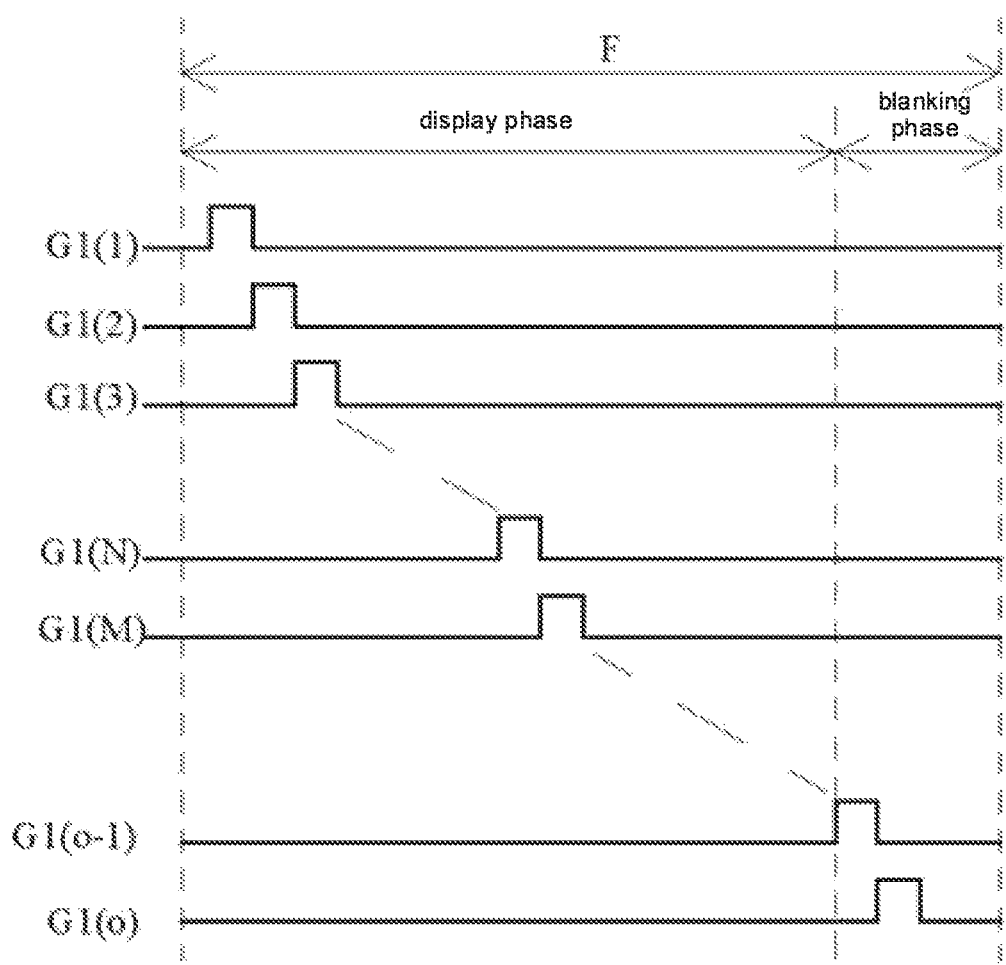
FIG. 4 is a timing diagram of first scan signals.

FIG. 4 is a timing diagram of a plurality of first scan signals. FIG. 5 is a signal timing diagram of a certain row of pixel circuits. Referring to FIG. 4, a display process of each frame F of the display panel includes a display phase and a blanking phase. in the display phase, the DDIC can write a first data signal Dat1 of a frame of image into a corresponding pixel circuit 20; in the blanking phase, at least one pixel circuit (e.g., one pixel circuit, pixel circuits in a row, or pixel circuits in rows) can output voltage(s) of second electrode(s) DT2 of corresponding driving transistor(s) DT, so that an external sensing chip can sense it. Referring to FIG. 5, a display process of pixel circuits in the Nth row (or one pixel circuit in the pixel circuits in the Nth row, e.g., the first pixel circuit 20_a) in each frame F includes a writing first data signal phase, and at least one light-emitting phase and at least one black insertion phase after the writing first data signal phase. The light-emitting phase(s) and the black insertion phase(s) are set alternately. It should be noted that, the blanking phase in FIG. 4 may overlap with the light-emitting phase (in FIG. 5) of a certain pixel circuit 20, or may overlap with the black insertion phase (in FIG. 5) of another pixel circuit 20.

With continued reference to FIG. 5, a driving method of the pixel circuit disclosed in this embodiment includes the following.

Figure 6A:
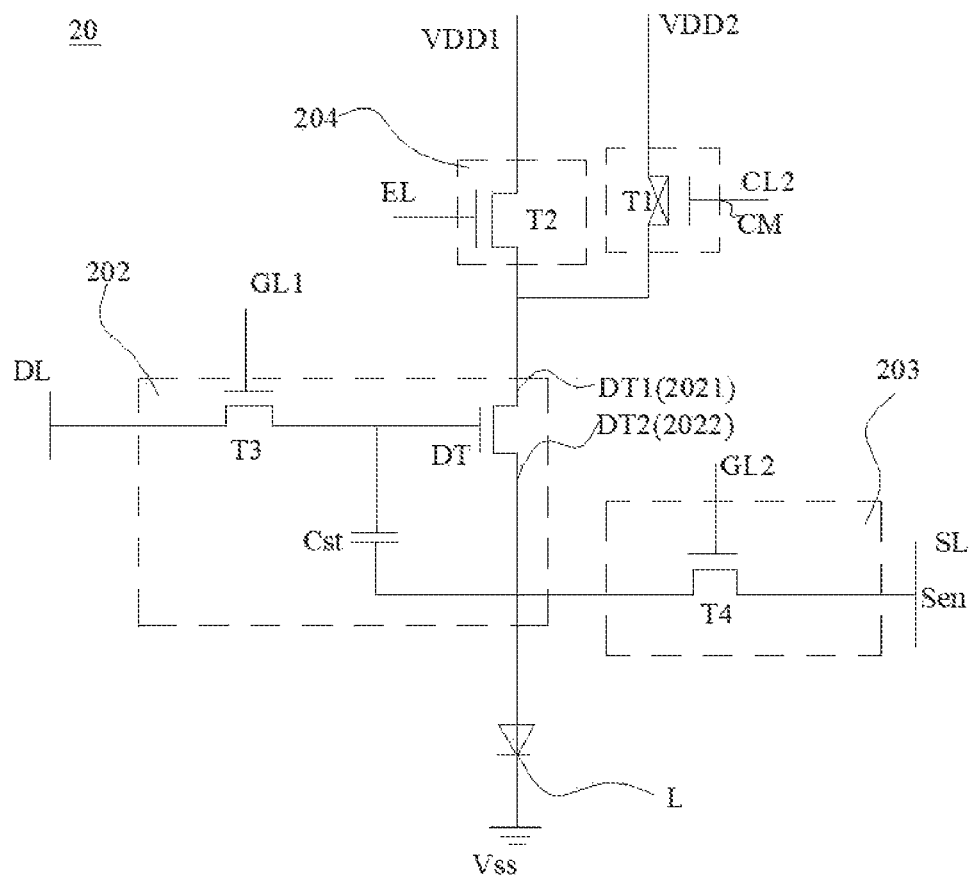
FIG. 6A is a structural diagram showing working of transistors in a writing first data signal phase.

In S11, in the writing first data signal phase, referring to FIGS. 5 and 6A (FIG. 6A is a structural diagram showing working of transistors in the writing first data signal phase), the light-emitting control sub-circuit 204 is configured to transmit the voltage applied to the first voltage terminal VDD1 to the first terminal 2021 of the driving sub-circuit 202 in response to the light-emitting control signal EM, the driving sub-circuit 202 is configured to write the first data signal Dat1 into the driving sub-circuit 202 in response to the first scan signal G1, and the sensing sub-circuit 203 is configured to transmit the voltage at the sensing terminal Sen to the second terminal 2022 of the driving sub-circuit 202 in response to the second scan signal G2. Thus, the light-emitting control sub-circuit 204, the driving sub-circuit 202 and the sensing sub-circuit 203 are turned on.

For example, the third transistor T3 is turned on in response to the first scan signal G1 being at a high voltage, and writes the first data signal Dat1 in a sensing phase into the driving transistor DT. The second transistor T2 is turned on in response to the light-emitting control signal EM being at a high voltage. The fourth transistor T4 is turned on in response to the second scan signal G2 being at a high voltage. Thus, the light-emitting control sub-circuit 204, the driving sub-circuit 202 and the sensing sub-circuit 203 are conducted.

Figure 6B:
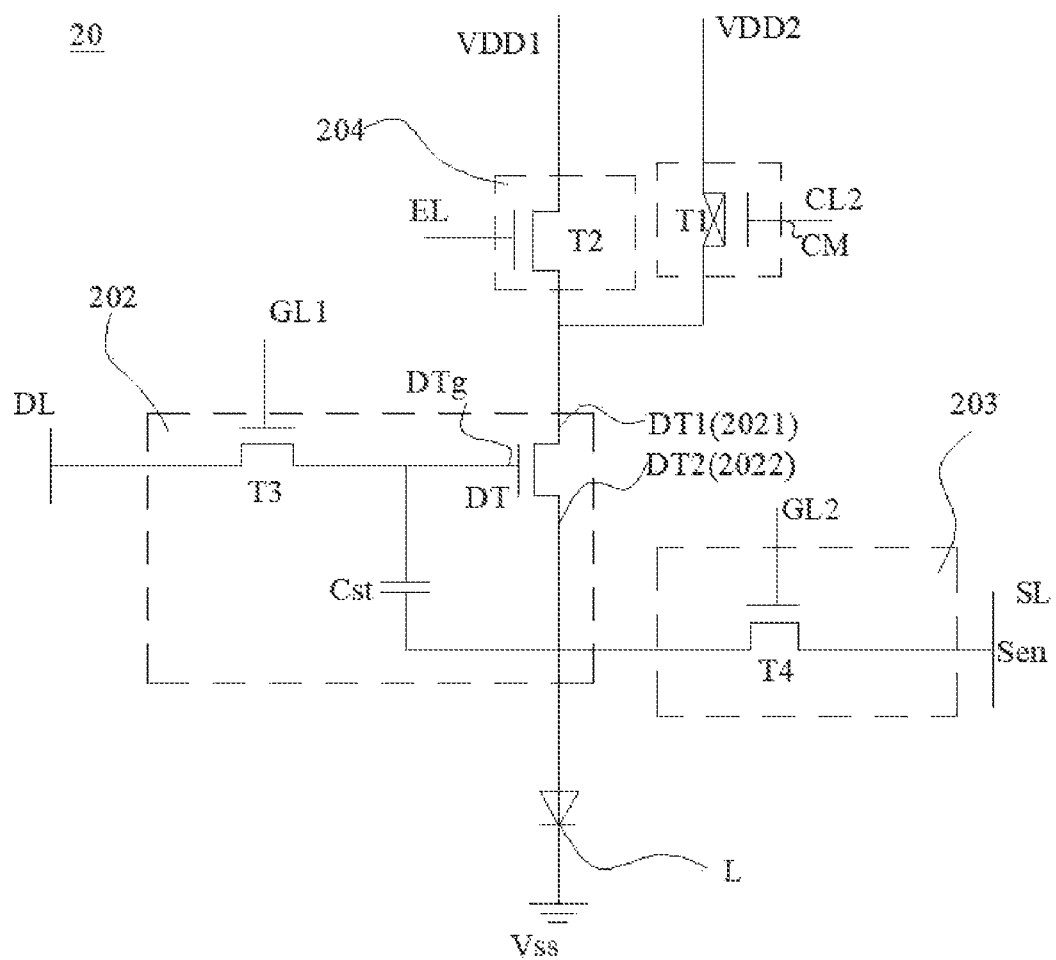
FIG. 6B is a structural diagram showing working of transistors in a light-emitting phase.

In S12, in the light-emitting phase, referring to FIGS. 5 and 6B (FIG. 6B is a structural diagram showing working of transistors in the light-emitting phase), the second terminal 2022 of the driving sub-circuit 202 changes with the voltage at the sensing terminal Sen. Thus, the light-emitting control sub-circuit 204, the driving sub-circuit 202 and the light-emitting device L are conducted, so that the light-emitting device L emits light.

For example, the first electrode T41 of the fourth transistor T4 (which is also the second end Cst2 of the storage capacitor Cst and the second electrode DT2 of the driving transistor DT) changes with the voltage at the sensing terminal Sen, and the voltage at the gate DTg of the driving transistor DT also changes accordingly due to the bootstrap effect of the storage capacitor Cst. For example, if the voltage at the sensing terminal Sen increases, the voltage at the gate DTg of the driving transistor DT also increases. In this way, the driving transistor DT can be turned on, and the light-emitting control sub-circuit 204, the driving sub-circuit 202 and the light-emitting device L can be conducted, so that the light-emitting device L emits light.

Figure 6C:
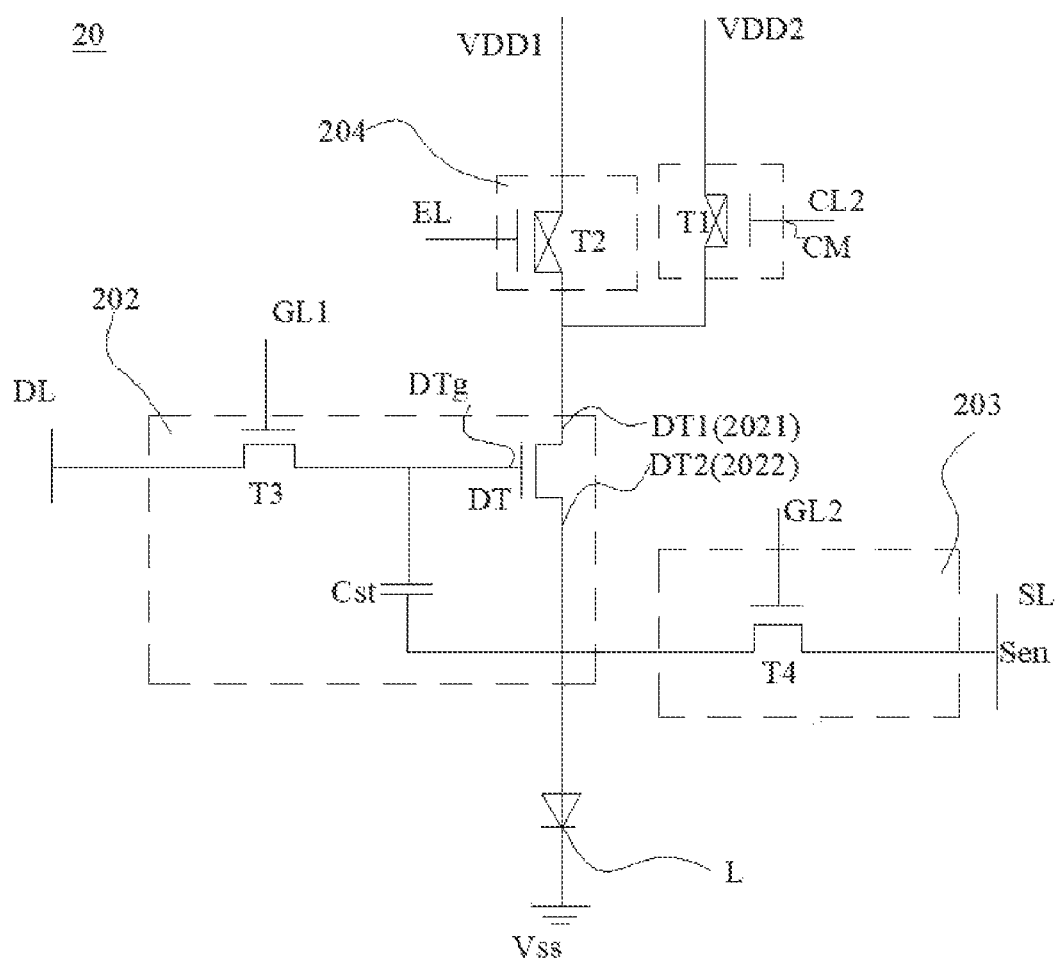
FIG. 6C is a structural diagram showing working of transistors in a black insertion phase.

In S13, in the black insertion phase, referring to FIGS. 5 and 6C (FIG. 6C is a structural diagram showing working of transistors in the black insertion phase), the light-emitting control sub-circuit 204 is turned off in response to the light-emitting control signal EM being at an invalid voltage, so that the voltage of the first voltage terminal VDD1 cannot be transmitted to the second terminal 2022 of the driving sub-circuit 202. The light-emitting control sub-circuit 204, the driving sub-circuit 202 and the light-emitting device L cannot be conducted, so that the light-emitting device L cannot emit light. The invalid voltage refers to a voltage that controls the transistor to be turned off. For example, the invalid voltage may be at a low level, and then the transistor it controls is an N-type transistor. In this case, when the invalid voltage is at the low level, the transistor it controls is turned off. For another example, the invalid voltage may be at a high level, and then the transistor it controls is a P-type transistor. In this case, when the invalid voltage is at the high level, the transistor it controls is turned off. For the convenience of the following description, the following description is made by taking an example where the invalid voltage is at the low level, and the transistor it controls is the N-type transistor.

For example, the second transistor T2 is turned off in response to the light-emitting control signal EM being at a low voltage. In this way, the light-emitting device L stops emitting light and an image is switched to a black image.

Step S12 (light-emitting phase) and step S13 (black insertion phase) are cycled in this way, which may reduce low-gray-scale brightness of the light-emitting device L, so as to prevent low gray scales from not being expanded to.

In some embodiments, referring to FIG. 3, the pixel circuit 20 may further include a sensing control sub-circuit 201. The sensing control sub-circuit 201 is configured to connect a second voltage terminal VDD2 to the first terminal 2021 of the driving sub-circuit 202 in response to a sensing control signal CR2 (shown in FIG. 8) provided by a sensing control terminal CM. Thus, a voltage of the second voltage terminal VDD2 is output to the first terminal 2021 of the driving sub-circuit 202. The sensing control signal CR2 is provided by the Nth sensing control signal line CL(N) or the Mth sensing control signal line CL(M). For example, the sensing control signal received by the first pixel circuit 20_a is provided by the Nth sensing control signal line CL(N), and the sensing control signal received by the second pixel circuit 20_b is provided by the Mth sensing control signal line CL(M).

For example, referring to FIG. 3, the sensing control sub-circuit 201 includes a first transistor T1. The first transistor T1 includes a gate T1g, a first electrode T11 and a second electrode T12. The gate T1g of the first transistor T1 is coupled to the sensing control terminal CM, the first electrode T11 is coupled to the second voltage terminal VDD2, and the second electrode T12 is coupled to the first terminal 2021 of the driving sub-circuit 202. The first transistor T1 transmits the voltage of the second voltage terminal VDD2 to the first electrode DT1 of the driving transistor DT (also the first terminal 2021 of the driving sub-circuit 202) in response to the sensing control signal CR2 (the sensing control terminal providing the sensing control signal CR2 being coupled to the Nth sensing control signal line CL(N) or the Mth sensing control signal line CL(M)) being at a valid voltage.

Figure 7:
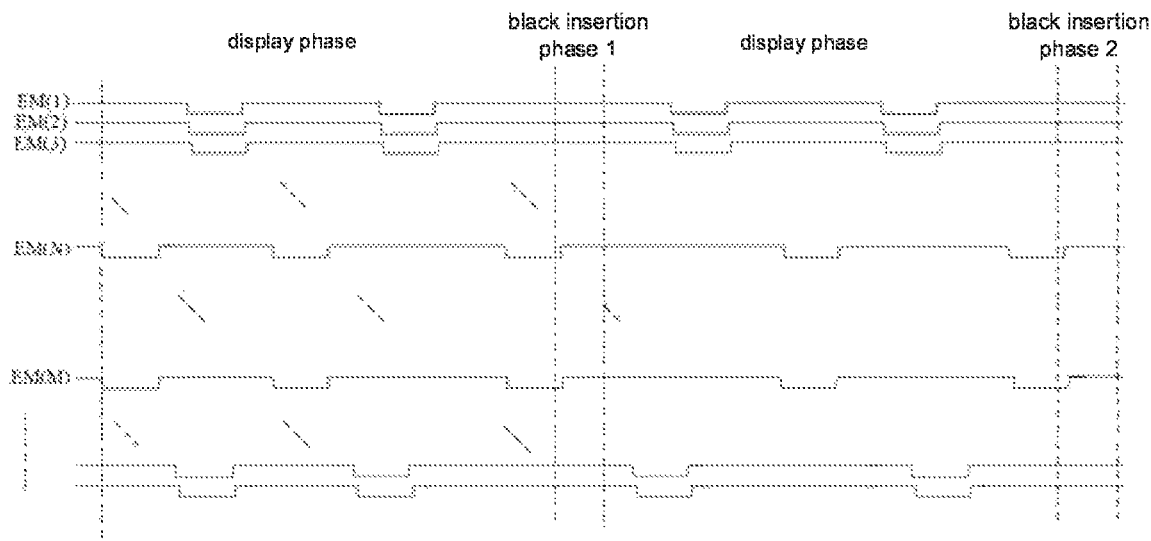
FIG. 7 is a timing diagram of a light-emitting control signal provided by a light-emitting control signal line of the pixel circuit in FIG. 3.

In a driving method of the pixel circuit disclosed in this embodiment, a random sensing is performed in the blanking phase (shown in FIG. 4). The random sensing is that a row is randomly sampled from W rows of pixel driving circuits. The sensing process is to detect the current of the anode of the light-emitting device L through the sensing sub-circuit 203. The following description is made by taking an example where the Nth row of pixel circuits is selected to perform sensing. FIG. 7 is a timing diagram of a light-emitting control signal EM provided by a light-emitting control signal line EL of the pixel circuit in FIG. 3; FIG. 8 is a timing diagram of the Nth row of pixel circuits in the sensing phase. Referring to FIGS. 7 and 8, a specific working process of the sensing phase is as follows.

Figure 9A:
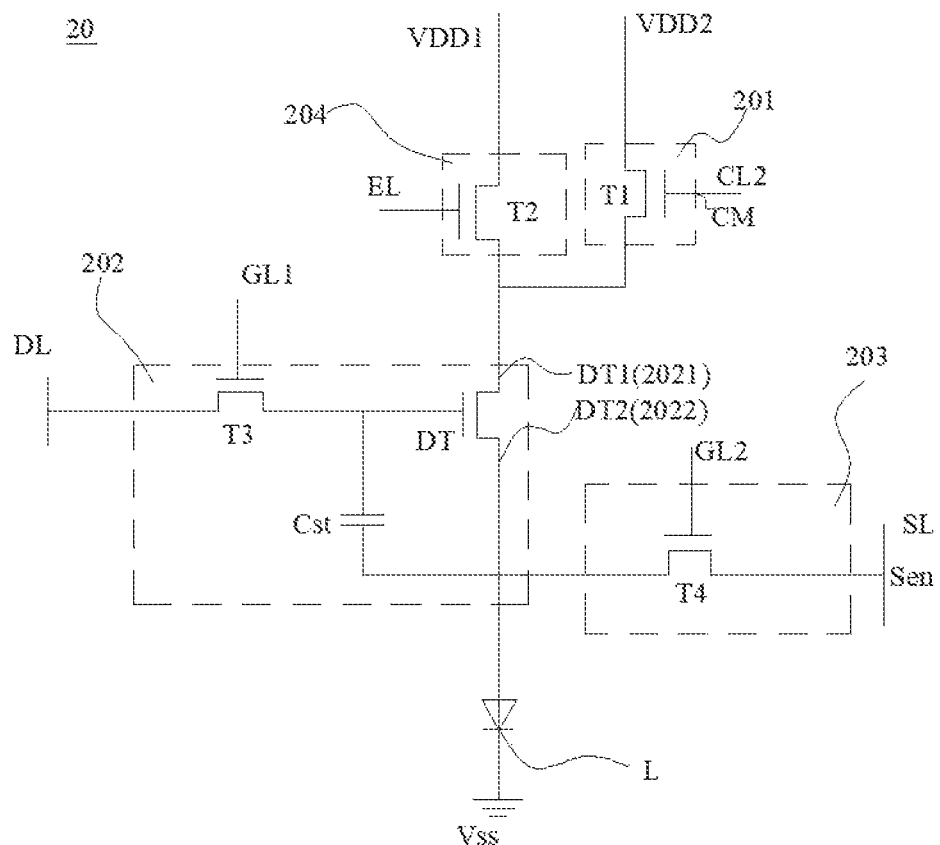
FIG. 9A is a structural diagram showing working of transistors in a writing second data signal phase.

In S21, in a writing second data signal phase, referring to FIGS. 8 and 9A (FIG. 9A is a structural diagram showing working of transistors in the writing second data signal phase), the sensing control sub-circuit 201 transmits the voltage applied to the second voltage terminal VDD2 to the first terminal 2021 of the driving sub-circuit 202 in response to the sensing control signal CR2 being at a valid voltage. The driving sub-circuit 202 writes the second data signal Dat2 in response to the first scan signal G1. The sensing sub-circuit 203 writes the sensing signal SSen applied to the sensing terminal Sen into the second terminal 2022 of the driving sub-circuit 202 in response to the second scan signal G2. Thus, the sensing control sub-circuit 201, the driving sub-circuit 202 and the sensing sub-circuit 203 are conducted.

For example, the first transistor T1 is turned on in response to the sensing control signal CR2 being at a high voltage, and transmit the voltage applied to the second voltage terminal VDD2 to the second electrode T12 of the first transistor T1 (which is also the first terminal 2021 of the driving sub-circuit 202). The third transistor T3 is turned on in response to the first scan signal G1 is at a high voltage, and the second data signal Dat2 (provided by the data line DL) is written. The fourth transistor T4 is turned on in response to the second scan signal G2 being at a high voltage, and the sensing signal SSen received by the sensing terminal Sen is written into the second terminal 2022 of the driving sub-circuit 202. In this way, the sensing control sub-circuit 201, the driving sub-circuit 202 and the sensing sub-circuit 203 are conducted.

Figure 9B:
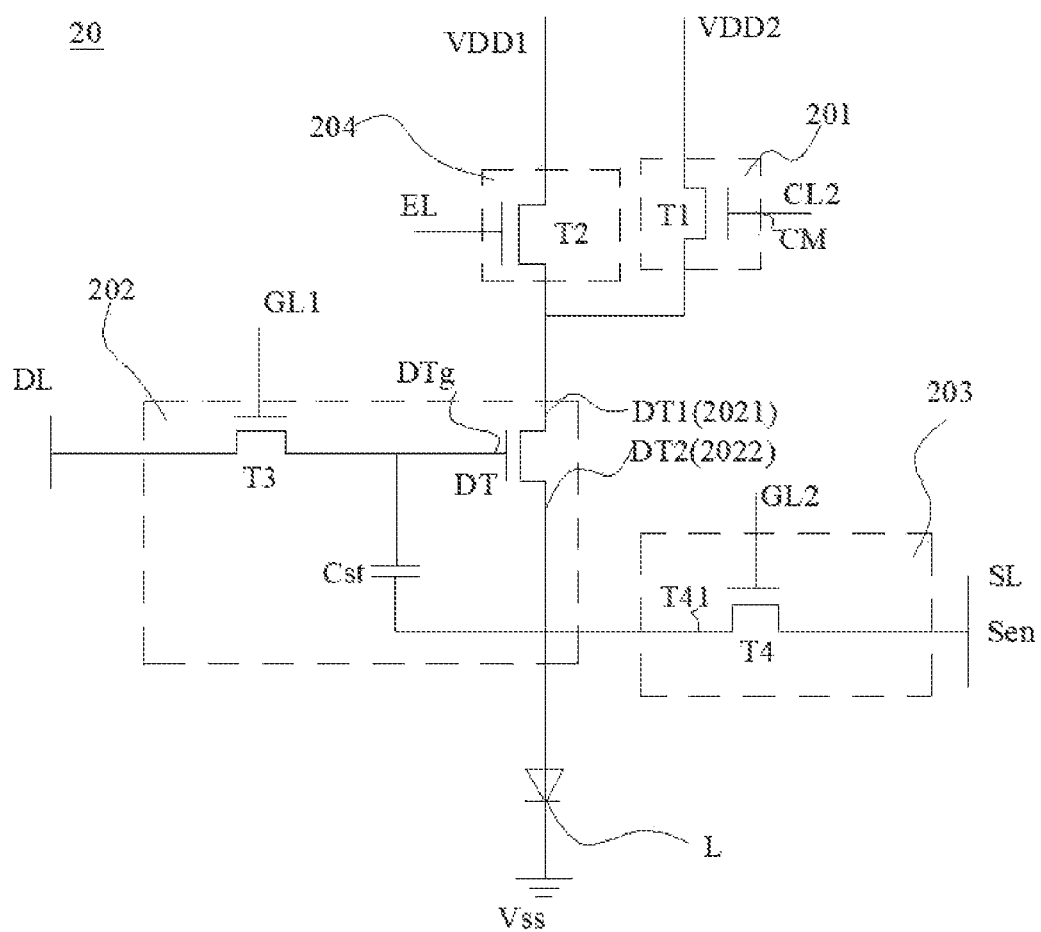
FIG. 9B is a structural diagram showing working of transistors in a charging phase.

In S22, in a charging phase, referring to FIGS. 8 and 9B (FIG. 9B is a structural diagram showing working of transistors in the charging phase), the voltage of the sensing signal SSen is gradually changed until the driving sub-circuit 202 reaches an off state. Then the voltage at the second terminal 2022 of the driving sub-circuit 202 is detected.

For example, the first electrode T41 of the fourth transistor T4 (which is also the second end Cst2 of the storage capacitor Cst and the second electrode DT2 of the driving transistor DT) changes with the change of the voltage at the sensing terminal Sen, so that a voltage difference Vgs between the gate DTg and the second electrode DT2 of the driving transistor DT (Vgs=Vg−Vs) changes accordingly. For example, as the voltage at the sensing terminal Sen increases, the voltage at the second electrode DT2 of the driving transistor DT increases accordingly, while the voltage at the gate DTg of the driving transistor DT remains unchanged. In this way, the voltage difference Vgs between the gate DTg and the second electrode DT2 of the driving transistor DT gradually decreases until Vgs is equal to a threshold voltage Vth of the driving transistor DT (in this case, the driving transistor DT is in the off state).

Figure 9C:
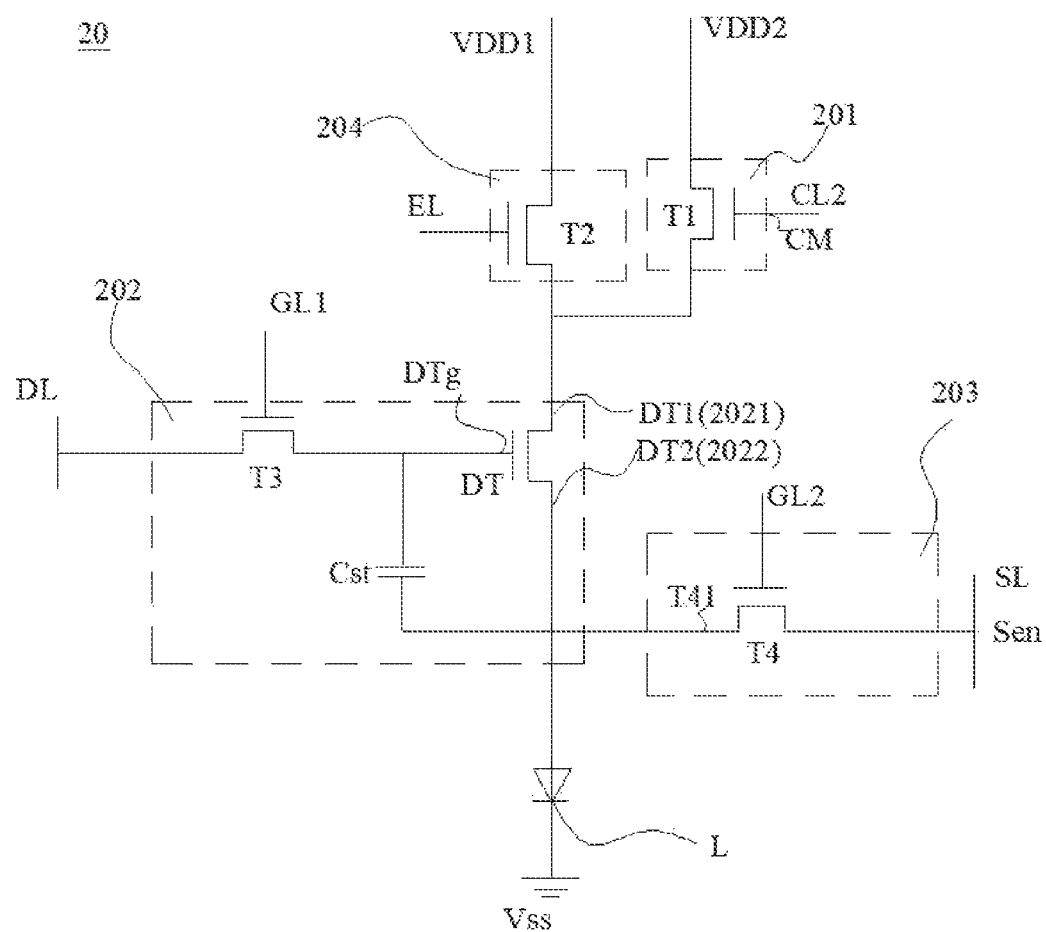
FIG. 9C is a structural diagram showing working of transistors in a detection phase.

In S23, in a sampling phase, referring to FIGS. 8 and 9C (FIG. 9C is a structural diagram showing working of transistors in the sampling phase), the voltage at the second electrode DT2 of the driving transistor DT is detected.

For example, the voltage Vs of the second electrode DT2 of the driving transistor DT (the voltage at the first electrode T41 of the fourth transistor T4) is detected. The voltage Vg of the gate DTg of the driving transistor DT can be known from the second data signal Dat2, and thus the value of Vth can be calculated by Vth=Vgs.

In S24, in a write-back phase, referring to FIGS. 8 and 9A (FIG. 9A is a structural diagram showing working of transistors in the write-back phase), the driving sub-circuit 202 writes back the first data signal Dat1 in the display phase in response to the first scan signal G1 being at the valid voltage.

For example, the third transistor T32 is turned on in response to the high voltage of the first scan signal G1, so as to write back the first data signal Dat1 in the foregoing embodiments. The first data signal Dat1 at this time increases the Vth value detected in the sampling phase, so as to perform Vth compensation for the first data signal Dat1 of the pixel circuit 20.

In the driving method (S21 to S24) of this embodiment, the display process may refer to steps S11 to S13 of the driving method of the foregoing embodiments.

It can be seen that, the sensing control sub-circuit 201 is turned on in response to the high level of the sensing control signal CR2, so that the sensing control sub-circuit 201, the driving sub-circuit 202 and the light-emitting device L are conducted during sensing. In this way, it can be ensured that the current of the light-emitting device L can be sensed no matter which row of pixel circuit 20 in sub-pixels is randomly selected for sensing, thereby ensuring the smooth completion of random sensing.

Figure 10:
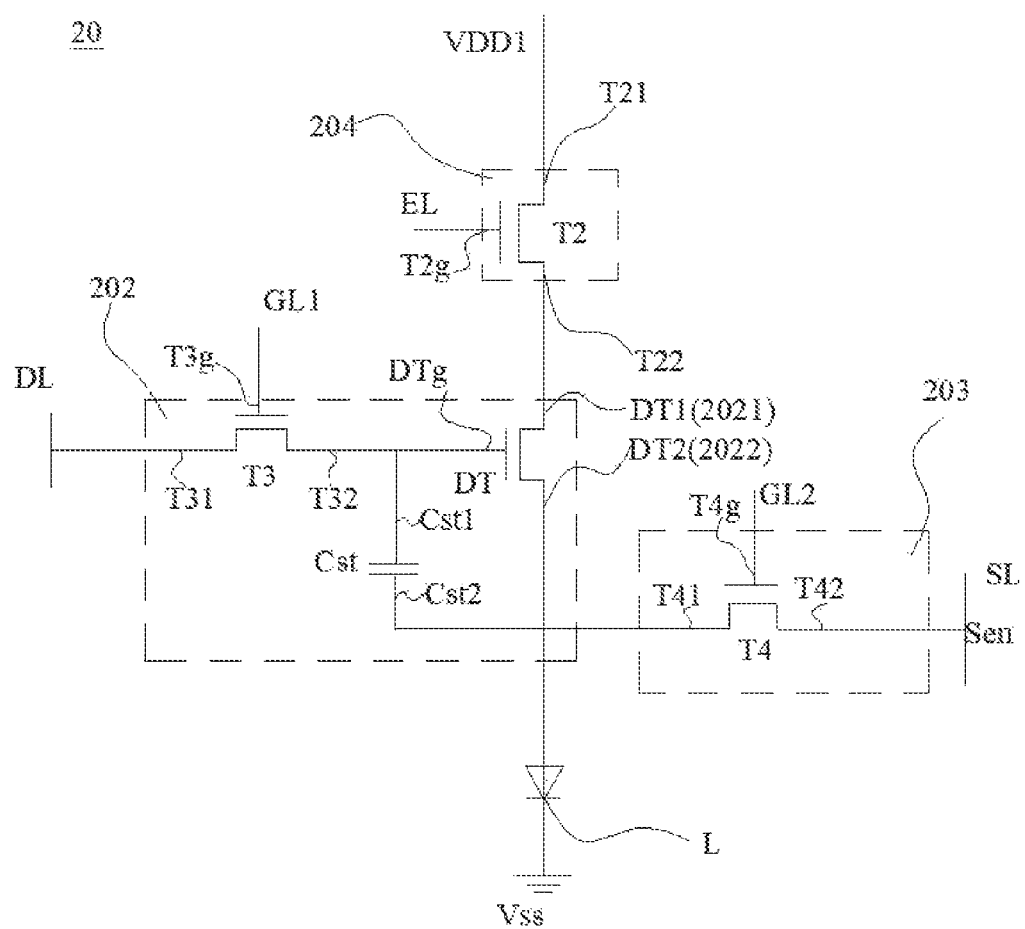
FIG. 10 is a structural schematic diagram of a comparative embodiment.
Figure 11:
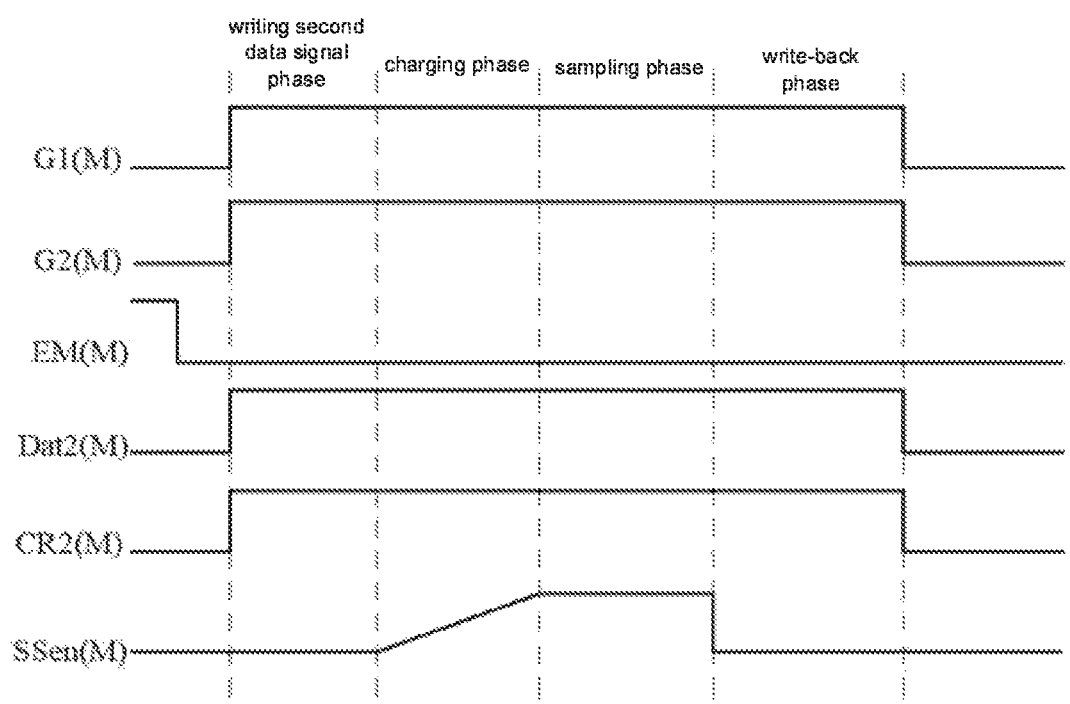
FIG. 11 is a timing diagram of an Mth row of pixel circuits in FIG. 10.

Therefore, the sensing control sub-circuit 201, the driving sub-circuit 202 and the light-emitting device L need to be conducted for sensing. However, in some embodiments, if the sensing control sub-circuit 201 is removed, referring to FIGS. 10 and 11 (FIG. 10 is a structural schematic diagram of a comparative embodiment, and FIG. 11 is a timing diagram of the Mth row of pixel circuits in FIG. 10), when a selected row of pixel circuits needs to be sensed, the light-emitting control signal EM responded by the sensing sub-circuit 203 in the row of pixel circuits needs to be at a high potential for sensing. However, the light-emitting control signal EM to which the sensing sub-circuit 203 responds may be at a low potential during the sensing phase (referring to FIG. 7). For example, the Mth row of pixel circuits is selected for sensing, and the light-emitting control signal EM of the row of pixel circuits is at the low potential, so that the light-emitting control sub-circuit 204 and the driving sub-circuit 202 are disconnected, the Mth row of pixel circuits does not sense the current of light-emitting device L during sensing, and the random sensing cannot be completed.

Figure 12:
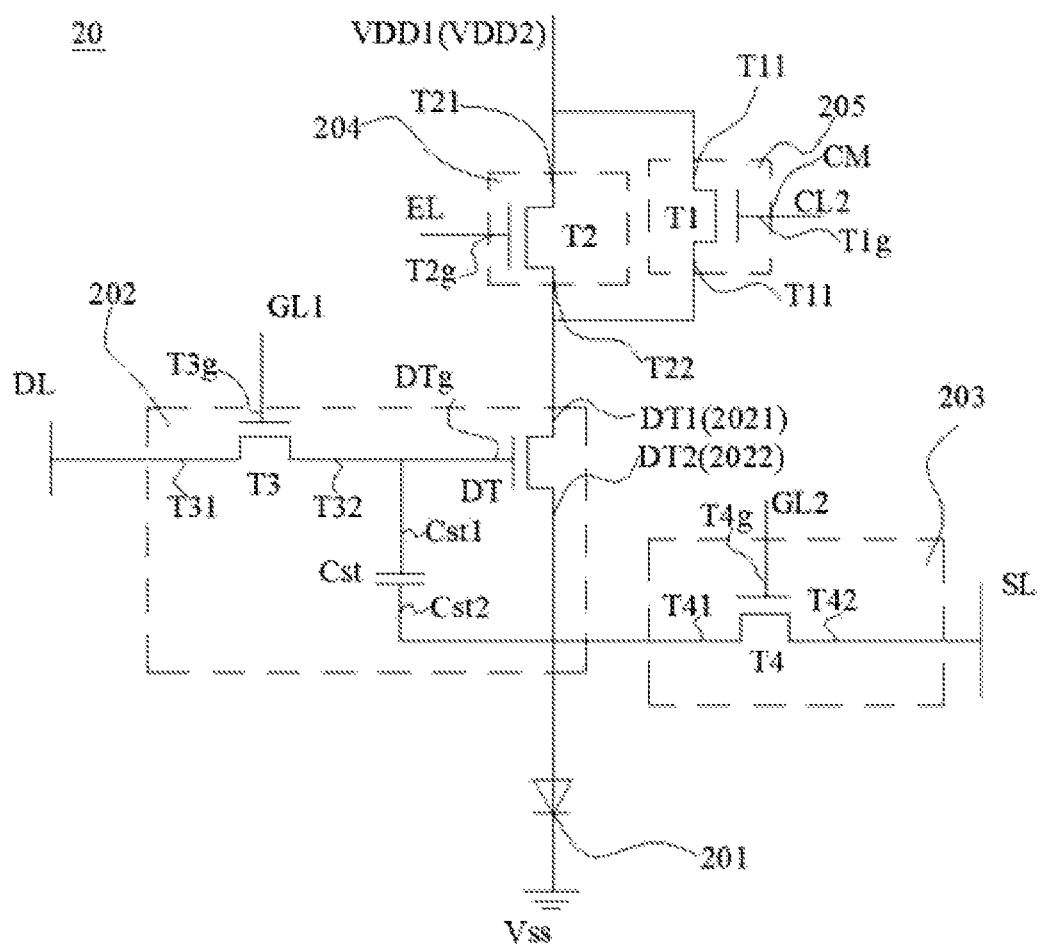
FIG. 12 is a replaceable structural diagram of the pixel circuit in FIG. 3.

FIG. 12 is a diagram showing a replaceable structure of the pixel circuit in FIG. 3. Referring to FIG. 12, for example, the first voltage terminal VDD1 is coupled to the second voltage terminal VDD2. That is, the voltage signal received by the first electrode T11 of the first transistor T1 is the same as the voltage signal received by the first electrode T21 of the second transistor T2. In this way, the number of wiring is reduced, the process difficulty is reduced, and the cost is reduced.

With continued reference to FIG. 12, in some embodiments, in the case where the sensing control sub-circuit 201 includes the first transistor T1, a width-to-length ratio of the first transistor T1 is greater than that of the second transistor T2, so that the switching capability of the first transistor T1 is stronger than that of the second transistor T2.

Referring to FIG. 1, in some embodiments of the present disclosure, the display apparatus 100 further includes shift register circuits 10. The shift register circuits 10 are coupled to the pixel circuits 20. A shift register circuit 10 (e.g., each shift register circuit 10) includes two shift register sub-circuits denoted as 10_a and 10_b. For example, the shift register sub-circuit 10_a is coupled to first pixel circuits 20_a, and the shift register sub-circuit 10_b is coupled to second pixel circuits 20_b. For another example, the shift register sub-circuit 10_a is coupled to the second pixel circuits 20_b, and the shift register sub-circuit 10_b is coupled to the first pixel circuits 20_a. In order to illustrate this solution more clearly, the following description is made by taking an example where the shift register sub-circuit 10_a is coupled to the first pixel circuits 20_a, and the shift register sub-circuit 10_b is coupled to the first pixel circuits 20_b.

The shift register sub-circuit 10_a is configured to output an Nth stage first scan signal G1(N) and an Nth stage second scan signal G2(N) to the first pixel circuits 20_a (e.g., the pixel circuits in the N row). For example, an output terminal for the Nth stage first scan signal G1(N) is coupled to the Nth first scan signal line GL1(N), and an output terminal for the Nth stage second scan signal G2(N) is coupled to the Nth second scan signal line GL2(N).

The shift register sub-circuit 10_b is configured to output an Mth stage first scan signal G1(M) and an Mth stage second scan signal G2(M) to the second pixel circuits 20_b (e.g., the pixel circuits in the M row). For example, an output terminal for the Mth stage first scan signal G1(M) is coupled to the Mth first scan signal line GL1(M), and an output terminal for the Mth stage second scan signal G2(M) is coupled to the Mth second scan signal line GL2(M).

The shift register circuit 10 is further configured to output a sensing control signal CR2 to at least one of the sensing control terminal of the first pixel circuit 20_a and the sensing control terminal of the second pixel circuit 20_b. For example, the shift register circuit is further configured to output an Nth stage sensing control signal CR2(N) to the first pixel circuit 20_a. At this time, an output terminal for the Nth stage sensing control signal CR2(N) is coupled to the Nth sensing control signal line CL(N). For another example, the shift register circuit is further configured to output an Mth stage sensing control signal CR2(M) to the second pixel circuit 20_b. At this time, an output terminal for the Mth stage sensing control signal CR2(M) is coupled to the Mth sensing control signal line CL(M). M and N are different natural numbers. M can be N+1. M can also be N−1. M can also not be adjacent to N. In order to describe this solution more clearly, in some embodiments of the present disclosure, M is N+1 as an example for illustration.

A driving method of the shift register circuit 10 disclosed in this embodiment includes: outputting, by the shift register circuit 10, the Nth stage first scan signal G1(N) and the Nth stage second scan signal G2(N) to the first pixel circuit 20_a; outputting, by the shift register circuit 10, the Mth stage first scan signal G1(M) and the Mth stage second scan signal G2(M) to the second pixel circuit 20_b; and outputting, by the shift register circuit 10, the sensing control signal CR2 to at least one of the first pixel circuit and the second pixel circuit.

Figure 13:
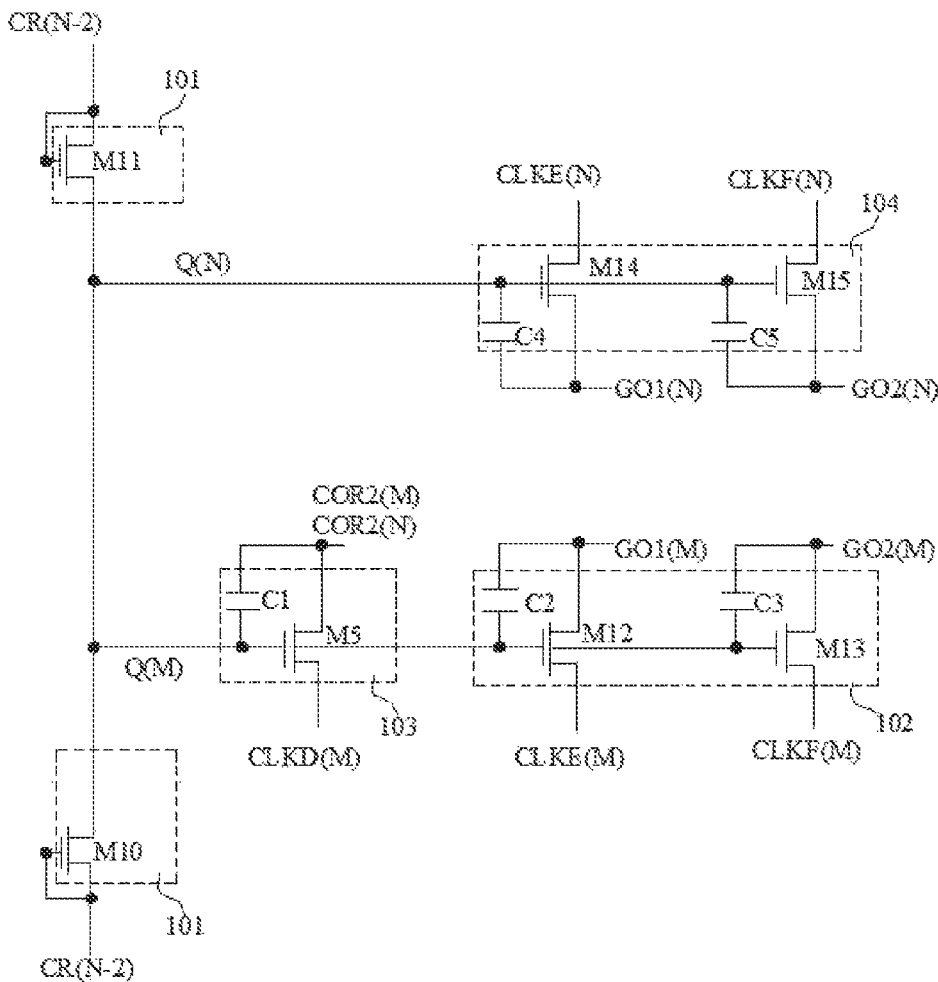
FIG. 13 is a structural diagram of a shift register circuit.

FIG. 13 is a structural diagram of a shift register circuit 10. Referring to FIG. 13, in some embodiments, the shift register circuit 10 includes a first input sub-circuit 101, an Mth stage output sub-circuit 102, a sensing control signal output sub-circuit 103 and an Nth stage output sub-circuit 104.

The first input sub-circuit 101 is coupled to a first signal input terminal CR(N−2), an Nth stage pull-up node Q(N) and an Mth stage pull-up node Q(M).

The first input sub-circuit 101 is configured to, in response to an input signal applied to the first signal input terminal CR(N−2), set the Nth stage pull-up node Q(N) and the Mth stage pull-up node Q(M) to be at a valid voltage.

For example, the first input sub-circuit 101 includes a tenth transistor M10. The tenth transistor M10 includes a gate, a first electrode and a second electrode; the gate and the first electrode of the tenth transistor M10 are coupled to the first signal input terminal CR(N−2), and the second electrode of the tenth transistor M10 is coupled to the Nth stage pull-up node Q(N) and the Mth stage pull-up node Q(M). In this way, the Nth stage pull-up node Q(N) and the Mth stage pull-up node Q(M) share one input sub-circuit, which reduces the wiring arrangement and reduces the cost.

For another example, the first input sub-circuit 101 includes an eleventh transistor M11. The eleventh transistor M11 includes a gate, a first electrode and a second electrode; in the eleventh transistor M11, the gate and the first electrode are coupled to the first signal input terminal CR(N−2), and the second electrode is coupled to the Mth stage pull-up node Q(M) and the Nth stage pull-up node Q(N). In this way, the Nth stage pull-up node Q(N) and the Mth stage pull-up node Q(M) share one input sub-circuit, which reduces the wiring arrangement and reduces the cost.

For yet another example, the first input sub-circuit 101 includes the tenth transistor M10 and the eleventh transistor M11. The second electrode of the tenth transistor M10 is coupled to the Mth stage pull-up node Q(M), and the second electrode of the eleventh transistor M11 is coupled to the Nth stage pull-up node Q(N). In this way, the tenth transistor M10 and the eleventh transistor M11 may work alternately. In this case, the continuous operation of the tenth transistor M10 or the eleventh transistor M11 is avoided, so that respective operation durations of the tenth transistor M10 and the eleventh transistor M11 may be shortened, and the service life of the shift register circuit 10 may be extended.

It should be noted that, in this embodiment, there is no limitation on the alternate working cycle of the tenth transistor M10 or the eleventh transistor M11, which may be set according to actual needs.

The Mth stage output sub-circuit 102 is coupled to an Mth stage first clock signal terminal CLKE(M), an Mth stage second clock signal terminal CLKF(M), the Mth stage pull-up node Q(M), an Mth stage first output terminal GO1(M) and an Mth stage second output terminal GO2(M).

The Mth stage output sub-circuit 102 is configured to, in response to the valid voltage at the Mth stage pull-up node Q(M), transmit an Mth stage first clock signal SCLKE(M) applied to the Mth stage first clock signal terminal CLKE(M) to the Mth stage first output terminal GO1(M) as the Mth stage first scan signal G1(M), so as to scan a gate line coupled to the Mth stage first output terminal GO1(M) (e.g., scan the Mth first scan signal line GL1(M)). And the Mth stage output sub-circuit 102 is configured to, in response to the valid voltage at the Mth stage pull-up node Q(M), transmit an Mth stage second clock signal SCLKF(M) applied to the Mth stage second clock signal terminal CLKF(M) to the Mth stage second output terminal GO2(M) as the Mth stage second scan signal G2(M), so as to scan a gate line coupled to the Mth stage second output terminal GO2(M) (e.g., scan the Mth second scan signal line GL2(M)). Both the Mth stage first output terminal GO1(M) and the Mth stage second output terminal GO2(M) are coupled to the second pixel circuit 20_b.

For example, the Mth stage output sub-circuit 102 includes a twelfth transistor M12, a thirteenth transistor M13, and a second capacitor C2 or a third capacitor C3.

The twelfth transistor M12 includes a gate, a first electrode and a second electrode. The gate of the twelfth transistor M12 is coupled to the Mth stage pull-up node Q(M), the first electrode of the twelfth transistor M12 is coupled to the Mth stage first clock signal terminal CLKE(M), and the second electrode of the twelfth transistor M12 is coupled to the Mth stage first output terminal GO1(M).

The thirteenth transistor M13 includes a gate, a first electrode and a second electrode. The gate of the thirteenth transistor M13 is coupled to the Mth stage pull-up node Q(M), the first electrode of the thirteenth transistor M13 is coupled to the Mth stage second clock signal terminal CLKF(M), and the second electrode of the thirteenth transistor M13 is coupled to the Mth stage second output terminal GO2(M).

The second capacitor C2 includes a first end and a second end. The first end of the second capacitor C2 is coupled to the gate of the twelfth transistor M12 and the Mth stage pull-up node Q(M), and the second end of the second capacitor C2 is coupled to the second electrode of the twelfth transistor M12 and the Mth stage first output terminal GO1(M).

The third capacitor C3 includes a first end and a second end. The first end of the third capacitor C3 is coupled to the gate of the thirteenth transistor M13 and the Mth stage pull-up node Q(M), and the second end of the third capacitor C3 is coupled to the second electrode of the thirteenth transistor M13 and the Mth stage second output terminal GO2(M).

For example, the Mth stage output sub-circuit 102 includes the twelfth transistor M12, the thirteenth transistor M13, the second capacitor C2 and the third capacitor C3. For structures of the twelfth transistor M12, the thirteenth transistor M13, the second capacitor C2 and the third capacitor C3, reference is made to the foregoing embodiments. The second capacitor C2 and the third capacitor C3 in this embodiment may work alternately. In this case, the continuous operation of the second capacitor C2 or the third capacitor C3 is avoided, so that respective operation durations of the second capacitor C2 and the third capacitor C3 may be shortened, and the service life of the shift register circuit 10 may be extended.

It should be noted that, in this embodiment, there is no limitation on the cycle in which the second capacitor C2 and the third capacitor C3 work alternately, which may be set according to actual needs.

The sensing control signal output sub-circuit 103 is coupled to the Mth stage pull-up node Q(M), an Mth stage third clock signal terminal CLKD(M) and a sensing control signal output terminal COR2(M).

The sensing control signal output sub-circuit 103 is configured to, in response to the valid voltage at the Mth stage pull-up node Q(M), transmit an Mth stage third clock signal SCLKD(M) of the Mth stage third clock signal terminal CLKD(M) to the sensing control signal output terminal COR2(M) as the sensing control signal CR2, so as to scan a gate line coupled to the sensing control signal output terminal COR2(M). The sensing control signal output terminal COR2(M) is coupled to at least one of the sensing control terminal of the second pixel circuit and the sensing control terminal of the first pixel circuit. That is, the sensing control signal output sub-circuit 103 scans at least one of the Mth sensing control signal line CL(M) and the Nth sensing control signal line CL(N).

For example, the sensing control signal output sub-circuit 103 includes a fifth transistor M5. The fifth transistor M5 includes a gate, a first electrode and a second electrode. The gate of the fifth transistor M5 is coupled to the Mth stage pull-up node Q(M), the first electrode of the fifth transistor M5 is coupled to the Mth stage third clock signal terminal CLKD(M), and the second electrode of the fifth transistor M5 is coupled to the sensing control signal output terminal COR2(M).

In some embodiments, the sensing control signal output sub-circuit 103 further includes a first capacitor C1. The first capacitor C1 includes a first end and a second end. The first end of the first capacitor C1 is coupled to the gate of the fifth transistor M5 and the Mth stage pull-up node Q(M), and the second end of the first capacitor C1 is coupled to the second electrode of the fifth transistor M5 and the sensing control signal output terminal COR2(M).

The Nth stage output sub-circuit 104 is coupled to the Nth stage pull-up node Q(N), an Nth stage first clock signal terminal CLKE(N), an Nth stage second clock signal terminal CLKF(N), an Nth stage first output terminal GO1(N) and an Nth stage second output terminal GO2(N).

The Nth stage output sub-circuit 104 is configured to, in response to the valid voltage at the Nth stage pull-up node Q(N), transmit an Nth stage first clock signal SCLKE(N) of the Nth stage first clock signal terminal CLKE(N) to the Nth stage first output terminal GO1(N) as the Nth stage first scan signal G1(N), so as to scan a gate line coupled to the Nth stage first output terminal GO1(N) (e.g., scan the Nth first scan signal line GL1(N)), and transmit an Nth stage second clock signal SCLKF(N) applied to the Nth stage second clock signal terminal CLKF(N) to the Nth stage second output terminal GO2(N) as the Nth stage second scan signal G2(N), so as to scan a gate line coupled to the Nth stage second output terminal GO2(N) (e.g., scan the Nth second scan signal line GL2(N)). Both the Nth stage first output terminal GO1(N) and the Nth stage second output terminal GO2(N) are coupled to the first pixel circuit 20_a.

For example, the Nth stage output sub-circuit 104 includes a fourteenth transistor M14, a fifteenth transistor M15, and at least one of a fourth capacitor C4 and a fifth capacitor C5. In a case where the Nth stage output sub-circuit 104 includes the fourth capacitor C4 and the fifth capacitor C5, the fourth capacitor C4 and the fifth capacitor C5 work alternately. In this case, the continuous operation of the fourth capacitor C4 or the fifth capacitor C5 is avoided, so that respective operation durations of the fourth capacitor C4 and the fifth capacitor C5 may be shortened, and the service life of the shift register circuit 10 may be extended.

It should be noted that, in this embodiment, there is no limitation on the cycle in which the fourth capacitor C4 and the fifth capacitor C5 work alternately, which may be set according to actual needs.

The fourteenth transistor M14 includes a gate, a first electrode and a second electrode. The gate of the fourteenth transistor M14 is coupled to the Nth stage pull-up node Q(N), the first electrode of the fourteenth transistor M14 is coupled to the Nth stage first clock signal terminal CLKE(N), and the second electrode of the fourteenth transistor M14 is coupled to the Nth stage first output terminal GO1(N).

The fifteenth transistor M15 includes a gate, a first electrode and a second electrode. The gate of the fifteenth transistor M15 is coupled to the Nth stage pull-up node Q(N), the first electrode of the fifteenth transistor M15 is coupled to the Nth stage second clock signal terminal CLKF(N), and the second electrode of the fifteenth transistor M15 is coupled to the Nth stage second output terminal GO2(N).

The fourth capacitor C4 includes a first end and a second end. The first end of the fourth capacitor C4 is coupled to the gate of the fourteenth transistor M14 and the Nth stage pull-up node Q(N), and the second end of the fourth capacitor C4 is coupled to the second electrode of the fourteenth transistor M14 and the Nth stage first output terminal GO1(N).

The fifth capacitor C5 includes a first end and a second end; in the fifth capacitor C5, the first end is coupled to the gate of the fifteenth transistor M15 and the Nth stage pull-up node Q(N), and the second end is coupled to the second electrode of the fifteenth transistor M15 and the Nth stage second output terminal GO2(N).

Figure 14:
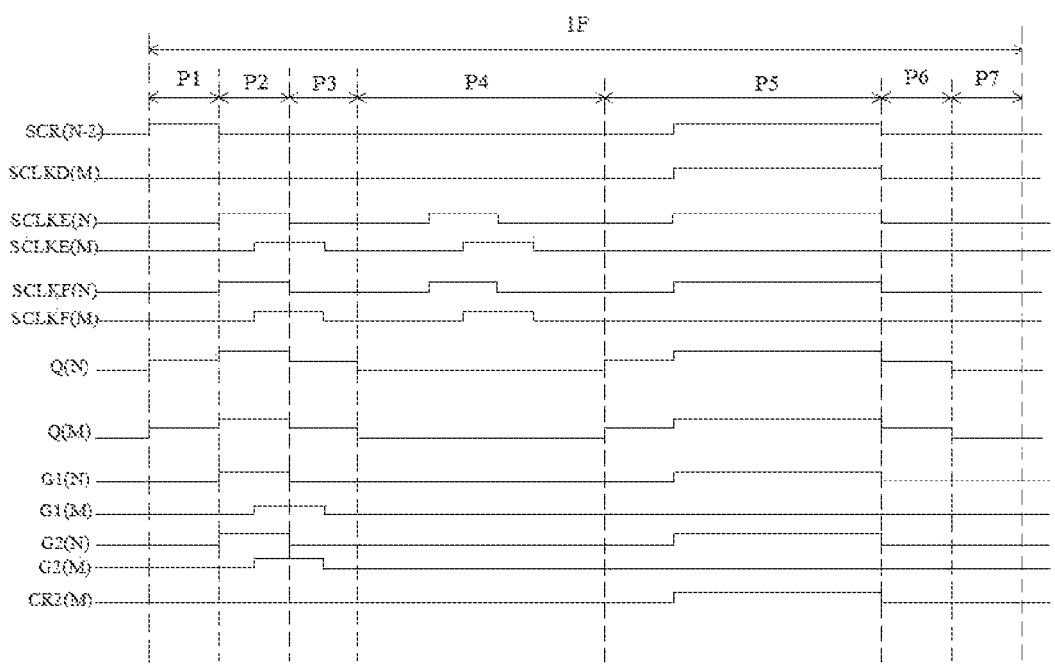
FIG. 14 is a timing diagram of an image frame of a shift register circuit, in accordance with some embodiments.

FIG. 14 is a timing diagram of an image frame (F) of the shift register circuit, in accordance with some embodiments. Referring to FIGS. 13 and 14, a driving method of the shift register circuit 10 in this embodiment is as follows.

In S31, in a first phase (P1) of a display phase of the image frame (F) shown in FIG. 14, the first input sub-circuit 101 is turned on in response to the signal SCR(N−2) received by the first signal input terminal CR(N−2), and transmits the signal received at the first signal input terminal CR(N−2) to the Mth stage pull-up node Q(M) and the Nth stage pull-up node Q(N), so as to charge the Mth stage pull-up node Q(M) and the Nth stage pull-up node Q(N).

For example, the first input sub-circuit 101 turns on the tenth transistor M10 and the eleventh transistor M11 in response to the high voltage received by the first signal input terminal CR(N−2), and transmits the high voltage received at the first signal input terminal CR(N−2) to the Mth stage pull-up node Q(M) and the Nth stage pull-up node Q(N), so as to charge the Mth stage pull-up node Q(M) and the Nth stage pull-up node Q(N), and to charge at least one of the second capacitor C2 and the third capacitor C3 and at least one of the fourth capacitor C4 or the fifth capacitor C5.

The Mth stage output sub-circuit 102 is turned on in response to the valid voltage at the Mth stage pull-up node Q(M), transmits the Mth stage first clock signal SCLKE(M) received at the Mth stage first clock signal terminal CLKE(M) to the Mth stage first output terminal GO1(M), and transmits the Mth stage second clock signal SCLKF(M) received at the Mth stage second clock signal terminal CLKF(M) to the Mth stage second output terminal GO2(M).

For example, the Mth stage output sub-circuit 102 turns on the twelfth transistor M12 and the thirteenth transistor M13 in response to the high voltage at the Mth stage pull-up node Q(M), transmits a low voltage of the Mth stage first clock signal SCLKE(M) received at the Mth stage first clock signal terminal CLKE(M) to the Mth stage first output terminal GO1(M), and transmits a low voltage of the Mth stage second clock signal SCLKF(M) received at the Mth stage second clock signal terminal CLKF(M) to the Mth stage second output terminal GO2(M). At this time, the Mth stage first scan signal G1(M) output by the Mth stage first output terminal GO1(M) is at the low voltage, and the Mth stage second scan signal G2(M) output by the Mth stage second output terminal GO2(M) is at the low voltage.

The sensing control signal output sub-circuit 103 is turned on in response to the valid voltage at the Mth stage pull-up node Q(M), and transmits the Mth stage third clock signal SCLKD(M) received at the Mth stage third clock signal terminal CLKD(M) to the sensing control signal output terminal COR2(M).

For example, the sensing control signal output sub-circuit 103 turns on the fifth transistor M5 in response to the high voltage at the Mth stage pull-up node Q(M), and transmits a low voltage of the Mth stage third clock signal SCLKD(M) received at the Mth stage third clock signal terminal CLKD(M) to the sensing control signal output terminal COR2(M). At this time, the Mth stage sensing control signal CR2(M) output by the sensing control signal output terminal COR2(M) is at the low voltage.

The Nth stage output sub-circuit 104 is turned on in response to the valid voltage at the Nth stage pull-up node Q(N), transmits the Nth stage first clock signal SCLKE(N) received at the Nth stage first clock signal terminal CLKE(N) to the Nth stage first output terminal GO1(N), and transmits the Nth stage second clock signal SCLKF(N) received at the Nth stage second clock signal terminal CLKF(N) to the Nth stage second output terminal GO2(N).

For example, the Nth stage output sub-circuit 104 turns on the fourteenth transistor M14 and the fifteenth transistor M15 in response to the high voltage at the Nth stage pull-up node Q(N), transmits a low voltage of the Nth stage first clock signal SCLKE(N) received at the Nth stage first clock signal terminal CLKE(N) to the Nth stage first output terminal GO1(N), and transmits a low voltage of the Nth stage second clock signal SCLKF(N) received at the Nth stage second clock signal terminal CLKF(N) to the Nth stage second output terminal GO2(N). At this time, the Nth stage first scan signal G1(N) output by the Nth stage first output terminal GO1(N) is at the low voltage, and the Nth stage second scan signal G2(N) output by the Nth stage second output terminal GO2(N) is at the low voltage.

In S32, in a second phase (P2) of the display phase of the image frame (F) shown in FIG. 14, the Mth stage output sub-circuit 102 is turned on in response to the valid voltage at the Mth stage pull-up node Q(M), transmits the Mth stage first clock signal SCLKE(M) received at the Mth stage first clock signal terminal CLKE(M) to the Mth stage first output terminal GO1(M), and transmits the Mth stage second clock signal SCLKF(M) received at the Mth stage second clock signal terminal CLKF(M) to the Mth stage second output terminal GO2(M).

For example, the Mth stage output sub-circuit 102 turns on the twelfth transistor M12 and the thirteenth transistor M13 in response to the high voltage at the Mth stage pull-up node Q(M), transmits the Mth stage first clock signal SCLKE(M) received at the Mth stage first clock signal terminal CLKE(M) to the Mth stage first output terminal GO1(M), and transmits the Mth stage second clock signal SCLKF(M) received at the Mth stage second clock signal terminal CLKF(M) to the Mth stage second output terminal GO2(M). At this time, the Mth stage first clock signal SCLKE(M) pulls up the signal output by the Mth stage first output terminal GO1(M), and the Mth stage second clock signal SCLKF(M) pulls up the signal output by the Mth stage second output terminal GO2(M).

The sensing control signal output sub-circuit 103 is turned on in response to the valid voltage at the Mth stage pull-up node Q(M), and transmits the Mth stage third clock signal SCLKD(M) received at the Mth stage third clock signal terminal CLKD(M) to the sensing control signal output terminal COR2(M).

For example, the sensing control signal output sub-circuit 103 turns on the fifth transistor M5 in response to the high voltage at the Mth stage pull-up node Q(M), and transmits the low voltage of the Mth stage third clock signal SCLKD(M) received at the Mth stage third clock signal terminal CLKD(M) to the sensing control signal output terminal COR2(M). At this time, the Mth stage sensing control signal CR2(M) output by the sensing control signal output terminal COR2(M) is at the low voltage.

The Nth stage output sub-circuit 104 is turned on in response to the valid voltage at the Nth stage pull-up node Q(N), transmits the Nth stage first clock signal SCLKE(N) received at the Nth stage first clock signal terminal CLKE(N) to the Nth stage first output terminal GO1(N), and transmits the Nth stage second clock signal SCLKF(N) received at the Nth stage second clock signal terminal CLKF(N) to the Nth stage second output terminal GO2(N).

For example, the Nth stage output sub-circuit 104 turns on the fourteenth transistor M14 and the fifteenth transistor M15 in response to the high voltage at the Nth stage pull-up node Q(N), transmits a high voltage of the Nth stage first clock signal SCLKE(N) received at the Nth stage first clock signal terminal CLKE(N) to the Nth stage first output terminal GO1(N), and transmits a high voltage of the Nth stage second clock signal SCLKF(N) received at the Nth stage second clock signal terminal CLKF(N) to the Nth stage second output terminal GO2(N). At this time, the Nth stage first scan signal G1(N) output by the Nth stage first output terminal GO1(N) is at the high voltage, and the Nth stage second scan signal G2(N) output by the Nth stage second output terminal GO2(N) is at the high voltage.

It can be understood that, for one of the second capacitor C2 and the third capacitor C3 (the following takes the second capacitor C2 as an example for illustration), since the voltage difference between the first end and the second end of the second capacitor C2 does not change abruptly, in the second phase (P2), the second capacitor C2 will further raise the potential of the Mth stage pull-up node Q(M) through its own coupling bootstrap effect.

It can be understood that, for one of the fourth capacitor C4 and the fifth capacitor C5 (the following takes the fourth capacitor C4 as an example for illustration), since the voltage difference between the first end and the second end of the fourth capacitor C4 does not change abruptly, in the second phase (P2), the fourth capacitor C4 will further raise the potential of the Nth stage pull-up node Q(N) through its own coupling bootstrap effect.

In S33, in a third phase (P3) of the display phase of the image frame (F) shown in FIG. 14, the Mth stage output sub-circuit 102 is turned on in response to the valid voltage at the Mth stage pull-up node Q(M), transmits the Mth stage first clock signal SCLKE(M) received at the Mth stage first clock signal terminal CLKE(M) to the Mth stage first output terminal GO1(M), and transmits the Mth stage second clock signal SCLKF(M) received at the Mth stage second clock signal terminal CLKF(M) to the Mth stage second output terminal GO2(M).

For example, the Mth stage output sub-circuit 102 turns on the twelfth transistor M12 and the thirteenth transistor M13 in response to the high voltage at the Mth stage pull-up node Q(M), transmits the Mth stage first clock signal SCLKE(M) received at the Mth stage first clock signal terminal CLKE(M) to the Mth stage first output terminal GO1(M), and transmits the Mth stage second clock signal SCLKF(M) received at the Mth stage second clock signal terminal CLKF(M) to the Mth stage second output terminal GO2(M). At this time, the Mth stage first clock signal SCLKE(M) pulls down the signal output by the Mth stage first output terminal GO1(M), and the Mth stage second clock signal SCLKF(M) pulls down the signal output by the Mth stage second output terminal GO2(M).

The sensing control signal output sub-circuit 103 is turned on in response to the valid voltage at the Mth stage pull-up node Q(M), and transmits the Mth stage third clock signal SCLKD(M) received at the Mth stage third clock signal terminal CLKD(M) to the sensing control signal output terminal COR2(M).

For example, the sensing control signal output sub-circuit 103 turns on the fifth transistor M5 in response to the high voltage at the Mth stage pull-up node Q(M), and transmits the low voltage of the Mth stage third clock signal SCLKD(M) received at the Mth stage third clock signal terminal CLKD(M) to the sensing control signal output terminal COR2(M). At this time, the Mth stage sensing control signal CR2(M) output by the sensing control signal output terminal COR2(M) is at the low voltage.

The Nth stage output sub-circuit 104 is turned on in response to the valid voltage at the Nth stage pull-up node Q(N), transmits the Nth stage first clock signal SCLKE(N) received at the Nth stage first clock signal terminal CLKE(N) to the Nth stage first output terminal GO1(N), and transmits the Nth stage second clock signal SCLKF(N) received at the Nth stage second clock signal terminal CLKF(N) to the Nth stage second output terminal GO2(N).

For example, the Nth stage output sub-circuit 104 turns on the fourteenth transistor M14 and the fifteenth transistor M15 in response to the high voltage at the Nth stage pull-up node Q(N), transmits a low voltage of the Nth stage first clock signal SCLKE(N) received at the Nth stage first clock signal terminal CLKE(N) to the Nth stage first output terminal GO1(N), and transmits a low voltage of the Nth stage second clock signal SCLKF(N) received at the Nth stage second clock signal terminal CLKF(N) to the Nth stage second output terminal GO2(N). At this time, the Nth stage first scan signal G1(N) output by the Nth stage first output terminal GO1(N) is at the low voltage, and the Nth stage second scan signal G2(N) output by the Nth stage second output terminal GO2(N) is at the low voltage.

It should be noted that, during a period of time after the end of the third phase (P3), due to the bootstrap effect of the second capacitor C2, the third capacitor C3, the fourth capacitor C4 and the fifth capacitor C5, the potential of the Nth stage pull-up node Q(N) and the potential of the Mth stage pull-up node Q(M) are lowered but still maintain a high level. Therefore, the fifth transistor M5, the twelfth transistor M12, the thirteenth transistor M13, the fourteenth transistor M14 and the fifteenth transistor M15 are still turned on; the low voltage of the Mth stage first clock signal SCLKE(M) is transmitted to the Mth stage first output terminal GO1(M), and the low voltage of the Mth stage second clock signal SCLKF(M) is transmitted to the Mth stage second output terminal GO2(M); the low voltage of the Mth stage third clock signal SCLKD(M) is transmitted to the sensing control signal output terminal COR2(M), and the Mth stage sensing control signal CR2(M) output by the sensing control signal output terminal COR2(M) is at the low voltage; the low voltage of the Nth stage first clock signal SCLKE(N) is transmitted to the Nth stage first output terminal GO1(N), and the low voltage of the Nth stage second clock signal SCLKF(N) is transmitted to the Nth stage second output terminal GO2(N). Thus, the Mth stage first output terminal GO1(M), the Mth stage second output terminal GO2(M), the sensing control signal output terminal COR2(M), the Nth stage first output terminal GO1(N) and the Nth stage second output terminal GO2(N) all achieve noise reduction.

In S34, in a fourth phase (P4) of the display phase of the image frame (F) shown in FIG. 14, the Mth stage output sub-circuit 102 is turned off in response to the invalid voltage at the Mth stage pull-up node Q(M), and no signal is output from the Mth stage first output terminal GO1(M) and the Mth stage second output terminal GO2(M).

For example, the Mth stage output sub-circuit 102 turns off the twelfth transistor M12 and the thirteenth transistor M13 in response to the low voltage at the Mth stage pull-up node Q(M). At this time, no signal is output from the Mth stage first output terminal GO1(M) and the Mth stage second output terminal GO2(M).

The sensing control signal output sub-circuit 103 is turned off in response to the invalid voltage at the Mth stage pull-up node Q(M), and no signal is output from the sensing control signal output terminal COR2(M).

For example, the sensing control signal output sub-circuit 103 turns off the fifth transistor M5 in response to the low voltage at the Mth stage pull-up node Q(M). At this time, no signal is output from the sensing control signal output terminal COR2(M).

The Nth stage output sub-circuit 104 is turned off in response to the invalid voltage at the Nth stage pull-up node Q(N), and no signal is output from the Nth stage first output terminal GO1(N) and the Nth stage second output terminal GO2(N).

For example, the Nth stage output sub-circuit 104 turns off the fourteenth transistor M14 and the fifteenth transistor M15 in response to the low voltage at the Nth stage pull-up node Q(N). At this time, no signal is output from the Nth stage first output terminal GO1(N) and the Nth stage second output terminal GO2(N).

In S35, in a fifth phase (P5) of the display phase of the image frame (F) shown in FIG. 14, the Mth stage output sub-circuit 102 is turned on in response to the valid voltage at the Mth stage pull-up node Q(M), transmits the Mth stage first clock signal SCLKE(M) received at the Mth stage first clock signal terminal CLKE(M) to the Mth stage first output terminal GO1(M), and transmits the Mth stage second clock signal SCLKF(M) received at the Mth stage second clock signal terminal CLKF(M) to the Mth stage second output terminal GO2(M).

For example, the Mth stage output sub-circuit 102 turns on the twelfth transistor M12 and the thirteenth transistor M13 in response to the high voltage at the Mth stage pull-up node Q(M), transmits the low voltage of the Mth stage first clock signal SCLKE(M) received at the Mth stage first clock signal terminal CLKE(M) to the Mth stage first output terminal GO1(M), and transmits the low voltage of the Mth stage second clock signal SCLKF(M) received at the Mth stage second clock signal terminal CLKF(M) to the Mth stage second output terminal GO2(M). At this time, the signal output from the Mth stage first output terminal GO1(M) is at the low voltage, and the signal output from the Mth stage second output terminal GO2(M) is at the low voltage.

The sensing control signal output sub-circuit 103 is turned on in response to the valid voltage at the Mth stage pull-up node Q(M), and transmits the Mth stage third clock signal SCLKD(M) received at the Mth stage third clock signal terminal CLKD(M) to the sensing control signal output terminal COR2(M).

For example, the sensing control signal output sub-circuit 103 turns on the fifth transistor M5 in response to the high voltage at the Mth stage pull-up node Q(M), and transmits the Mth stage third clock signal SCLKD(M) received at the Mth stage third clock signal terminal CLKD(M) to the sensing control signal output terminal COR2(M). At this time, the Mth stage sensing control signal CR2(M) output by the sensing control signal output terminal COR2(M) is pulled up by the Mth stage third clock signal SCLKD(M).

The Nth stage output sub-circuit 104 is turned on in response to the valid voltage at the Nth stage pull-up node Q(N), transmits the Nth stage first clock signal SCLKE(N) received at the Nth stage first clock signal terminal CLKE(N) to the Nth stage first output terminal GO1(N), and transmits the Nth stage second clock signal SCLKF(N) received at the Nth stage second clock signal terminal CLKF(N) to the Nth stage second output terminal GO2(N).

For example, the Nth stage output sub-circuit 104 turns on the fourteenth transistor M14 and the fifteenth transistor M15 in response to the high voltage at the Nth stage pull-up node Q(N), transmits the Nth stage first clock signal SCLKE(N) received at the Nth stage first clock signal terminal CLKE(N) to the Nth stage first output terminal GO1(N), and transmits the Nth stage second clock signal SCLKF(N) received at the Nth stage second clock signal terminal CLKF(N) to the Nth stage second output terminal GO2(N). At this time, the Nth stage first scan signal G1(N) output by the Nth stage first output terminal GO1(N) is pulled up, and the Nth stage second scan signal G2(N) output by the Nth stage second output terminal GO2(N) is pulled up.

In S36, in a sixth phase (P6) of the display phase of the image frame (F) shown in FIG. 14, the Mth stage output sub-circuit 102 is turned on in response to the valid voltage at the Mth stage pull-up node Q(M), transmits the Mth stage first clock signal SCLKE(M) received at the Mth stage first clock signal terminal CLKE(M) to the Mth stage first output terminal GO1(M), and transmits the Mth stage second clock signal SCLKF(M) received at the Mth stage second clock signal terminal CLKF(M) to the Mth stage second output terminal GO2(M).

For example, the Mth stage output sub-circuit 102 turns on the twelfth transistor M12 and the thirteenth transistor M13 in response to the high voltage at the Mth stage pull-up node Q(M), transmits the low voltage of the Mth stage first clock signal SCLKE(M) received at the Mth stage first clock signal terminal CLKE(M) to the Mth stage first output terminal GO1(M), and transmits the low voltage of the Mth stage second clock signal SCLKF(M) received at the Mth stage second clock signal terminal CLKF(M) to the Mth stage second output terminal GO2(M). At this time, the signal output by the Mth stage first output terminal GO1(M) is at the low voltage, and the signal output by the Mth stage second output terminal GO2(M) is at the low voltage.

The sensing control signal output sub-circuit 103 is turned on in response to the valid voltage at the Mth stage pull-up node Q(M), and transmits the Mth stage third clock signal SCLKD(M) received at the Mth stage third clock signal terminal CLKD(M) to the sensing control signal output terminal COR2(M).

For example, the sensing control signal output sub-circuit 103 turns on the fifth transistor M5 in response to the high voltage at the Mth stage pull-up node Q(M), and transmits the low voltage of the Mth stage third clock signal SCLKD(M) received at the Mth stage third clock signal terminal CLKD(M) to the sensing control signal output terminal COR2(M). At this time, the Mth stage sensing control signal CR2(M) output by the sensing control signal output terminal COR2(M) is at the low voltage.

The Nth stage output sub-circuit 104 is turned on in response to the valid voltage at the Nth stage pull-up node Q(N), transmits the Nth stage first clock signal SCLKE(N) received at the Nth stage first clock signal terminal CLKE(N) to the Nth stage first output terminal GO1(N), and transmits the Nth stage second clock signal SCLKF(N) received at the Nth stage second clock signal terminal CLKF(N) to the Nth stage second output terminal GO2(N).

For example, the Nth stage output sub-circuit 104 turns on the fourteenth transistor M14 and the fifteenth transistor M15 in response to the high voltage at the Nth stage pull-up node Q(N), transmits the low voltage of the Nth stage first clock signal SCLKE(N) received at the Nth stage first clock signal terminal CLKE(N) to the Nth stage first output terminal GO1(N), and transmits the low voltage of the Nth stage second clock signal SCLKF(N) received at the Nth stage second clock signal terminal CLKF(N) to the Nth stage second output terminal GO2(N). At this time, the Nth stage first scan signal G1(N) output by the Nth stage first output terminal GO1(N) is at the low voltage, and the Nth stage second scan signal G2(N) output by the Nth stage second output terminal GO2(N) is at the low voltage.

In S37, in a seventh phase (P7) of the display phase of the image frame (F) shown in FIG. 14, the Mth stage output sub-circuit 102 is turned off in response to the invalid voltage at the Mth stage pull-up node Q(M), and no signal is output from the Mth stage first output terminal GO1(M) and the Mth stage second output terminal GO2(M).

For example, the Mth stage output sub-circuit 102 turns off the twelfth transistor M12 and the thirteenth transistor M13 in response to the low voltage at the Mth stage pull-up node Q(M). At this time, no signal is output from the Mth stage first output terminal GO1(M) and the Mth stage second output terminal GO2(M).

The sensing control signal output sub-circuit 103 is turned off in response to the invalid voltage at the Mth stage pull-up node Q(M), and no signal is output from the sensing control signal output terminal COR2(M).

For example, the sensing control signal output sub-circuit 103 turns off the fifth transistor M5 in response to the low voltage at the Mth stage pull-up node Q(M). At this time, no signal is output from the sensing control signal output terminal COR2(M).

The Nth stage output sub-circuit 104 is turned off in response to the invalid voltage at the Nth stage pull-up node Q(N), and no signal is output from the Nth stage first output terminal GO1(N) and the Nth stage second output terminal GO2(N).

For example, the Nth stage output sub-circuit 104 turns off the fourteenth transistor M14 and the fifteenth transistor M15 in response to the low voltage at the Nth stage pull-up node Q(N). At this time, no signal is output from the Nth stage first output terminal GO1(N) and the Nth stage second output terminal GO2(N).

Figure 15:
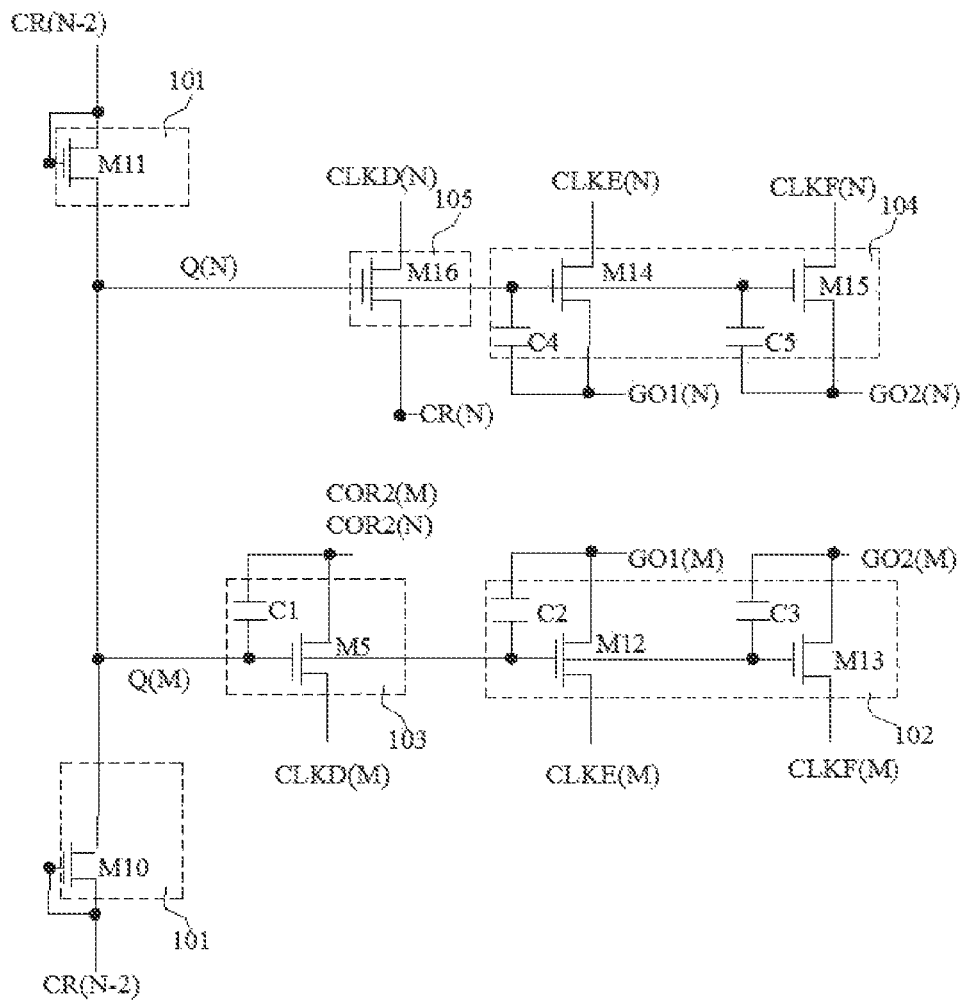
FIG. 15 is a replaceable structural diagram of the shift register circuit in FIG. 13.

FIG. 15 is a replaceable structural diagram of the shift register circuit 10. Referring to FIG. 15, in some embodiments, the shift register circuit 10 further includes a shift signal output sub-circuit 105.

The shift signal output sub-circuit 105 is coupled to the Nth stage pull-up node Q(N), an Nth stage third clock signal terminal CLKD(N) and a shift signal output terminal CR(N).

The shift signal output sub-circuit 105 is configured to, in response to the valid voltage at the Nth stage pull-up node Q(N), transmit an Nth stage third clock signal SCLKD(N) applied to the Nth stage third clock signal terminal CLKD(N) to the shift signal output terminal CR(N).

For example, the shift signal output sub-circuit 105 includes a sixteenth transistor M16. The sixteenth transistor M16 includes a gate, a first electrode and a second electrode. The gate of the sixteenth transistor M16 is coupled to the Nth stage pull-up node Q(N), the first electrode of the sixteenth transistor M16 is coupled to the Nth stage third clock signal terminal CLKD(N), and the second electrode of the sixteenth transistor M16 is coupled to the shift signal output terminal CR(N).

Figure 16:
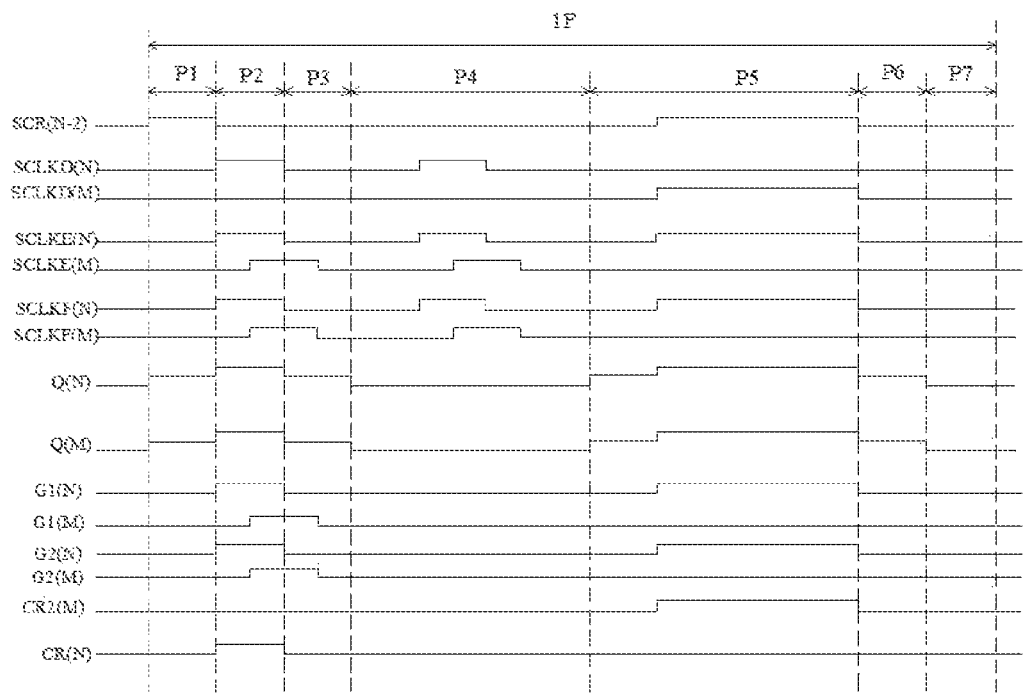
FIG. 16 is a replacement timing diagram of the image frame in FIG. 14.

FIG. 16 is a replacement timing diagram of the image frame (F) in FIG. 14. Referring to FIGS. 15 and 16, in a driving method of the shift register circuit 10 in this embodiment, for working processes of the first input sub-circuit 101, the Mth stage output sub-circuit 102, the sensing control signal output sub-circuit 103 and the Nth stage output sub-circuit 104 in S31 to S37, reference is made to the above embodiments. A working process of the shift signal output sub-circuit 105 in S31 to S37 is as follows.

In S31, in a first phase (P1) of a display phase of an image frame (F) shown in FIG. 16, the shift signal output sub-circuit 105 is turned on in response to the valid voltage at the Nth stage pull-up node Q(N), and transmits the Nth stage third clock signal SCLKD(N) received at the Nth stage third clock signal terminal CLKD(N) to the shift signal output terminal CR(N).

For example, the shift signal output sub-circuit 105 turns on the sixteenth transistor M16 in response to the high voltage at the Nth stage pull-up node Q(N), and transmits a low voltage of the Nth stage third clock signal SCLKD(N) received at the Nth stage third clock signal terminal CLKD(N) to the shift signal output terminal CR(N). At this time, an output signal of the shift signal output terminal CR(N) is at the low voltage.

In S32, in a second phase (P2) of the display phase of the image frame (F) shown in FIG. 16, the shift signal output sub-circuit 105 is turned on in response to the valid voltage at the Nth stage pull-up node Q(N), and transmits the Nth stage third clock signal SCLKD(N) received at the Nth stage third clock signal terminal CLKD(N) to the shift signal output terminal CR(N).

For example, the shift signal output sub-circuit 105 turns on the sixteenth transistor M16 in response to the high voltage at the Nth stage pull-up node Q(N), and transmits a high voltage of the Nth stage third clock signal SCLKD(N) received at the Nth stage third clock signal terminal CLKD (N) to the shift signal output terminal CR(N). At this time, the output signal of the shift signal output terminal CR(N) is at the high voltage.

In S33, in a third phase (P3) of the display phase of the image frame (F) shown in FIG. 16, the shift signal output sub-circuit 105 is turned on in response to the valid voltage at the Nth stage pull-up node Q(N), and transmits the Nth stage third clock signal SCLKD(N) received at the Nth stage third clock signal terminal CLKD(N) to the shift signal output terminal CR(N).

For example, the shift signal output sub-circuit 105 turns on the sixteenth transistor M16 in response to the high voltage at the Nth stage pull-up node Q(N), and transmits the low voltage of the Nth stage third clock signal SCLKD(N) received at the Nth stage third clock signal terminal CLKD(N) to the shift signal output terminal CR(N). At this time, the output signal of the shift signal output terminal CR(N) is at the low voltage.

In S34, in a fourth phase (P4) of the display phase of the image frame (F) shown in FIG. 16, the shift signal output sub-circuit 105 is turned off in response to the invalid voltage at the Nth stage pull-up node Q(N), and no signal is output from the shift signal output terminal CR(N).

For example, the shift signal output sub-circuit 105 turns off the sixteenth transistor M16 in response to the low voltage at the Nth stage pull-up node Q(N). At this time, no signal is output from the shift signal output terminal CR(N).

In S35, in a fifth phase (P5) of the display phase of the image frame (F) shown in FIG. 16, the shift signal output sub-circuit 105 is turned on in response to the valid voltage at the Nth stage pull-up node Q(N), and transmits the Nth stage third clock signal SCLKD(N) received at the Nth stage third clock signal terminal CLKD(N) to the shift signal output terminal CR(N).

For example, the shift signal output sub-circuit 105 turns on the sixteenth transistor M16 in response to the high voltage at the Nth stage pull-up node Q(N), and transmits the low voltage of the Nth stage third clock signal SCLKD(N) received at the Nth stage third clock signal terminal CLKD(N) to the shift signal output terminal CR(N). At this time, the output signal of the shift signal output terminal CR(N) is at the low voltage.

In S36, in a sixth phase (P6) of the display phase of the image frame (F) shown in FIG. 16, the shift signal output sub-circuit 105 is turned on in response to the valid voltage at the Nth stage pull-up node Q(N), and transmits the Nth stage third clock signal SCLKD(N) received at the Nth stage third clock signal terminal CLKD(N) to the shift signal output terminal CR(N).

For example, the shift signal output sub-circuit 105 turns on the sixteenth transistor M16 in response to the high voltage at the Nth stage pull-up node Q(N), and transmits the low voltage of the Nth stage third clock signal SCLKD(N) received at the Nth stage third clock signal terminal CLKD(N) to the shift signal output terminal CR(N). At this time, the output signal of the shift signal output terminal CR(N) is at the low voltage.

In S37, in a seventh phase (P7) of the display phase of the image frame (F) shown in FIG. 16, the shift signal output sub-circuit 105 is turned off in response to the invalid voltage at the Nth stage pull-up node Q(N), and no signal is output from the shift signal output terminal CR(N).

For example, the shift signal output sub-circuit 105 turns off the sixteenth transistor M16 in response to the low voltage at the Nth stage pull-up node Q(N). At this time, no signal is output from the shift signal output terminal CR(N).

Figure 17:
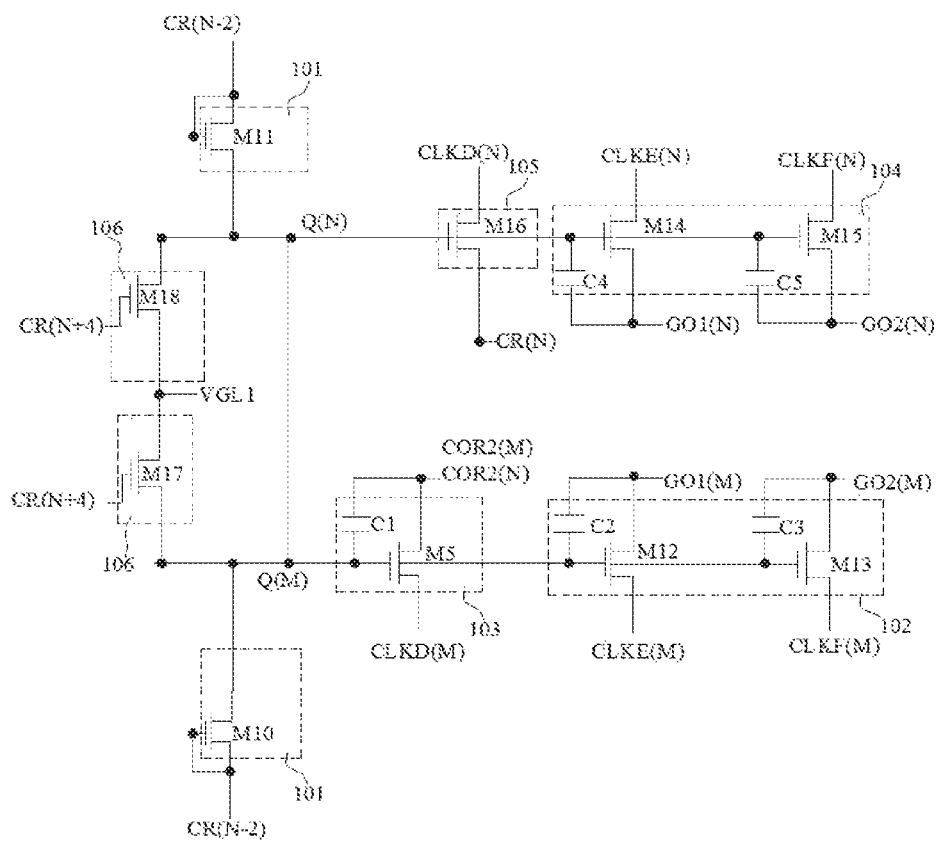
FIG. 17 is another replaceable structural diagram of the shift register circuit in FIG. 13.

FIG. 17 is another replaceable structural diagram of the shift register circuit 10. Referring to FIG. 17, in some embodiments, the shift register circuit 10 further includes a first reset sub-circuit 106.

The first reset sub-circuit 106 is coupled to the Mth stage pull-up node Q(M), the Nth stage pull-up node Q(N), a first reset input terminal CR(N+4) and a fourth voltage terminal VGL1.

The first reset sub-circuit 106 is configured to, in response to a first reset signal SCR(N+4) of the first reset input terminal CR(N+4), transmit a voltage of the fourth voltage terminal VGL1 to the Mth stage pull-up node Q(M) and the Nth stage pull-up node Q(N). Thus, the Mth stage pull-up node Q(M) and the Nth stage pull-up node Q(N) are set to be at the invalid voltage.

For example, the first reset sub-circuit 106 includes at least one of a seventeenth transistor M17 or an eighteenth transistor M18. In a case where the first reset sub-circuit 106 includes the seventeenth transistor M17 or the eighteenth transistor M18, the Mth stage pull-up node Q(M) is coupled to the Nth stage pull-up node Q(N). In a case where the first reset sub-circuit 106 includes the seventeenth transistor M17 and the eighteenth transistor M18, the seventeenth transistor M17 and the eighteenth transistor M18 set the Mth stage pull-up node Q(M) and the Nth stage pull-up node Q(N) to be at the invalid voltages, respectively.

The seventeenth transistor M17 includes a gate, a first electrode and a second electrode. The gate of the seventeenth transistor M17 is coupled to the first reset input terminal CR(N+4), the first electrode of the seventeenth transistor M17 is coupled to the Mth stage pull-up node Q(M), and the second electrode of the seventeenth transistor M17 is coupled to the fourth voltage terminal VGL1.

The eighteenth transistor M18 includes a gate, a first electrode and a second electrode; the gate of the eighteenth transistor M18 is coupled to the first reset input terminal CR(N+4), the first electrode of the eighteenth transistor M18 is coupled to the Nth stage pull-up node Q(N), and the second electrode of the eighteenth transistor M18 is coupled to the fourth voltage terminal VGL1.

Figure 18:
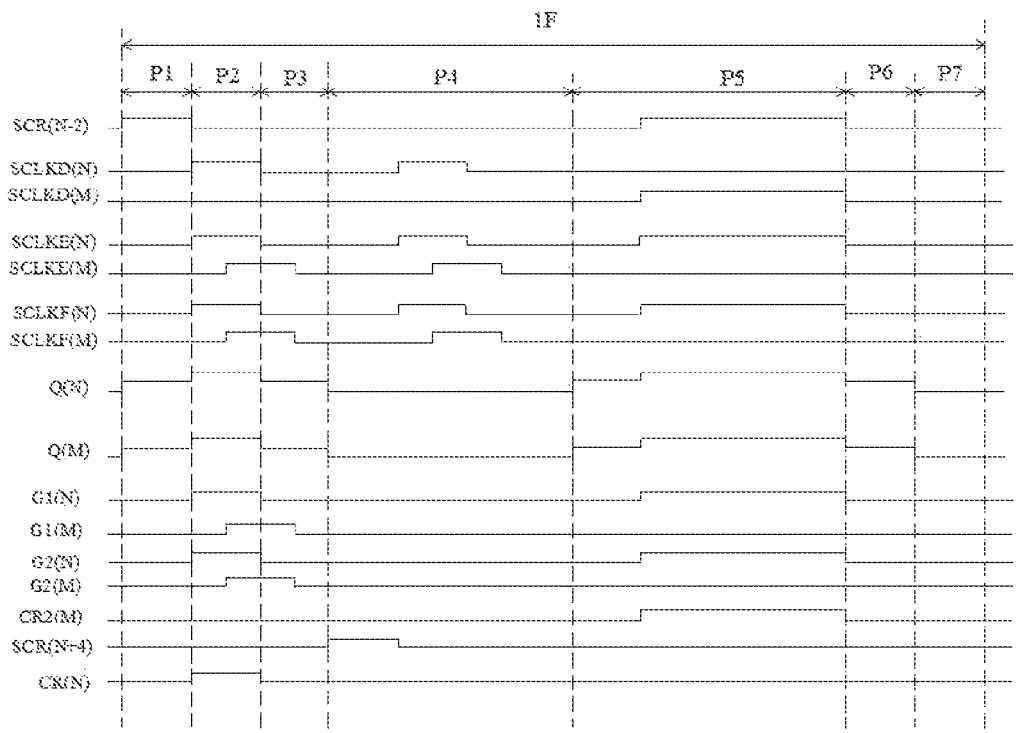
FIG. 18 is another replacement timing diagram of the image frame in FIG. 14.

FIG. 18 is another replacement timing diagram of the image frame (F) in FIG. 14. Referring to FIGS. 17 and 18, in a driving method of the shift register circuit 10 in this embodiment, for working processes of the first input sub-circuit 101, the Mth stage output sub-circuit 102, the sensing control signal output sub-circuit 103, the Nth stage output sub-circuit 104 and the shift signal output sub-circuit 105 in S31 to S37, reference is made to the above embodiments. A working process of the first reset sub-circuit 106 in S31 to S37 is as follows.

In S31 to S33, in a first phase (P1) to a third phase (P3) of a display phase of an image frame (F) shown in FIG. 18, the first reset sub-circuit 106 is turned off in response to an invalid voltage of the first reset signal SCR(N+4) of the first reset input terminal CR(N+4), and no signal is output from the first reset sub-circuit 106.

For example, the first reset sub-circuit 106 turns off the seventeenth transistor M17 and the eighteenth transistor M18 in response to a low voltage of the first reset signal SCR(N+4) of the first reset input terminal CR(N+4). At this time, no signal is output from the seventeenth transistor M17 and the eighteenth transistor M18.

In S34, in a fourth phase (P4) of the display phase of the image frame (F) shown in FIG. 18, the first reset sub-circuit 106 is turned on in response to a valid voltage of the first reset signal SCR(N+4) of the first reset input terminal CR(N+4), and transmits the voltage of the fourth voltage terminal VGL1 to the Mth stage pull-up node Q(M) and the Nth stage pull-up node Q(N). Thus, the potentials of the Mth stage pull-up node Q(M) and the Nth stage pull-up node Q(N) are reset.

For example, the first reset sub-circuit 106 turns on at least one of the seventeenth transistor M17 and the eighteenth transistor M18 in response to a high voltage of the first reset signal SCR(N+4) of the first reset input terminal CR(N+4), and transmits the low voltage of the fourth voltage terminal VGL1 to the Mth stage pull-up node Q(M) and the Nth stage pull-up node Q(N). At this time, the potentials of the Mth stage pull-up node Q(M) and the Nth stage pull-up node Q(N) are at a low level.

In S35 to S37, in a fifth phase (P5) to a seventh phase (P7) of the display phase of the image frame (F) shown in FIG. 18, the first reset sub-circuit 106 is turned off in response to the invalid voltage of the first reset signal SCR(N+4) of the first reset input terminal CR(N+4), and no signal is output from the first reset sub-circuit 106.

For example, the first reset sub-circuit 106 turns off the seventeenth transistor M17 and the eighteenth transistor M18 in response to the low voltage of the first reset signal SCR(N+4) of the first reset input terminal CR(N+4). At this time, no signal is output from the seventeenth transistor M17 and the eighteenth transistor M18.

Figure 19:
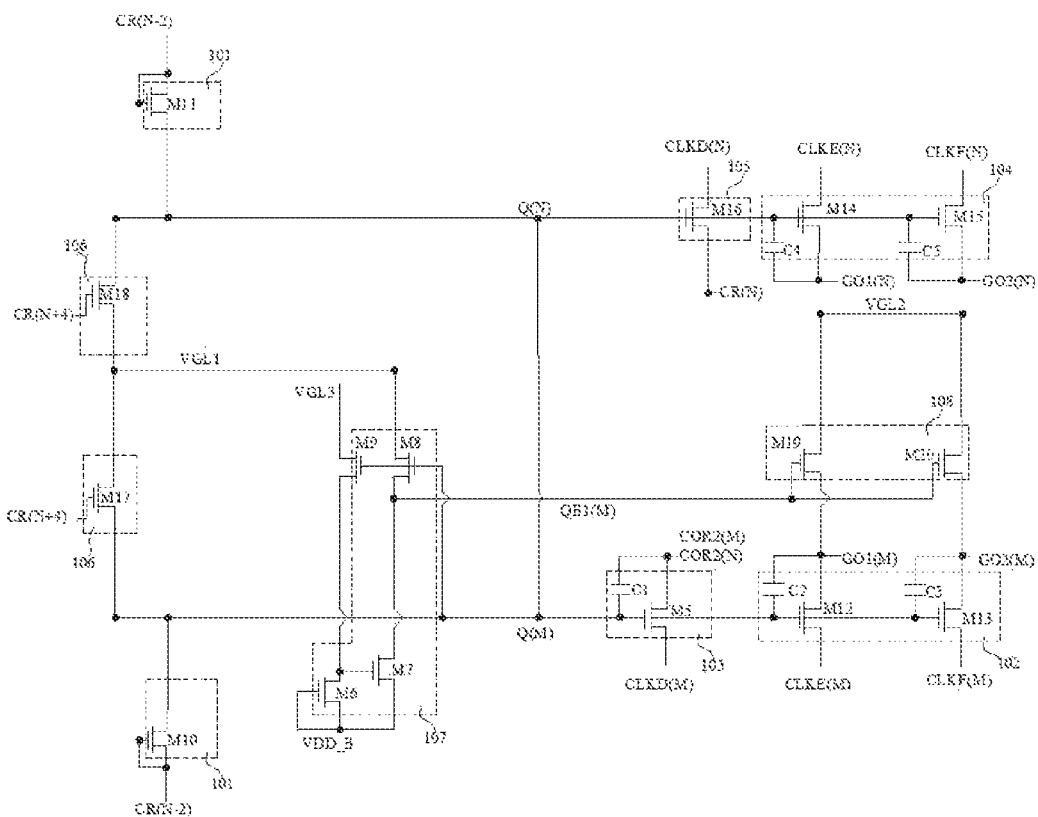
FIG. 19 is yet another replaceable structural diagram of the shift register circuit in FIG. 13.

FIG. 19 is yet another replaceable structural diagram of the shift register circuit 10. Referring to FIG. 19, in some embodiments, the shift register circuit 10 further includes an Mth stage first pull-down control sub-circuit 107 and an Mth stage first noise reduction sub-circuit 108.

The Mth stage first pull-down control sub-circuit 107 is coupled to the Mth stage pull-up node Q(M), a fifth voltage terminal VDD_B, an Mth stage first pull-down node QB1(M), a sixth voltage terminal VGL3 and the fourth voltage terminal VGL1. The Mth stage pull-up node Q(M) is coupled to the Nth stage pull-up node Q(N).

The Mth stage first pull-down control sub-circuit 107 is configured to, in response to the valid voltage at the Mth stage pull-up node Q(M), transmit the voltage of the fourth voltage terminal VGL1 to the Mth stage first pull-down node QB1(M), so that the Mth stage first pull-down node QB1(M) is at an invalid voltage.

The fifth voltage terminal VDD_B is configured to transmit a fixed-level signal (e.g., a direct current low-level voltage) during a working period of the M stage first pull-down control sub-circuit 107. The fourth voltage terminal VGL1 is configured to transmit a fixed-level signal (e.g., a direct current low-level voltage). The sixth voltage terminal VGL3 is configured to transmit a fixed-level signal (e.g., a direct current low-level voltage). The sixth voltage terminal VGL3 may be the same voltage terminal as the fourth voltage terminal VGL1.

For example, the M stage first pull-down control sub-circuit 107 includes a sixth transistor M6, a seventh transistor M7, an eighth transistor M8 and a ninth transistor M9.

The sixth transistor M6 includes a gate, a first electrode and a second electrode. Both the gate and the first electrode of the sixth transistor M6 are coupled to the fifth voltage terminal VDD_B.

The seventh transistor M7 includes a gate, a first electrode and a second electrode; the gate of the seventh transistor M7 is coupled to the second electrode of the sixth transistor M6, the first electrode of the seventh transistor M7 is coupled to the fifth voltage terminal VDD_B, and the second electrode of the seventh transistor M7 is coupled to the Mth stage first pull-down node QB1(M).

The eighth transistor M8 includes a gate, a first electrode and a second electrode. The gate of the eighth transistor M8 is coupled to the Mth stage pull-up node Q(M), the first electrode of the eighth transistor M8 is coupled to the second electrode of the seventh transistor M7 and Mth stage first pull-down node QB1(M), and the second electrode of the eighth transistor M8 is coupled to the fourth voltage terminal VGL1.

The ninth transistor M9 includes a gate, a first electrode and a second electrode. The gate of the ninth transistor M9 is coupled to the Mth stage pull-up node Q(M), the first electrode of the ninth transistor M9 is coupled to the second electrode of the sixth transistor M6 and the gate of the seventh transistor M7, and the second electrode of the ninth transistor M9 is coupled to the sixth voltage terminal VGL3.

The two shift register sub-circuits 10_a and 10_b in this embodiment share one Mth stage first pull-down control sub-circuit 107, which reduces wiring and costs.

The Mth stage first noise reduction sub-circuit 108 is coupled to the Mth stage first pull-down node QB1(M), a seventh voltage terminal VGL2, and at least one of the Mth stage first output terminal GO1(M) and the Mth stage second output terminal GO2(M).

The seventh voltage terminal VGL2 is configured to transmit a direct current low-level signal.

For example, the seventh voltage terminal VGL2 may be the same voltage terminal as the sixth voltage terminal VGL3 and the fourth voltage terminal VGL1, or may be a different voltage terminal from the sixth voltage terminal VGL3 and the fourth voltage terminal VGL1.

The Mth stage first noise reduction sub-circuit 108 is configured to, in response to the valid voltage at the Mth stage first pull-down node QB1(M), transmit a voltage of the seventh voltage terminal VGL2 to the at least one of the Mth stage first output terminal GO1(M) and the Mth stage second output terminal GO2(M), so that the at least one of the Mth stage first output terminal GO1(M) and the Mth stage second output terminal GO2(M) is set to be at an invalid voltage. The Mth stage first noise reduction sub-circuit 108 may perform noise reduction on the at least one of the Mth stage first output terminal GO1(M) and the Mth stage second output terminal GO2(M) during a phase where the shift register sub-circuit 10_b does not output the scan signal.

In the case where the Mth stage first pull-down node QB1(M) is coupled to the Nth stage first pull-down node QB1(N), the Mth stage first noise reduction sub-circuit 108 may also perform noise reduction on at least one of the Nth stage first output terminal GO1(N) and the Nth stage second output terminal GO2(N) during a phase where the shift register sub-circuit 10_a does not output the scan signal.

For example, the Mth stage first noise reduction sub-circuit 108 includes at least one of the nineteenth transistor M19 and the twentieth transistor M20.

The nineteenth transistor M19 includes a gate, a first electrode and a second electrode. The gate of the nineteenth transistor M19 is coupled to the Mth stage first pull-down node QB1(M), the first electrode of the nineteenth transistor M19 is coupled to the second electrode of the twelfth transistor M12 and the Mth stage first output terminal GO1(M), and the second electrode of the nineteenth transistor M19 is coupled to the seventh voltage terminal VGL2.

The twentieth transistor M20 includes a gate, a first electrode and a second electrode. The gate of the twentieth transistor M20 is coupled to the Mth stage first pull-down node QB1(M), the first electrode of the twentieth transistor M20 is coupled to the second electrode of the thirteenth transistor M13 and the Mth stage second output terminal GO2(M), and the second electrode of the twentieth transistor M20 is coupled to the seventh voltage terminal VGL2.

Figure 20:
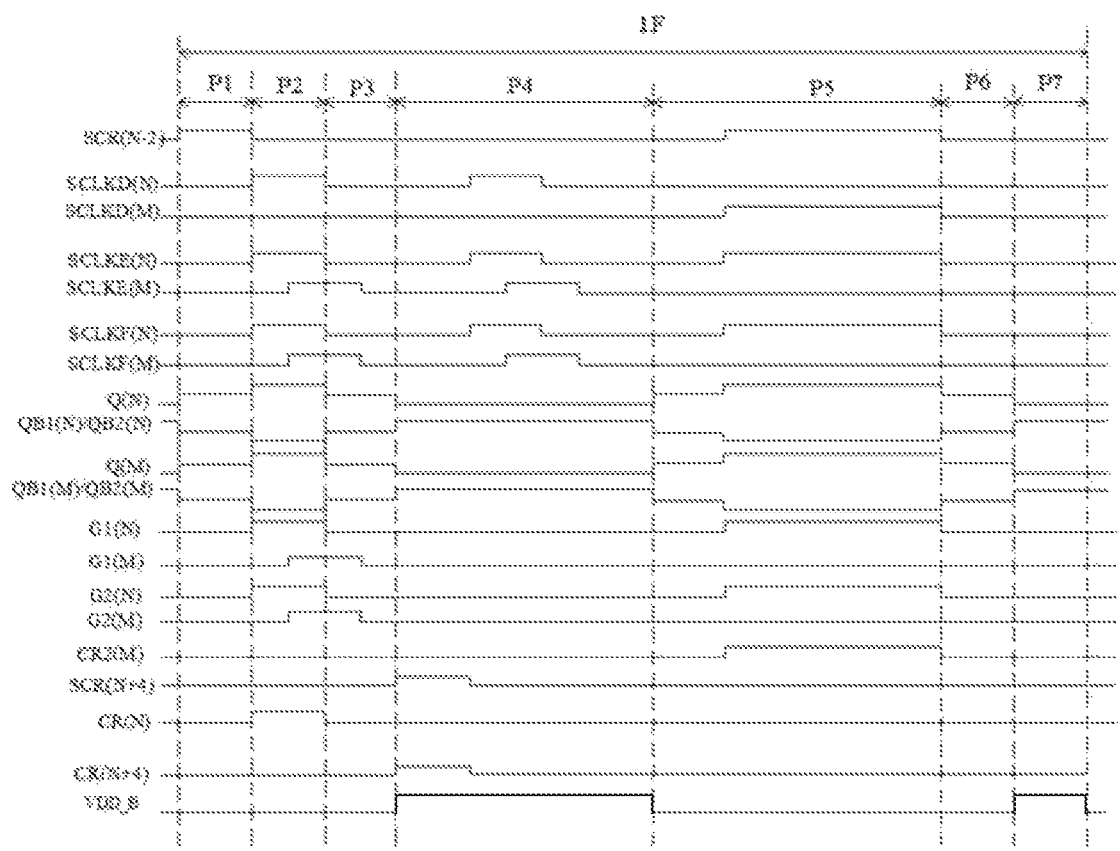
FIG. 20 is yet another replacement timing diagram of the image frame in FIG. 14.

FIG. 20 is yet another replacement timing diagram of the image frame (F) in FIG. 14. Referring to FIGS. 19 and 20, in a driving method of the shift register circuit 10 in this embodiment, for working processes of the first input sub-circuit 101, the Mth stage output sub-circuit 102, the sensing control signal output sub-circuit 103, the Nth stage output sub-circuit 104, the shift signal output sub-circuit 105 and the first reset sub-circuit 106 in S31 to S37, reference is made to the above embodiments. Working processes of the Mth stage first pull-down control sub-circuit 107 and the Mth stage first noise reduction sub-circuit 108 in S31 to S37 are as follows.

In S31 to S33, in a first phase (P1) to a third phase (P3) of a display phase of an image frame (F) shown in FIG. 20, the Mth stage first pull-down control sub-circuit 107 transmits the voltage of the fourth voltage terminal VGL1 to the Mth stage first pull-down node QB1(M) in response to the valid voltage at the Mth stage pull-up node Q(M).

For example, the Mth stage first pull-down control sub-circuit 107 turns on the eighth transistor M8 and the ninth transistor M9 in response to the high voltage at the Mth stage pull-up node Q(M). The eighth transistor M8 transmits the voltage of the fourth voltage terminal VGL1 to the Mth stage first pull-down node QB1(M). At this time, a potential of the Mth stage first pull-down node QB1(M) is at a low level. The ninth transistor M9 transmits the low voltage of the sixth voltage terminal VGL3 to the gate of the seventh transistor M7, so that the seventh transistor M7 is turned off.

The Mth stage first noise reduction sub-circuit 108 is turned off in response to the invalid voltage at the Mth stage first pull-down node QB1(M).

For example, the Mth stage first noise reduction sub-circuit 108 turns off the nineteenth transistor M19 and the twentieth transistor M20 in response to the low voltage at the Mth stage first pull-down node QB1(M).

In S34, in a fourth phase (P4) of the display phase of the image frame (F) shown in FIG. 20, the Mth stage first pull-down control sub-circuit 107 transmits the voltage of the fifth voltage terminal VDD_B to the Mth stage first pull-down node QB1(M) in response to the valid voltage at the fifth voltage terminal VDD_B.

For example, when the Mth stage pull-up node Q(M) and the Nth stage pull-up node Q(N) are at the low voltage, the eighth transistor M8 and the ninth transistor M9 of the Mth stage first pull-down control sub-circuit 107 are turned off. In addition, the Mth stage first pull-down control sub-circuit 107 turns on the sixth transistor M6 and the seventh transistor M7 in response to the high voltage of the fifth voltage terminal VDD_B, and transmits the high voltage of the fifth voltage terminal VDD_B to the Mth stage first pull-down node QB1(M). At this time, the potential of the Mth stage first pull-down node QB1(M) is a high voltage.

The Mth stage first noise reduction sub-circuit 108 is turned on in response to the valid voltage at the Mth stage first pull-down node QB1(M), and transmits the voltage of the seventh voltage terminal VGL2 to the at least one of the Mth stage first output terminal GO1(M) and the Mth stage second output terminal GO2(M). Therefore, noise reduction is performed on the at least one of the Mth stage first output terminal GO1(M) and the Mth stage second output terminal GO2(M).

For example, the Mth stage first noise reduction sub-circuit 108 turns on at least one of the nineteenth transistor M19 and the twentieth transistor M20 in response to the high voltage at the Mth stage first pull-down node QB1(M), and transmits the low voltage of the seventh voltage terminal VGL2 to at least one of the Mth stage first output terminal GO1(M) and the Mth stage second output terminal GO2(M). At this time, signals output by the Mth stage first output terminal GO1(M) and the Mth stage second output terminal GO2(M) are at the low voltage.

In S35 and S36, in a fifth phase (P5) and a sixth phase (P6) of the display phase of the image frame (F) shown in FIG. 20, for working processes of the Mth stage first pull-down control sub-circuit 107 and the Mth stage first noise reduction sub-circuit 108, reference may be made to the description of S31 to S33 in this embodiment, and details will not be repeated here.

In S37, in a seventh phase (P7) of the display phase of the image frame (F) shown in FIG. 20, for working processes of the Mth stage first pull-down control sub-circuit 107 and the Mth stage first noise reduction sub-circuit 108, reference may be made to the description of S34 in this embodiment, and details will not be repeated here.

Figure 21:
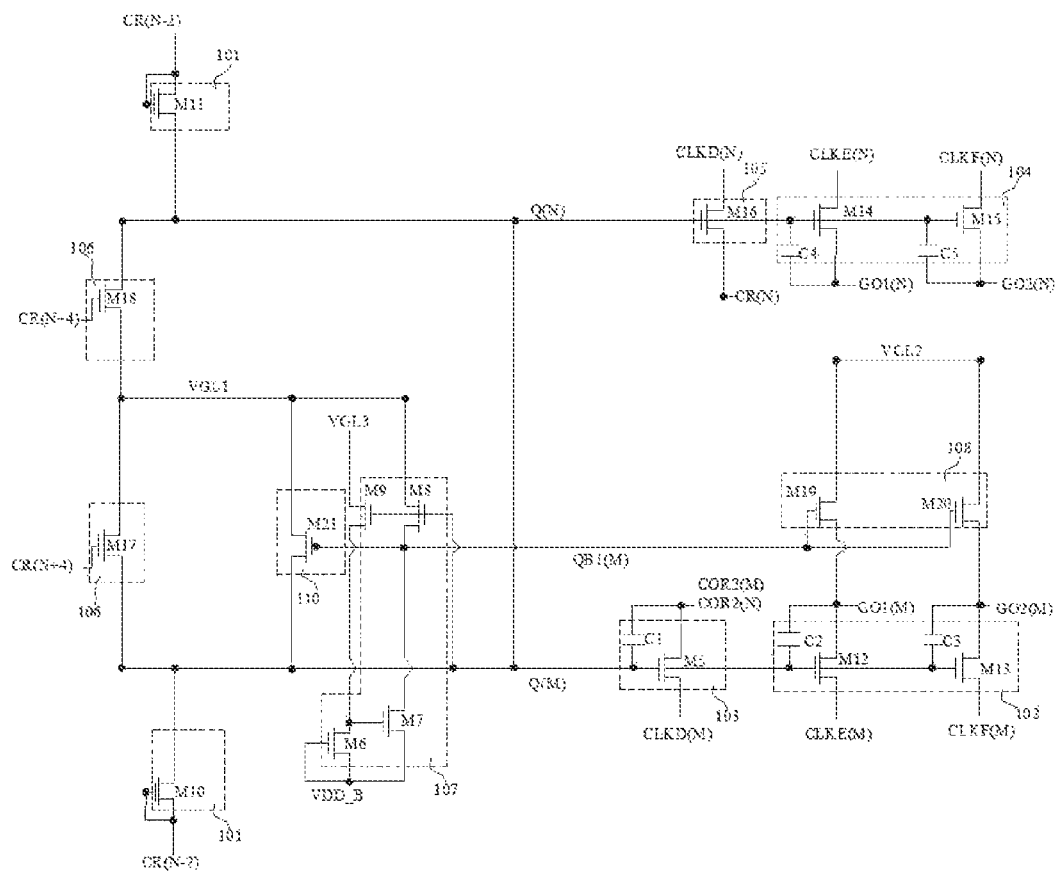
FIG. 21 is yet another replaceable structural diagram of the shift register circuit in FIG. 13.

FIG. 21 is yet another replaceable structural diagram of the shift register circuit 10. Referring to FIG. 21, in some embodiments, the shift register circuit 10 further includes an Mth stage first pull-up node noise reduction sub-circuit 110.

The Mth stage first pull-up node noise reduction sub-circuit 110 is coupled to the Mth stage first pull-down node QB1(M), the Mth stage pull-up node Q(M) and the fourth voltage terminal VGL1.

The Mth stage first pull-up node noise reduction sub-circuit 110 is configured to transmit the voltage of the fourth voltage terminal VGL1 to the Mth stage pull-up node Q(M) in response to the valid voltage at the Mth stage first pull-down node QB1(M), so that the Mth stage pull-up node Q(M) is set to be at the invalid voltage. The Mth stage first pull-up node noise reduction sub-circuit 110 may perform noise reduction on the Mth stage pull-up node Q(M) during a phase where the shift register circuit 10 does not output the scan signal.

In the case where the Mth stage pull-up node Q(M) is coupled to the Nth stage pull-up node Q(N), the Mth stage first pull-up node noise reduction sub-circuit 110 may set the Nth stage pull-up node Q(N) to be at the invalid voltage, so that noise reduction may be performed on the Nth stage pull-up node Q(N) during a phase where the shift register circuit 10 does not output the scan signal.

It can be seen that the Mth stage first pull-up node noise reduction sub-circuit 110 in this embodiment may simultaneously perform noise reduction on the pull-up nodes of the two shift register sub-circuits 10_a and 10_b, which reduces wiring and costs.

For example, the Mth stage first pull-up node noise reduction sub-circuit 110 includes a twenty-first transistor M21. The twenty-first transistor M21 includes a gate, a first electrode and a second electrode. The gate of the twenty-first transistor M21 is coupled to the Mth stage first pull-down node QB1(M), the first electrode of the twenty-first transistor M21 is coupled to the Mth stage pull-up node Q(M), and the second electrode of the twenty-first transistor M21 is coupled to the fourth voltage terminal VGL1.

Referring to FIGS. 20 and 21, in a driving method of the shift register circuit 10 in this embodiment, for working processes of the first input sub-circuit 101, the Mth stage output sub-circuit 102, the sensing control signal output sub-circuit 103, the Nth stage output sub-circuit 104, the shift signal output sub-circuit 105, the first reset sub-circuit 106, the Mth stage first pull-down control sub-circuit 107 and the Mth stage first noise reduction sub-circuit 108 in S31 to S37, reference is made to the above embodiments. A working process of the Mth stage first pull-up node noise reduction sub-circuit 110 in S31 to S37 is as follows.

In S31 to S33, in the first phase (P1) to the third phase (P3) of the display phase of the image frame (F) shown in FIG. 20, the Mth stage first pull-up node noise reduction sub-circuit 110 is turned off in response to the invalid voltage at the Mth stage first pull-down node QB1(M).

For example, the Mth stage first pull-up node noise reduction sub-circuit 110 turns off the twenty-first transistor M21 in response to the low voltage of the Mth stage first pull-down node QB1(M).

In S34, in the fourth phase (P4) of the display phase of the image frame (F) shown in FIG. 20, the Mth stage first pull-up node noise reduction sub-circuit 110 is turned on in response to the valid voltage at the Mth stage first pull-down node QB1(M), and transmits the voltage of the fourth voltage terminal VGL1 to the Mth stage pull-up node Q(M). Therefore, noise reduction is performed on the Mth stage pull-up node Q(M).

For example, the Mth stage first pull-up node noise reduction sub-circuit 110 turns on the twenty-first transistor M21 in response to the high voltage at the Mth stage first pull-down node QB1(M), and transmits the low voltage of the fourth voltage terminal VGL1 to the Mth stage pull-up node Q(M). At this time, the Mth stage pull-up node Q(M) is at the low voltage.

In S35 and S36, in the fifth phase (P5) and the sixth phase (P6) of the display phase of the image frame (F) shown in FIG. 20, for a working process of the Mth stage first pull-up node noise reduction sub-circuit 110, reference may be made to the description of S31-S33 in this embodiment, and details will not be repeated here.

In S37, in the seventh phase (P7) of the display phase of the image frame (F) shown in FIG. 20, for a working process of the Mth stage first pull-up node noise reduction sub-circuit 110, reference may be made to the description of S34 in this embodiment, and details will not be repeated here.

Figure 22:
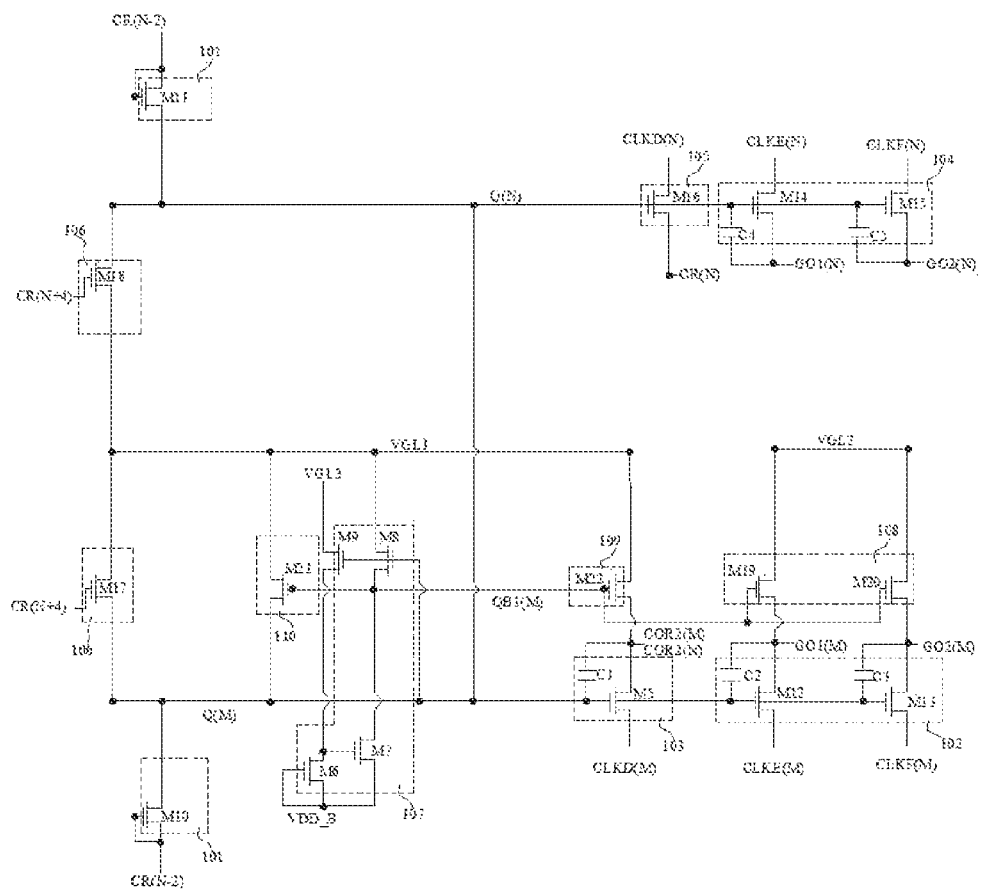
FIG. 22 is yet another replaceable structural diagram of the shift register circuit in FIG. 13.

FIG. 22 is yet another replaceable structural diagram of the shift register circuit 10. Referring to FIG. 22, in some embodiments, the shift register circuit 10 further includes a first sensing control signal noise reduction sub-circuit 109.

The first sensing control signal noise reduction sub-circuit 109 is coupled to the Mth stage first pull-down node QB1(M), the fourth voltage terminal VGL1 and the sensing control signal output terminal COR2(M).

The first sensing control signal noise reduction sub-circuit 109 is configured to transmit the voltage of the fourth voltage terminal VGL1 to the sensing control signal output terminal COR2(M) in response to the valid voltage at the Mth stage first pull-down node QB1(M), so that the sensing control signal output terminal COR2(M) is set to be at the invalid voltage. The first sensing control signal noise reduction sub-circuit 109 may perform noise reduction on the sensing control signal output terminal COR2(M) during a phase where the shift register circuit 10 does not output the sensing control signal.

For example, the first sensing control signal noise reduction sub-circuit 109 includes a twenty-second transistor M22. The twenty-second transistor M22 includes a gate, a first electrode and a second electrode. The gate of the twenty-second transistor M22 is coupled to the Mth stage first pull-down node QB1(M), the first electrode of the twenty-second transistor M22 is coupled to the second electrode of the fifth transistor M5 and the sensing control signal output terminal COR2(M), and the second electrode of the twenty-second transistor M22 is coupled to the fourth voltage terminal VGL1.

Referring to FIGS. 22 and 20, in a driving method of the shift register circuit 10 in this embodiment, for working processes of the first input sub-circuit 101, the Mth stage output sub-circuit 102, the sensing control signal output sub-circuit 103, the Nth stage output sub-circuit 104, the shift signal output sub-circuit 105, the first reset sub-circuit 106, the Mth stage first pull-down control sub-circuit 107, the Mth stage first noise reduction sub-circuit 108, and the Mth stage first pull-up node noise reduction sub-circuit 110 in S31 to S37, reference is made to the above embodiments. A working process of the first sensing control signal noise reduction sub-circuit 109 in S31 to S37 is as follows.

In S31 to S33, in the first phase (P1) to the third phase (P3) of the display phase of the image frame (F) shown in FIG. 20, the first sensing control signal noise reduction sub-circuit 109 is turned off in response to the invalid voltage at the Mth stage first pull-down node QB1(M).

For example, the first sensing control signal noise reduction sub-circuit 109 turns off the twenty-second transistor M22 in response to the low voltage at the Mth stage first pull-down node QB1(M).

In S34, in the fourth phase (P4) of the display phase of the image frame (F) shown in FIG. 20, the first sensing control signal noise reduction sub-circuit 109 is turned on in response to the valid voltage at the Mth stage first pull-down node QB1(M), and transmits the voltage of the fourth voltage terminal VGL1 to the sensing control signal output terminal COR2(M). Therefore, noise reduction is performed on the sensing control signal output terminal COR2(M).

For example, the first sensing control signal noise reduction sub-circuit 109 turns on the twenty-second transistor M22 in response to the high voltage at the Mth stage first pull-down node QB1(M), and transmits the low voltage of the fourth voltage terminal VGL1 the sensing control signal output terminal COR2(M). At this time, the signal output from the sensing control signal output terminal COR2(M) is at the low voltage.

In S35 and S36, in the fifth phase (P5) and the sixth phase (P6) of the display phase of the image frame (F) shown in FIG. 20, for a working process of the first sensing control signal noise reduction sub-circuit 109, reference may be made to the description of S31 to S33 in this embodiment, and details will not be repeated here.

In S37, in the seventh phase (P7) of the display phase of the image frame (F) shown in FIG. 20, for a working process of the first sensing control signal noise reduction sub-circuit 109, reference may be made to the description of S34 in this embodiment, and details will not be repeated here.

Figure 23:
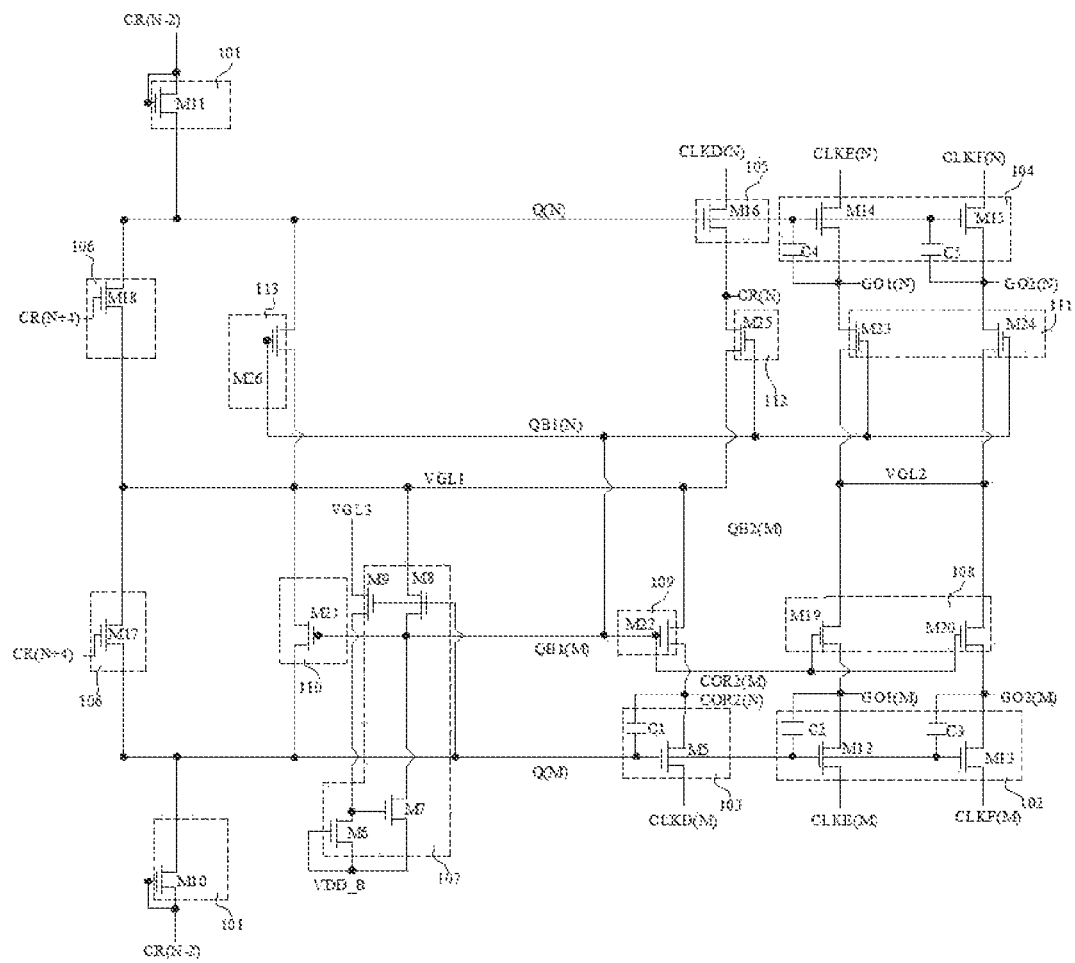
FIG. 23 is yet another replaceable structural diagram of the shift register circuit in FIG. 13.

FIG. 23 is yet another replaceable structural diagram of the shift register circuit 10. Referring to FIG. 23, in some embodiments, the shift register circuit 10 further includes at least one of an Nth stage first noise reduction sub-circuit 111, an Nth stage first shift signal noise reduction sub-circuit 112 and an Nth stage first pull-up node noise reduction sub-circuit 113.

The Nth stage first noise reduction sub-circuit 111 is coupled to the Nth stage first pull-down node QB1(N), the seventh voltage terminal VGL2, the Nth stage first output terminal GO1(N) and the Nth stage second output terminal GO2(N). The Mth stage first pull-down node QB1(M) is coupled to the Nth stage first pull-down node QB1(N).

The Nth stage first noise reduction sub-circuit 111 is configured to transmit the voltage of the seventh voltage terminal VGL2 to the Nth stage first output terminal GO1(N) and the Nth stage second output terminal GO2(N) in response to the valid voltage at the Nth stage first pull-down node QB1(N), so that at least one of the Nth stage first output terminal GO1(N) and the Nth stage second output terminal GO2(N) is set to be at the invalid voltage. The Nth stage first noise reduction sub-circuit 111 may perform noise reduction on the Nth stage first output terminal GO1(N) and the Nth stage second output terminal GO2(N) during a phase where the shift register circuit 10 does not output the scan signal.

For example, the Nth stage first noise reduction sub-circuit 111 includes a twenty-third transistor M23 and a twenty-fourth transistor M24.

The twenty-third transistor M23 includes a gate, a first electrode and a second electrode. The gate of the twenty-third transistor M23 is coupled to the Nth stage first pull-down node QB1(N), the first electrode of twenty-third transistor M23 is coupled to the Nth stage first output terminal GO1(N), and the second electrode of twenty-third transistor M23 is coupled to the seventh voltage terminal VGL2.

The twenty-fourth transistor M24 includes a gate, a first electrode and a second electrode. The gate of the twenty-fourth transistor M24 is coupled to the Nth stage first pull-down node QB1(N), the first electrode of the twenty-fourth transistor M24 is coupled to the Nth stage second output terminal GO2(N), and the second electrode of the twenty-fourth transistor M24 is coupled to the seventh voltage terminal VGL2.

The Nth stage first shift signal noise reduction sub-circuit 112 is coupled to the Nth stage first pull-down node QB1(N), the fourth voltage terminal VGL1 and the shift signal output terminal CR(N).

The Nth stage first shift signal noise reduction sub-circuit 112 is configured to transmit the voltage of the fourth voltage terminal VGL1 to the shift signal output terminal CR(N) in response to the valid voltage at the Nth stage first pull-down node QB1(N), so that the shift signal output terminal CR(N) is set to be at the invalid voltage. The Nth stage first shift signal noise reduction sub-circuit 112 may perform noise reduction on the shift signal output terminal CR(N) during a phase where the shift register circuit 10 does not output the shift signal.

For example, the Nth stage first shift signal noise reduction sub-circuit 112 includes a twenty-fifth transistor M25. The twenty-fifth transistor M25 includes a gate, a first electrode and a second electrode. The gate of the twenty-fifth transistor M25 is coupled to the Nth stage first pull-down node QB1(N), the first electrode of the twenty-fifth transistor M25 is coupled to the shift signal output terminal CR(N), and the second electrode of the twenty-fifth transistor M25 is coupled to the fourth voltage terminal VGL1.

The Nth stage first pull-up node noise reduction sub-circuit 113 is coupled to the Nth stage first pull-down node QB1(N), the fourth voltage terminal VGL1 and the Nth stage pull-up node Q(N).

The Nth stage first pull-up node noise reduction sub-circuit 113 is configured to transmit the voltage of the fourth voltage terminal VGL1 to the Nth stage pull-up node Q(N) in response to the valid voltage at the Nth stage first pull-down node QB1(N), so that the Nth stage pull-up node Q(N) is set to be at the invalid voltage. The Nth stage first pull-up node noise reduction sub-circuit 113 may perform noise reduction on the Nth stage pull-up node Q(N) during a phase where the shift register circuit 10 does not output the scan signal.

For example, the Nth stage first pull-up node noise reduction sub-circuit 113 includes a twenty-sixth transistor M26. The twenty-sixth transistor M26 includes a gate, a first electrode and a second electrode. The gate of the twenty-sixth transistor M26 is coupled to the Nth stage first pull-down node QB1(N), the first electrode of the twenty-sixth transistor M26 is coupled to the Nth stage pull-up node Q(N), and the second electrode of the twenty-sixth transistor M26 is coupled to the fourth voltage terminal VGL1.

Referring to FIGS. 23 and 20, in a driving method of the shift register circuit 10 in this embodiment, for working processes of the first input sub-circuit 101, the Mth stage output sub-circuit 102, the sensing control signal output sub-circuit 103, the Nth stage output sub-circuit 104, the shift signal output sub-circuit 105, the first reset sub-circuit 106, the Mth stage first pull-down control sub-circuit 107, the Mth stage first noise reduction sub-circuit 108, the first sensing control signal noise reduction sub-circuit 109, and the Mth stage first pull-up node noise reduction sub-circuit 110 in S31 to S37, reference is made to the above embodiments. Working processes of the Nth stage first noise reduction sub-circuit 111, the Nth stage first shift signal noise reduction sub-circuit 112 and the Nth stage first pull-up node noise reduction sub-circuit 113 in S31 to S37 are as follows.

In S31 to S33, in the first phase (P1) to the third phase (P3) of the display phase of the image frame (F) shown in FIG. 20, the description is as follows.

The Nth stage first noise reduction sub-circuit 111 is turned off in response to the invalid voltage at the Nth stage first pull-down node QB1(N).

For example, the Nth stage first noise reduction sub-circuit 111 turns off the twenty-third transistor M23 and the twenty-fourth transistor M24 in response to the low voltage at the Nth stage first pull-down node QB1(N).

The Nth stage first shift signal noise reduction sub-circuit 112 is turned off in response to the invalid voltage at the Nth stage first pull-down node QB1(N).

For example, the Nth stage first shift signal noise reduction sub-circuit 112 turns off the twenty-fifth transistor M25 in response to the low voltage at the Nth stage first pull-down node QB1(N).

The Nth stage first pull-up node noise reduction sub-circuit 113 is turned off in response to the invalid voltage at the Nth stage first pull-down node QB1(N).

For example, the Nth stage first pull-up node noise reduction sub-circuit 113 turns off the twenty-sixth transistor M26 in response to the low voltage at the Nth stage first pull-down node QB1(N).

In S34, in the fourth phase (P4) of the display phase of the image frame (F) shown in FIG. 20, the description is as follows.

The Nth stage first noise reduction sub-circuit 111 is turned on in response to the valid voltage at the Nth stage first pull-down node QB1(N), and transmits the voltage of the seventh voltage terminal VGL2 to at least one of the N stage first output terminal GO1(N) and the Nth stage second output terminal GO2(N). Therefore, noise reduction is performed on the at least one of the N stage first output terminal GO1(N) and the Nth stage second output terminal GO2(N).

For example, the Nth stage first noise reduction sub-circuit 111 turns on the twenty-third transistor M23 and the twenty-fourth transistor M24 in response to the high voltage at the Nth stage first pull-down node QB1(N), and transmits the low voltage of the seventh voltage terminal VGL2 to at least one of the N stage first output terminal GO1(N) and the Nth stage second output terminal GO2(N). At this time, the signals output from the N stage first output terminal GO1(N) and the Nth stage second output terminal GO2(N) are at the low voltage.

The Nth stage first shift signal noise reduction sub-circuit 112 is turned on in response to the valid voltage at the Nth stage first pull-down node QB1(N), and transmits the voltage of the fourth voltage terminal VGL1 to the shift signal output terminal CR(N). Therefore, noise reduction is performed on the shift signal output terminal CR(N).

For example, the Nth stage first shift signal noise reduction sub-circuit 112 turns on the twenty-fifth transistor M25 in response to the high voltage at the Nth stage first pull-down node QB1(N), and transmits the low voltage of the fourth voltage terminal VGL1 to the shift signal output terminal CR(N). At this time, the signal output from the shift signal output terminal CR(N) is at the low voltage.

The Nth stage first pull-up node noise reduction sub-circuit 113 is turned on in response to the valid voltage at the Nth stage first pull-down node QB1(N), and transmits the voltage of the fourth voltage terminal VGL1 to the Nth stage pull-up node Q(N). Therefore, noise reduction is performed on the Nth stage pull-up node Q(N).

For example, the Nth stage first pull-up node noise reduction sub-circuit 113 turns on the twenty-sixth transistor M26 in response to the high voltage at the Nth stage first pull-down node QB1(N), and transmits the voltage of the fourth voltage terminal VGL1 to the Nth stage pull-up node Q(N). At this time, the voltage of the Nth stage pull-up node Q(N) is at the low voltage.

In S35 and S36, in the fifth phase (P5) and the sixth phase (P6) of the display phase of the image frame (F) shown in FIG. 20, for working processes of the Nth stage first noise reduction sub-circuit 111, the Nth stage first shift signal noise reduction sub-circuit 112 and the Nth stage first pull-up node noise reduction sub-circuit 113, reference may be made to the description of S31 to S33 in this embodiment, and details will not be repeated here.

In S37, in the seventh phase (P7) of the display phase of the image frame (F) shown in FIG. 20, for working processes of the Nth stage first noise reduction sub-circuit 111, the Nth stage first shift signal noise reduction sub-circuit 112 and the Nth stage first pull-up node noise reduction sub-circuit 113, reference may be made to the description of S34 in this embodiment, and details will not be repeated here.

Figure 24:
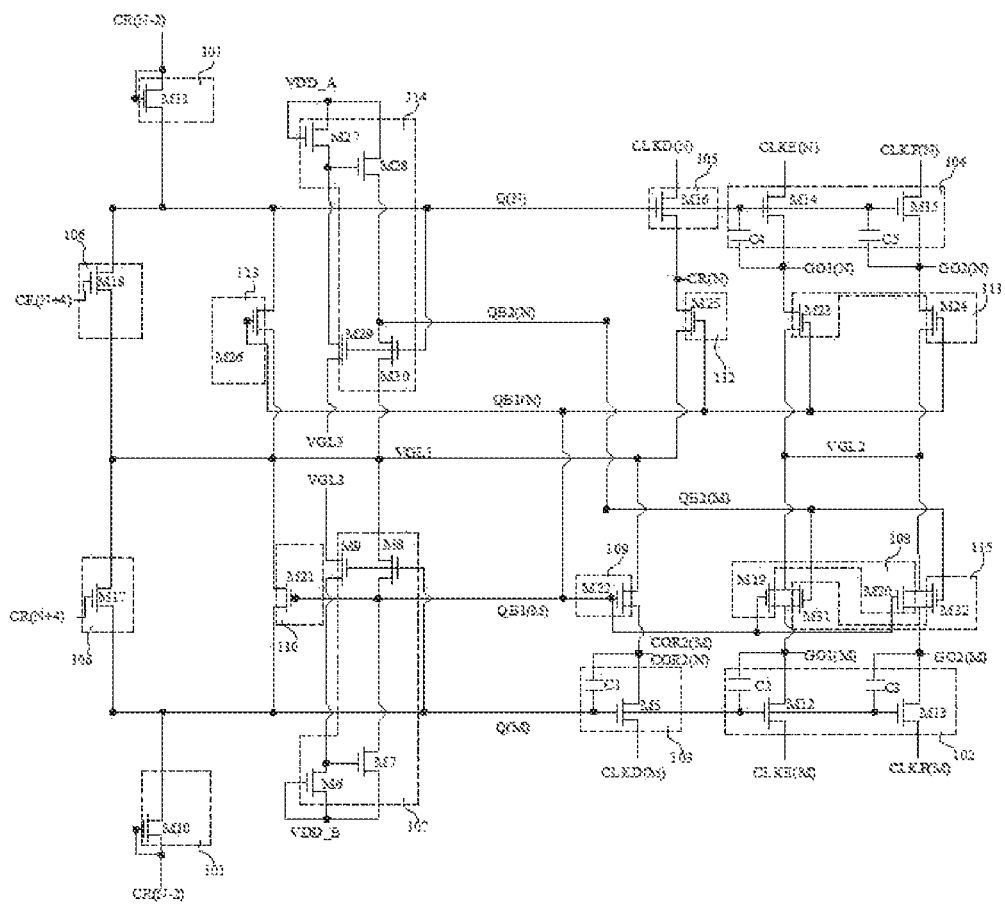
FIG. 24 is yet another replaceable structural diagram of the shift register circuit in FIG. 13.

FIG. 24 is yet another replaceable structural diagram of the shift register circuit 10. Referring to FIG. 24, in some embodiments, the shift register circuit 10 further includes an Mth stage second pull-down control sub-circuit 114 and an Mth stage second noise reduction sub-circuit 115.

The Mth stage second pull-down control sub-circuit 114 is coupled to the Nth stage pull-up node Q(N), an eighth voltage terminal VDD_A and an Mth stage second pull-down node QB2(M). The Mth stage second pull-down node QB2(M) is coupled to an Nth stage second pull-down node QB2(N). The Mth stage pull-up node Q(M) is coupled to the Nth stage pull-up node Q(N).

The Mth stage second pull-down control sub-circuit 114 is configured to, in response to the valid voltage at the Mth stage pull-up node Q(M) and the Nth stage pull-up node Q(N), transmit the voltage of the fourth voltage terminal VGL1 to the Mth stage second pull-down node QB2(M) and the Nth stage second pull-down node QB2(N), so that the Mth stage second pull-down node QB2(M) and the Nth stage second pull-down node QB2(N) are set to be at the invalid voltage.

The eighth voltage terminal VDD_A is configured to transmit a fixed-level signal (e.g., a direct current high-level voltage) during a working period of the Mth stage second pull-down control sub-circuit 114.

For example, the Mth stage second pull-down control sub-circuit 114 includes a twenty-seventh transistor M27, a twenty-eighth transistor M28, a twenty-ninth transistor M29 and a thirtieth transistor M30.

The twenty-seventh transistor M27 includes a gate, a first electrode and a second electrode. Both the gate and the first electrode of the twenty-seventh transistor M27 are coupled to the eighth voltage terminal VDD_A.

The twenty-eighth transistor M28 includes a gate, a first electrode and a second electrode. The gate of the twenty-eighth transistor M28 is coupled to the second electrode of the twenty-seventh transistor M27, the first electrode of the twenty-eighth transistor M28 is coupled to the eighth voltage terminal VDD_A, and the second electrode of the twenty-eighth transistor M28 is connected to the Nth stage second pull-down node QB2(N).

The twenty-ninth transistor M29 includes a gate, a first electrode and a second electrode. The gate of the twenty-ninth transistor M29 is coupled to the Nth stage pull-up node Q(N), the first electrode of the twenty-ninth transistor M29 is coupled to the second electrode of the twenty-seventh transistor M27 and the gate of the twenty-eighth transistor M28, and the second electrode of the twenty-ninth transistor M29 is coupled to the sixth voltage terminal VGL3.

The thirtieth transistor M30 includes a gate, a first electrode and a second electrode. The gate of the thirtieth transistor M30 is coupled to the Nth stage pull-up node Q(N), the first electrode of the thirtieth transistor M30 is coupled to the second electrode of the twenty-eighth transistor M28 and the Nth stage second pull-down node QB2(N), and the second electrode of the thirtieth transistor M30 is coupled to the fourth voltage terminal VGL1.

The Mth stage second noise reduction sub-circuit 115 is coupled to the Mth stage second pull-down node QB2(M), the seventh voltage terminal VGL2, the Mth stage first output terminal GO1(M) and the Mth stage second output terminal GO2(M).

The Mth stage second noise reduction sub-circuit 115 is configured to, in response to the valid voltage at the Mth stage second pull-down node QB2(M), transmit the voltage of the seventh voltage terminal VGL2 to at least one of the Mth stage first output terminal GO1(M) and the Mth stage second output terminal GO2(M), so that the at least one of the Mth stage first output terminal GO1(M) and the Mth stage second output terminal GO2(M) is set to be at the invalid voltage. The Mth stage second noise reduction sub-circuit 115 can perform noise reduction on the at least one of the Mth stage first output terminal GO1(M) and the Mth stage second output terminal GO2(M) during a phase where the shift register circuit 10 does not output the scan signal.

For example, the Mth stage second noise reduction sub-circuit 115 includes a thirty-first transistor M31 and a thirty-second transistor M32.

The thirty-first transistor M31 includes a gate, a first electrode and a second electrode. The gate of the thirty-first transistor M31 is coupled to the Mth stage second pull-down node QB2(M), the first electrode of the thirty-first transistor M31 is coupled to the Mth stage first output terminal GO1(M), and the second electrode of the thirty-first transistor M31 is coupled to the seventh voltage terminal VGL2.

The thirty-second transistor M32 includes a gate, a first electrode and a second electrode. The gate of the thirty-second transistor M32 is coupled to the Mth stage second pull-down node QB2(M), the first electrode of the thirty-second transistor M32 is coupled to the Mth stage second output terminal GO2(M), and the second electrode of the thirty-second transistor M32 is coupled to the seventh voltage terminal VGL2.

Figure 25:
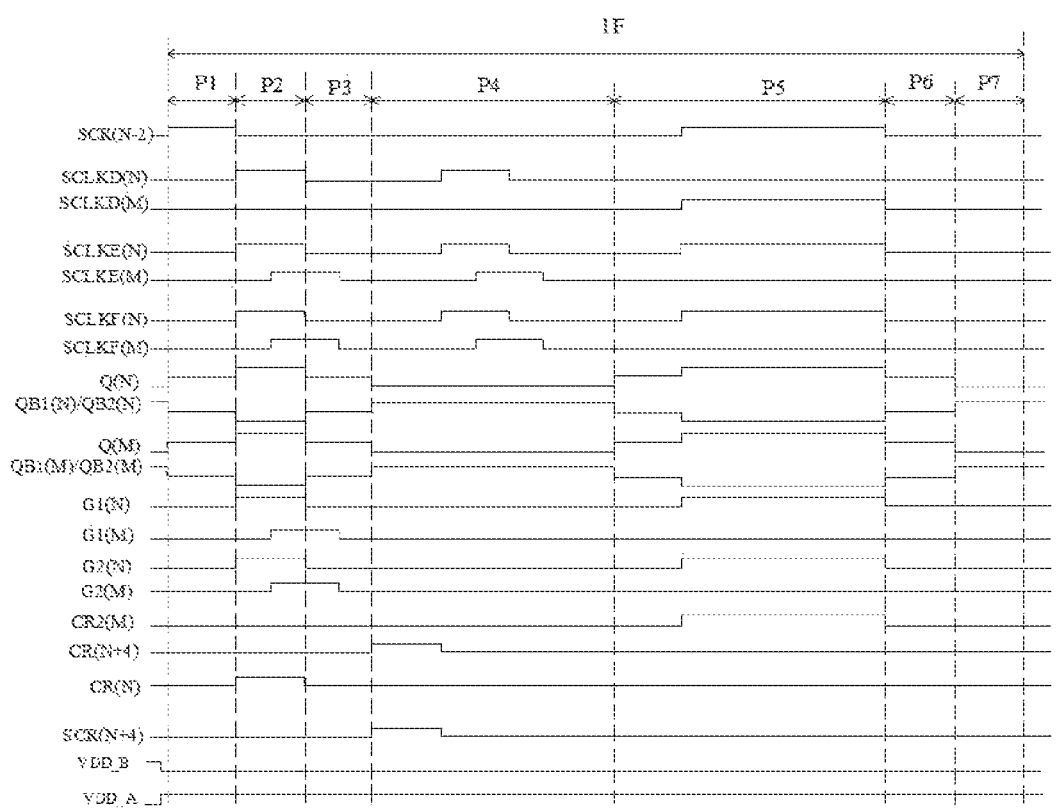
FIG. 25 is yet another replacement timing diagram of the image frame in FIG. 14.

FIG. 25 is yet another replacement timing diagram of the image frame (F) in FIG. 14. Referring to FIGS. 24 and 25, in a driving method of the shift register circuit 10 in this embodiment, for working processes of the first input sub-circuit 101, the Mth stage output sub-circuit 102, the sensing control signal output sub-circuit 103, the Nth stage output sub-circuit 104, the shift signal output sub-circuit 105, the first reset sub-circuit 106, the Mth stage first pull-down control sub-circuit 107, the Mth stage first noise reduction sub-circuit 108, the first sensing control signal noise reduction sub-circuit 109, the Mth stage first pull-up node noise reduction sub-circuit 110, the Nth stage first noise reduction sub-circuit 111, the Nth stage first shift signal noise reduction sub-circuit 112 and the Nth stage first pull-up node noise reduction sub-circuit 113 in S31 to S37, reference is made to the above embodiments. In some embodiments, in a case where the Mth stage first pull-down control sub-circuit 107 does not work, and the Mth stage second pull-down control sub-circuit 114 works, working processes of the Mth stage second pull-down control sub-circuit 114 and the Mth stage second noise reduction sub-circuit 115 in S31 to S37 are as follows.

In S31 to S33, in a first phase (P1) to a third phase (P3) of a display phase of an image frame (F) shown in FIG. 25, the Mth stage second pull-down control sub-circuit 114 transmits the voltage of the fourth voltage terminal VGL1 to the Mth stage second pull-down node QB2(M) and the Nth stage second pull-down node QB2(N) in response to the valid voltage at the Mth stage pull-up node Q(M).

For example, the Mth stage second pull-down control sub-circuit 114 turns on the twenty-ninth transistor M29 and the thirtieth transistor M30 in response to the valid voltage at the Mth stage pull-up node Q(M). The thirtieth transistor M30 transmits the voltage of the fourth voltage terminal VGL1 to the Mth stage second pull-down node QB2(M) and the Nth stage second pull-down node QB2(N). At this time, potentials of the Mth stage second pull-down node QB2(M) and the Nth stage second pull-down node QB2(N) are at the low level. The twenty-ninth transistor M29 transmits the low voltage of the sixth voltage terminal VGL3 to the gate of the twenty-eighth transistor M28, so that the twenty-eighth transistor M28 is turned off.

The Mth stage second noise reduction sub-circuit 115 is turned off in response to the invalid voltage at the Mth stage second pull-down node QB2(M).

For example, the Mth stage second noise reduction sub-circuit 115 turns off the thirty-first transistor M31 and the thirty-second transistor M32 in response to the low voltage at the Mth stage second pull-down node QB2(M).

In S34, in a fourth phase (P4) of the display phase of the image frame (F) shown in FIG. 25, the Mth stage second pull-down control sub-circuit 114 transmits the voltage of the eighth voltage terminal VDD_A to the Mth stage second pull-down node QB2(M) and the Nth stage second pull-down node QB2(N) in response to the valid voltage at the eighth voltage terminal VDD_A.

For example, when the Mth stage pull-up node Q(M) and the Nth stage pull-up node Q(N) are at the low voltage, the twenty-ninth transistor M29 and the thirtieth transistor M30 of the Mth stage second pull-down control sub-circuit 114 are turned off. In addition, the Mth stage second pull-down control sub-circuit 114 turns on the twenty-seventh transistor M27 and the twenty-eighth transistor M28 in response to the high voltage of the eighth voltage terminal VDD_A, and transmits the high voltage of the eighth voltage terminal VDD_A to the Mth stage second pull-down node QB2(M) and the Nth stage second pull-down node QB2(N). At this time, the potentials of the Mth stage second pull-down node QB2(M) and the Nth stage second pull-down node QB2(N) are high voltages.

The Mth stage second noise reduction sub-circuit 115 is turned on in response to the valid voltage at the Mth stage second pull-down node QB2(M), and transmits the voltage of the seventh voltage terminal VGL2 to at least one of the Mth stage first output terminal GO1(M) and the Mth stage second output terminal GO2(M). Therefore, noise reduction is performed on the at least one of the Mth stage first output terminal GO1(M) and the Mth stage second output terminal GO2(M).

For example, the Mth stage second noise reduction sub-circuit 115 turns on the thirty-first transistor M31 and the thirty-second transistor M32 in response to the high voltage at the Mth stage second pull-down node QB2(M), and transmits the low voltage of the seventh voltage terminal VGL2 to at least one of the Mth stage first output terminal GO1(M) and the Mth stage second output terminal GO2(M). At this time, the signals output from the Mth stage first output terminal GO1(M) and the Mth stage second output terminal GO2(M) are at the low voltage.

In S35 and S36, in a fifth phase (P5) and a sixth phase (P6) of the display phase of the image frame (F) shown in FIG. 25, for working processes of the Mth stage second pull-down control sub-circuit 114 and the Mth stage second noise reduction sub-circuit 115, reference may be made to the description of S31 to S33 in this embodiment, and details will not be repeated here.

In S37, in a seventh phase (P7) of the display phase of the image frame (F) shown in FIG. 25, for working processes of the Mth stage second pull-down control sub-circuit 114 and the Mth stage second noise reduction sub-circuit 115, reference may be made to the description of S34 in this embodiment, and details will not be repeated here.

It should be noted that, when the Mth stage pull-up node Q(M) and the Nth stage pull-up node Q(N) are at the high voltage, the Mth stage first pull-down control sub-circuit 107 works, so that the potentials of the Mth stage first pull-down node QB1(M) and the Nth stage first pull-down node QB1(N) are low voltages; alternatively, the Mth stage second pull-down control sub-circuit 114 works, so that the potentials of the Mth stage second pull-down node QB2(M) and the Nth stage second pull-down node QB2(N) are low voltages.

In addition, when the fifth voltage terminal VDD_B or the eighth voltage terminal VDD_A is at the high voltage, the Mth stage first pull-down control sub-circuit 107 works, so that the potentials of the Mth stage first pull-down node QB1(M) and the Nth stage first pull-down node QB1(N) are low voltages; alternatively, the Mth stage second pull-down control sub-circuit 114 works, so that the potentials of the Mth stage second pull-down node QB2(M) and the Nth stage second pull-down node QB2(N) are low voltages.

Figure 26:
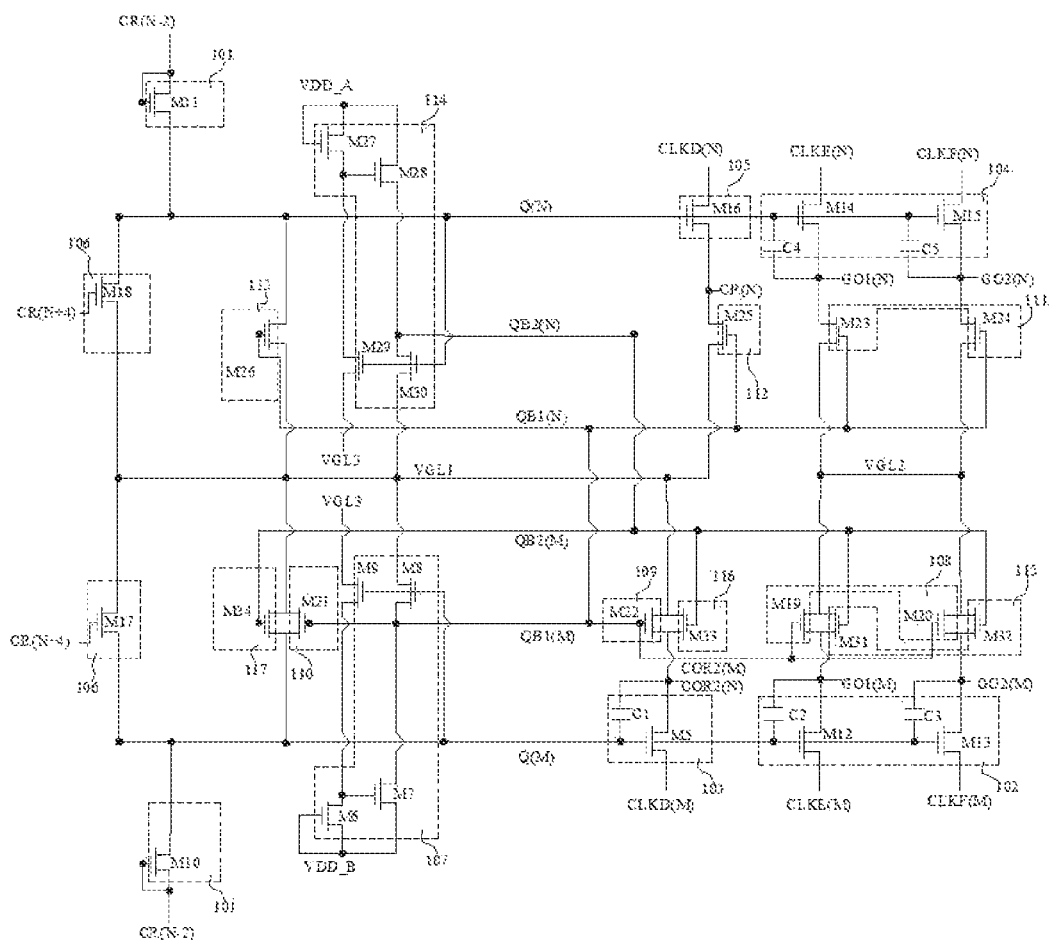
FIG. 26 is yet another replaceable structural diagram of the shift register circuit in FIG. 13.

FIG. 26 is yet another replaceable structural diagram of the shift register circuit 10. Referring to FIG. 26, in some embodiments, the shift register circuit 10 further includes at least one of a second sensing control signal noise reduction sub-circuit 116 and an Mth stage second pull-up node noise reduction sub-circuit 117.

The second sensing control signal noise reduction sub-circuit 116 is coupled to the Mth stage second pull-down node QB2(M), the fourth voltage terminal VGL1 and the sensing control signal output terminal COR2(M).

The second sensing control signal noise reduction sub-circuit 116 is configured to transmit the voltage of the fourth voltage terminal VGL1 to the sensing control signal output terminal COR2(M) in response to the Mth stage second pull-down node QB2(M) being at the valid voltage, so that the sensing control signal output terminal COR2(M) is set to be at the invalid voltage.

For example, the second sensing control signal noise reduction sub-circuit 116 includes a thirty-third transistor M33. The thirty-third transistor M33 includes a gate, a first electrode and a second electrode. The gate of the thirty-third transistor M33 is coupled to the Mth stage second pull-down node QB2(M), and the first electrode of the thirty-third transistor M33 is coupled to the sensing control signal output terminal COR2(M), and the second electrode of the thirty-third transistor M33 is coupled to the fourth voltage terminal VGL1.

The Mth stage second pull-up node noise reduction sub-circuit 117 is coupled to the Mth stage second pull-down node QB2(M), the Mth stage pull-up node Q(M) and the fourth voltage terminal VGL1.

The Mth stage second pull-up node noise reduction sub-circuit 117 is configured to transmit the voltage of the fourth voltage terminal VGL1 to the Mth stage pull-up node Q(M) in response to the valid voltage at the Mth stage second pull-down node QB2(M), so that the Mth stage pull-up node Q(M) is set to be at the invalid voltage. The Mth stage second pull-up node noise reduction sub-circuit 117 may perform noise reduction on the Mth stage pull-up node Q(M) during a phase where the shift register circuit 10 does not output the scan signal.

For example, the Mth stage second pull-up node noise reduction sub-circuit 117 includes a thirty-fourth transistor M34. The thirty-fourth transistor M34 includes a gate, a first electrode and a second electrode. The gate of the thirty-fourth transistor M34 is coupled to the Mth stage second pull-down node QB2(M), the first electrode of the thirty-fourth transistor M34 is coupled to the Mth stage pull-up node Q(M), and the second electrode of the thirty-fourth transistor M34 is coupled to the fourth voltage terminal VGL1.

Referring to FIGS. 25 and 26, in a driving method of the shift register circuit 10 in this embodiment, for working processes of the first input sub-circuit 101, the Mth stage output sub-circuit 102, the sensing control signal output sub-circuit 103, the Nth stage output sub-circuit 104, the shift signal output sub-circuit 105, the first reset sub-circuit 106, the Mth stage first pull-down control sub-circuit 107, the Mth stage first noise reduction sub-circuit 108, the first sensing control signal noise reduction sub-circuit 109, the Mth stage first pull-up node noise reduction sub-circuit 110, the Nth stage first noise reduction sub-circuit 111, the Nth stage first shift signal noise reduction sub-circuit 112, the Nth stage first pull-up node noise reduction sub-circuit 113, the Mth stage second pull-down control sub-circuit 114 and the Mth stage second noise reduction sub-circuit 115 in S31 to S37, reference is made to the above embodiments.

Working processes of the second sensing control signal noise reduction sub-circuit 116 and the Mth stage second pull-up node noise reduction sub-circuit 117 in S31 to S37 are as follows.

In S31 to S33, in the first phase (P1) to the third phase (P3) of the display phase of the image frame (F) shown in FIG. 25, the second sensing control signal noise reduction sub-circuit 116 is turned off in response to the invalid voltage at the Mth stage second pull-down node QB2(M).

For example, the second sensing control signal noise reduction sub-circuit 116 turns off the thirty-third transistor M33 in response to the low voltage at the Mth stage second pull-down node QB2(M).

The Mth stage second pull-up node noise reduction sub-circuit 117 is turned off in response to the invalid voltage at the Mth stage second pull-down node QB2(M).

For example, the Mth stage second pull-up node noise reduction sub-circuit 117 turns off the thirty-fourth transistor M34 in response to the low voltage at the Mth stage second pull-down node QB2(M).

In S34, in the fourth phase (P4) of the display phase of the image frame (F) shown in FIG. 25, the second sensing control signal noise reduction sub-circuit 116 is turned on in response to the valid voltage at the Mth stage second pull-down node QB2(M), and transmits the voltage of the fourth voltage terminal VGL1 to the sensing control signal output terminal COR2(M). Therefore, noise reduction is performed on the sensing control signal output terminal COR2(M).

For example, the second sensing control signal noise reduction sub-circuit 116 turns on the thirty-third transistor M33 in response to the high voltage at the Mth stage second pull-down node QB2(M), and transmits the low voltage of the fourth voltage terminal VGL1 to the sensing control signal output terminal COR2(M). At this time, the signal output from the sensing control signal output terminal COR2(M) is at the low voltage.

The Mth stage second pull-up node noise reduction sub-circuit 117 is turned on in response to the valid voltage at the Mth stage second pull-down node QB2(M), and transmits the voltage of the fourth voltage terminal VGL1 to the Mth stage pull-up node Q(M). Therefore, noise reduction is performed on the Mth stage pull-up node Q(M).

For example, the Mth stage second pull-up node noise reduction sub-circuit 117 turns on the thirty-fourth transistor M34 in response to the high voltage at the Mth stage second pull-down node QB2(M), and transmits the low voltage of the fourth voltage terminal VGL1 to the Mth stage pull-up node Q(M). At this time, the Mth stage pull-up node Q(M) is at the low voltage.

In S35 and S36, in the fifth phase (P5) and the sixth phase (P6) of the display phase of the image frame (F) shown in FIG. 25, for working processes of the second sensing control signal noise reduction sub-circuit 116 and the Mth stage second pull-up node noise reduction sub-circuit 117, reference may be made to the description of S31 to S33 in this embodiment, and details will not be repeated here.

In S37, in the seventh phase (P7) of the display phase of the image frame (F) shown in FIG. 25, for working processes of the second sensing control signal noise reduction sub-circuit 116 and the Mth stage second pull-up node noise reduction sub-circuit 117, reference may be made to the description of S34 in this embodiment, and details will not be repeated here.

Figure 27:
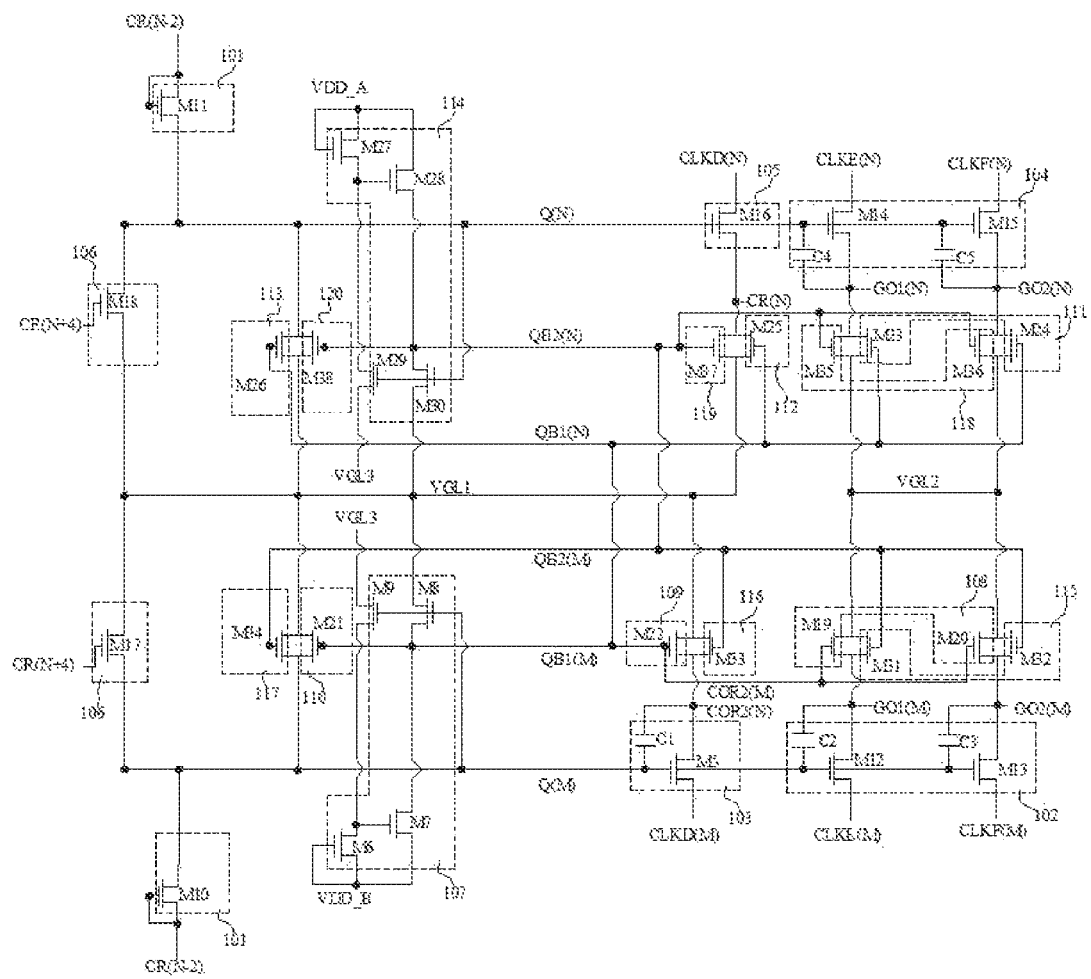
FIG. 27 is yet another replaceable structural diagram of the shift register circuit in FIG. 13.

FIG. 27 is yet another replaceable structural diagram of the shift register circuit 10. Referring to FIG. 27, in some embodiments, the shift register circuit 10 further includes at least one of an Nth stage second noise reduction sub-circuit 118, an Nth stage second shift signal noise reduction sub-circuit 119 and an Nth stage second pull-up node noise reduction sub-circuit 120.

The Nth stage second noise reduction sub-circuit 118 is coupled to the Nth stage second pull-down node QB2(N), the seventh voltage terminal VGL2, and at least one of the Nth stage first output terminal GO1(N) and the Nth stage second output terminal GO2(N). The Nth stage second pull-down node QB2(N) is coupled to the Mth stage second pull-down node QB2(M).

The Nth stage second noise reduction sub-circuit 118 is configured to transmit the voltage of the seventh voltage terminal VGL2 to at least one of the Nth stage first output terminal GO1(N) and the Nth stage second output terminal GO2(N) in response to the valid voltage at the Nth stage second pull-down node QB2(N), so that the at least one of the Nth stage first output terminal GO1(N) and the Nth stage second output terminal GO2(N) is set to be at the invalid voltage. The Nth stage second noise reduction sub-circuit 118 may perform noise reduction on the Nth stage first output terminal GO1(N) and the Nth stage second output terminal GO2(N) during a phase where the shift register circuit 10 does not output the scan signal.

For example, the Nth stage second noise reduction sub-circuit 118 includes a thirty-fifth transistor M35 and a thirty-sixth transistor M36.

The thirty-fifth transistor M35 includes a gate, a first electrode and a second electrode. The gate of the thirty-fifth transistor M35 is coupled to the Nth stage second pull-down node QB2(N), the first electrode of the thirty-fifth transistor M35 is coupled to the second electrode of the fourteenth transistor M14 and the Nth stage first output terminal GO1(N), and the second electrode of the thirty-fifth transistor M35 is coupled to the seventh voltage terminal VGL2.

The thirty-sixth transistor M36 includes a gate, a first electrode and a second electrode. The gate of the thirty-sixth transistor M36 is coupled to the Nth stage second pull-down node QB2(N), the first electrode of the thirty-sixth transistor M36 is coupled to the second electrode of the fifteenth transistor M15 and the Nth stage second output terminal GO2(N), and the second electrode of the thirty-sixth transistor M36 is coupled to the seventh voltage terminal VGL2.

The Nth stage second shift signal noise reduction sub-circuit 119 is coupled to the Nth stage second pull-down node QB2(N), the fourth voltage terminal VGL1 and the shift signal output terminal CR(N). The Nth stage second pull-down node QB2(N) is coupled to the Mth stage second pull-down node QB2(M).

The Nth stage second shift signal noise reduction sub-circuit 119 is configured to transmit the voltage of the fourth voltage terminal VGL1 to the shift signal output terminal CR(N) in response to the valid voltage at the Nth stage second pull-down node QB2(N), so that the shift signal output terminal CR(N) is set to be at the invalid voltage. The Nth stage second shift signal noise reduction sub-circuit 119 may perform noise reduction on the shift signal output terminal CR(N) during a phase where the shift register circuit 10 does not output the shift signal.

For example, the Nth stage second shift signal noise reduction sub-circuit 119 includes a thirty-seventh transistor M37. The thirty-seventh transistor M37 includes a gate, a first electrode and a second electrode. The gate of the thirty-seventh transistor M37 is coupled to the Nth stage second pull-down node QB2(N), the first electrode of the thirty-seventh transistor M37 is coupled to the second electrode of the sixteenth transistor M16 and the shift signal output terminal CR(N), and the second electrode of the thirty-seventh transistor M37 is coupled to the fourth voltage terminal VGL1.

The Nth stage second pull-up node noise reduction sub-circuit 120 is coupled to the Nth stage second pull-down node QB2(N), the fourth voltage terminal VGL1 and the Nth stage pull-up node Q(N). The Nth stage second pull-down node QB2(N) is coupled to the Mth stage second pull-down node QB2(M).

The Nth stage second pull-up node noise reduction sub-circuit 120 is configured to transmit the voltage of the fourth voltage terminal VGL1 to the Nth stage pull-up node Q(N) in response to the valid voltage at the Nth stage second pull-down node QB2(N), so that the Nth stage pull-up node Q(N) is set to be at the invalid voltage. The Nth stage second pull-up node noise reduction sub-circuit 120 may perform noise reduction on the Nth stage pull-up node Q(N) during a phase where the shift register circuit 10 does not output the scan signal.

For example, the Nth stage second pull-up node noise reduction sub-circuit 120 includes a thirty-eighth transistor M38. The thirty-eighth transistor M38 includes a gate, a first electrode and a second electrode. The gate of the thirty-eighth transistor M38 is coupled to the Nth stage second pull-down node QB2(N), the first electrode of the thirty-eighth transistor M38 is coupled to the Nth stage pull-up node Q(N), and the second electrode of the thirty-eighth transistor M38 is coupled to the fourth voltage terminal VGL1.

Referring to FIGS. 25 and 27, in a driving method of the shift register circuit 10 in this embodiment, for working processes of the first input sub-circuit 101, the Mth stage output sub-circuit 102, the sensing control signal output sub-circuit 103, the Nth stage output sub-circuit 104, the shift signal output sub-circuit 105, the first reset sub-circuit 106, the Mth stage first pull-down control sub-circuit 107, the Mth stage first noise reduction sub-circuit 108, the first sensing control signal noise reduction sub-circuit 109, the Mth stage first pull-up node noise reduction sub-circuit 110, the Nth stage first noise reduction sub-circuit 111, the Nth stage first shift signal noise reduction sub-circuit 112, the Nth stage first pull-up node noise reduction sub-circuit 113, the Mth stage second pull-down control sub-circuit 114, the Mth stage second noise reduction sub-circuit 115, the second sensing control signal noise reduction sub-circuit 116 and the Mth stage second pull-up node noise reduction sub-circuit 117 in S31 to S37, reference is made to the above embodiments. Working processes of the Nth stage second noise reduction sub-circuit 118, the Nth stage second shift signal noise reduction sub-circuit 119 and the Nth stage second pull-up node noise reduction sub-circuit 120 in S31 to S37 are as follows.

In S31 to S33, in the first phase (P1) to the third phase (P3) of the display phase of the image frame (F) shown in FIG. 25, the Nth stage second noise reduction sub-circuit 118 is turned off in response to the invalid voltage at the Nth stage second pull-down node QB2(N).

For example, the Nth stage second noise reduction sub-circuit 118 turns off the thirty-fifth transistor M35 and the thirty-sixth transistor M36 in response to the low voltage at the Nth stage second pull-down node QB2(N).

The Nth stage second shift signal noise reduction sub-circuit 119 is turned off in response to the invalid voltage at the Nth stage second pull-down node QB2(N).

For example, the Nth stage second shift signal noise reduction sub-circuit 119 turns off the thirty-seventh transistor M37 in response to the low voltage at the Nth stage second pull-down node QB2(N).

The Nth stage second pull-up node noise reduction sub-circuit 120 is turned off in response to the invalid voltage at the Nth stage second pull-down node QB2(N).

For example, the Nth stage second pull-up node noise reduction sub-circuit 120 turns off the thirty-eighth transistor M38 in response to the low voltage at the Nth stage second pull-down node QB2(N).

In S34, in the fourth phase (P4) of the display phase of the image frame (F) shown in FIG. 25, the description is as follows.

The Nth stage second noise reduction sub-circuit 118 is turned on in response to the valid voltage at the Nth stage second pull-down node QB2(N), and transmits the voltage of the seventh voltage terminal VGL2 to at least one of the Nth stage first output terminal GO1(N) and the Nth stage second output terminal GO2(N). Therefore, noise reduction is performed on the at least one of the Nth stage first output terminal GO1(N) and the Nth stage second output terminal GO2(N).

For example, the Nth stage second noise reduction sub-circuit 118 turns on the thirty-fifth transistor M35 and the thirty-sixth transistor M36 in response to the high voltage at the Nth stage second pull-down node QB2(N), and transmits the low voltage of the seventh voltage terminal VGL2 to at least one of the Nth stage first output terminal GO1(N) and the Nth stage second output terminal GO2(N). At this time, the signals output from the Nth stage first output terminal GO1(N) and the Nth stage second output terminal GO2(N) are at the low voltage.

The Nth stage second shift signal noise reduction sub-circuit 119 is turned on in response to the valid voltage at the Nth stage second pull-down node QB2(N), and transmits the voltage of the fourth voltage terminal VGL1 to the shift signal output terminal CR(N). Therefore, noise reduction is performed on the shift signal output terminal CR(N).

For example, the Nth stage second shift signal noise reduction sub-circuit 119 turns on the thirty-seventh transistor M37 in response to the high voltage at the Nth stage second pull-down node QB2(N), and transmits the low voltage of the fourth voltage terminal VGL1 to the shift signal output terminal CR(N). At this time, the signal output from the shift signal output terminal CR(N) is at the low voltage.

The Nth stage second pull-up node noise reduction sub-circuit 120 is turned on in response to the valid voltage at the Nth stage second pull-down node QB2(N), and transmits the voltage of the fourth voltage terminal VGL1 to the Nth stage pull-up node Q(N). Therefore, noise reduction is performed on the Nth stage pull-up node Q(N).

For example, the Nth stage second pull-up node noise reduction sub-circuit 120 turns on the thirty-eighth transistor M38 in response to the high voltage at the Nth stage second pull-down node QB2(N), and transmits the voltage of the fourth voltage terminal VGL1 to the Nth stage pull-up node Q(N). At this time, the Nth stage pull-up node Q(N) is at the low voltage.

In S35 and S36, in the fifth phase (P5) and the sixth phase (P6) of the display phase of the image frame (F) shown in FIG. 25, for working processes of the Nth stage second noise reduction sub-circuit 118, the Nth stage second shift signal noise reduction sub-circuit 119 and the Nth stage second pull-up node noise reduction sub-circuit 120, reference may be made to the description of S31 to S33 in this embodiment, and details will not be repeated here.

In S37, in the seventh phase (P7) of the display phase of the image frame (F) shown in FIG. 25, for working processes of the Nth stage second noise reduction sub-circuit 118, the Nth stage second shift signal noise reduction sub-circuit 119 and the Nth stage second pull-up node noise reduction sub-circuit 120, reference may be made to the description of S34 in this embodiment, and details will not be repeated here.

Figure 28:
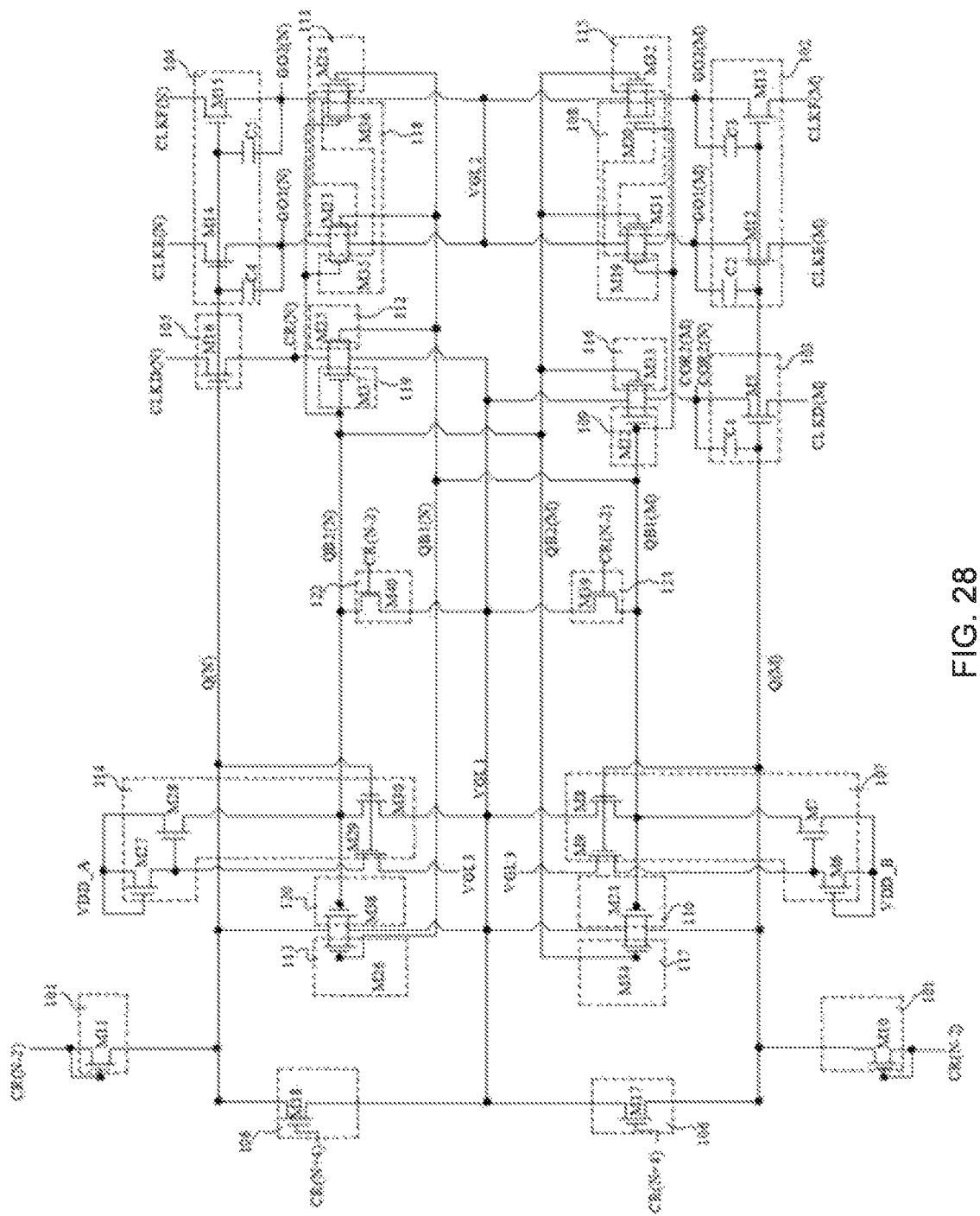
FIG. 28 is yet another replaceable structural diagram of the shift register circuit in FIG. 13.

FIG. 28 is yet another replaceable structural diagram of the shift register circuit 10. Referring to FIG. 28, in some embodiments, the shift register circuit 10 further includes at least one of a first control sub-circuit 121 and a second control sub-circuit 122.

The first control sub-circuit 121 is coupled to the first signal input terminal CR(N-2), the fourth voltage terminal VGL1, the Mth stage first pull-down node QB1(M), and the Nth stage first pull-down node QB1(N).

The first control sub-circuit 121 is configured to, in response to the first input terminal signal SCR(N-2) of the first signal input terminal CR(N-2), transmit the voltage of the fourth voltage terminal VGL1 to the Mth stage first pull-down node QB1(M) and the Nth stage first pull-down node QB1(N), so that the Mth stage first pull-down node QB1(M) and the Nth stage first pull-down node QB1(N) are set to be at the invalid voltage.

For example, the first control sub-circuit 121 includes a thirty-ninth transistor M39. The thirty-ninth transistor M39 includes a gate, a first electrode and a second electrode. The gate of the thirty-ninth transistor M39 is coupled to the first signal input terminal CR(N-2), the first electrode of the thirty-ninth transistor M39 is coupled to the Mth stage first pull-down node QB1(M) and the Nth stage first pull-down node QB1(N), and the second electrode of the thirty-ninth transistor M39 is coupled to the fourth voltage terminal VGL1.

The second control sub-circuit 122 is coupled to the first signal input terminal CR(N-2), the fourth voltage terminal VGL1, the Mth stage second pull-down node QB2(M), and the Nth stage second pull-down node QB2(N).

The second control sub-circuit 122 is configured to, in response to the first input terminal signal SCR(N-2), transmit the voltage of the fourth voltage terminal VGL1 to the Mth stage second pull-down node QB2(M) and the Nth stage second pull-down node QB2(N), so that the Mth stage second pull-down node QB2(M) and the Nth stage second pull-down node QB2(N) are set to be at the invalid voltage.

For example, the second control sub-circuit 122 includes a fortieth transistor M40. The fortieth transistor M40 includes a gate, a first electrode and a second electrode. The gate of the fortieth transistor M40 is coupled to the first signal input terminal CR(N-2), the first electrode of the fortieth transistor M40 is coupled to the Mth stage second pull-down node QB2(M) and the Nth stage second pull-down node QB2(N), and the second electrode of the fortieth transistor M40 is coupled to the fourth voltage terminal VGL1.

Referring to FIGS. 28 and 25, in a driving method of the shift register circuit 10 in this embodiment, for working processes of the first input sub-circuit 101, the Mth stage output sub-circuit 102, the sensing control signal output sub-circuit 103, the Nth stage output sub-circuit 104, the shift signal output sub-circuit 105, the first reset sub-circuit 106, the Mth stage first pull-down control sub-circuit 107, the Mth stage first noise reduction sub-circuit 108, the first sensing control signal noise reduction sub-circuit 109, the Mth stage first pull-up node noise reduction sub-circuit 110, the Nth stage first noise reduction sub-circuit 111, the Nth stage first shift signal noise reduction sub-circuit 112, the Nth stage first pull-up node noise reduction sub-circuit 113, the Mth stage second pull-down control sub-circuit 114, the Mth stage second noise reduction sub-circuit 115, the second sensing control signal noise reduction sub-circuit 116, the Mth stage second pull-up node noise reduction sub-circuit 117, the Nth stage second noise reduction sub-circuit 118, the Nth stage second shift signal noise reduction sub-circuit 119 and the Nth stage second pull-up node noise reduction sub-circuit 120 in S31 to S37, reference is made to the above embodiments. Working processes of the first control sub-circuit 121 and the second control sub-circuit 122 in S31 to S37 are as follows.

In S31, in the first phase (P1) of the display phase of the image frame (F) shown in FIG. 25, the first control sub-circuit 121 is turned on in response to the valid voltage at the first signal input terminal CR(N−2), and transmits the voltage of the fourth voltage terminal VGL1 to the Mth stage first pull-down node QB1(M) and the Nth stage first pull-down node QB1(N). Therefore, noise reduction is performed on the Mth stage first pull-down node QB1(M) and the Nth stage first pull-down node QB1(N).

For example, the first control sub-circuit 121 turns on the thirty-ninth transistor M39 in response to the high voltage at the first signal input terminal CR(N−2), and transmits the low voltage of the fourth voltage terminal VGL1 to the Mth stage first pull-down node QB1(M) and the Nth stage first pull-down node QB1(N). At this time, the Mth stage first pull-down node QB1(M) and the Nth stage first pull-down node QB1(N) are at the low voltage.

The second control sub-circuit 122 is turned on in response to the valid voltage at the first signal input terminal CR(N−2), and transmits the voltage of the fourth voltage terminal VGL1 to the Mth stage second pull-down node QB2(M) and the Nth stage second pull-down node QB2(N). Therefore, noise reduction is performed on the Mth stage second pull-down node QB2(M) and the Nth stage second pull-down node QB2(N).

For example, the second control sub-circuit 122 turns on the fortieth transistor M40 in response to the high voltage at the first signal input terminal CR(N−2), and transmits the low voltage of the fourth voltage terminal VGL1 to the Mth stage second pull-down node QB2(M) and the Nth stage second pull-down node QB2(N). At this time, the Mth stage second pull-down node QB2(M) and the Nth stage second pull-down node QB2(N) are at the low voltage.

In S32 to S37, in the second phase (P2) to the seventh phase (P7) of the display phase of the image frame (F) shown in FIG. 25, the first control sub-circuit 121 is turned off in response to the invalid voltage at the first signal input terminal CR(N−2).

For example, the first control sub-circuit 121 turns off the thirty-ninth transistor M39 in response to the low voltage at the first signal input terminal CR(N−2).

The second control sub-circuit 122 is turned off in response to the invalid voltage at the first signal input terminal CR(N−2).

For example, the second control sub-circuit 122 turns off the fortieth transistor M40 in response to the low voltage at the first signal input terminal CR(N−2).

Figure 29:
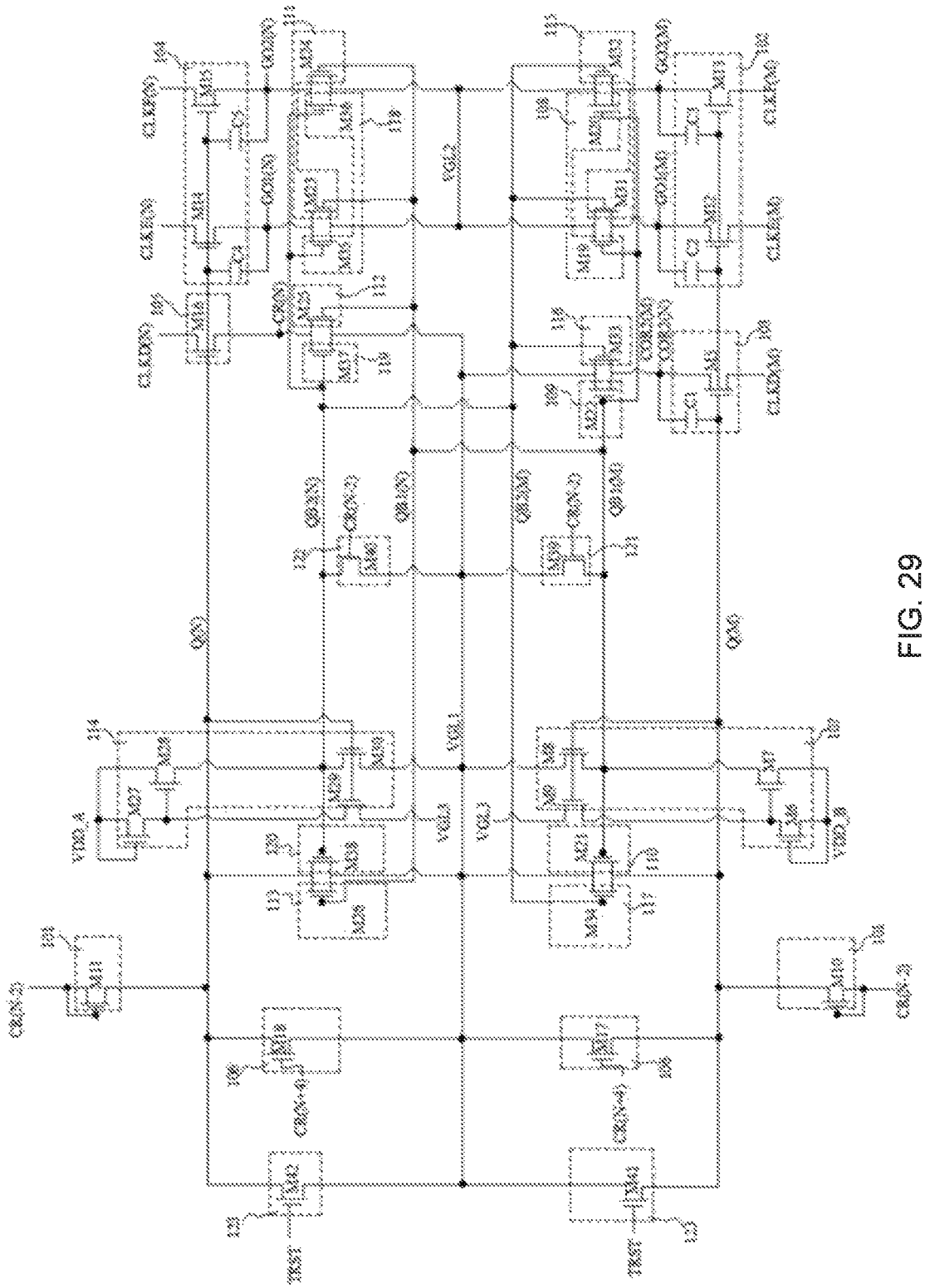
FIG. 29 is yet another replaceable structural diagram of the shift register circuit in FIG. 13.

FIG. 29 is yet another replaceable structural diagram of the shift register circuit 10. Referring to FIG. 29, in some embodiments, the shift register circuit 10 further includes a second reset sub-circuit 123.

The second reset sub-circuit 123 is coupled to a second reset input terminal TRST, the fourth voltage terminal VGL1 and the Nth stage pull-up node Q(N). The Nth stage pull-up node Q(N) is coupled to the Mth stage pull-up node Q(M).

The second reset sub-circuit 123 is configured to, in response to a second reset signal STRST of the second reset input terminal TRST, transmit the voltage of the fourth voltage terminal VGL1 to the Nth stage pull-up node Q(N) and the Mth stage pull-up node Q(M), so that Mth stage pull-up node Q(M) and the Nth stage pull-up node Q(N) are set to be at the invalid voltage.

For example, the second reset sub-circuit 123 includes at least one of a forty-first transistor M41 and a forty-second transistor M42.

The forty-first transistor M41 includes a gate, a first electrode and a second electrode. The gate of the forty-first transistor M41 is coupled to the second reset input terminal TRST, the first electrode of the forty-first transistor M41 is coupled to the Mth stage pull-up node Q(M), and the second electrode of the forty-first transistor M41 is coupled to the fourth voltage terminal VGL1.

The forty-second transistor M42 includes a gate, a first electrode and a second electrode; the gate of the forty-second transistor M42 is coupled to the second reset input terminal TRST, the first electrode of the forty-second transistor M42 is coupled to the Nth stage pull-up node Q(N), and the second electrode of the forty-second transistor M42 is coupled to the fourth voltage terminal VGL1.

Figure 30:
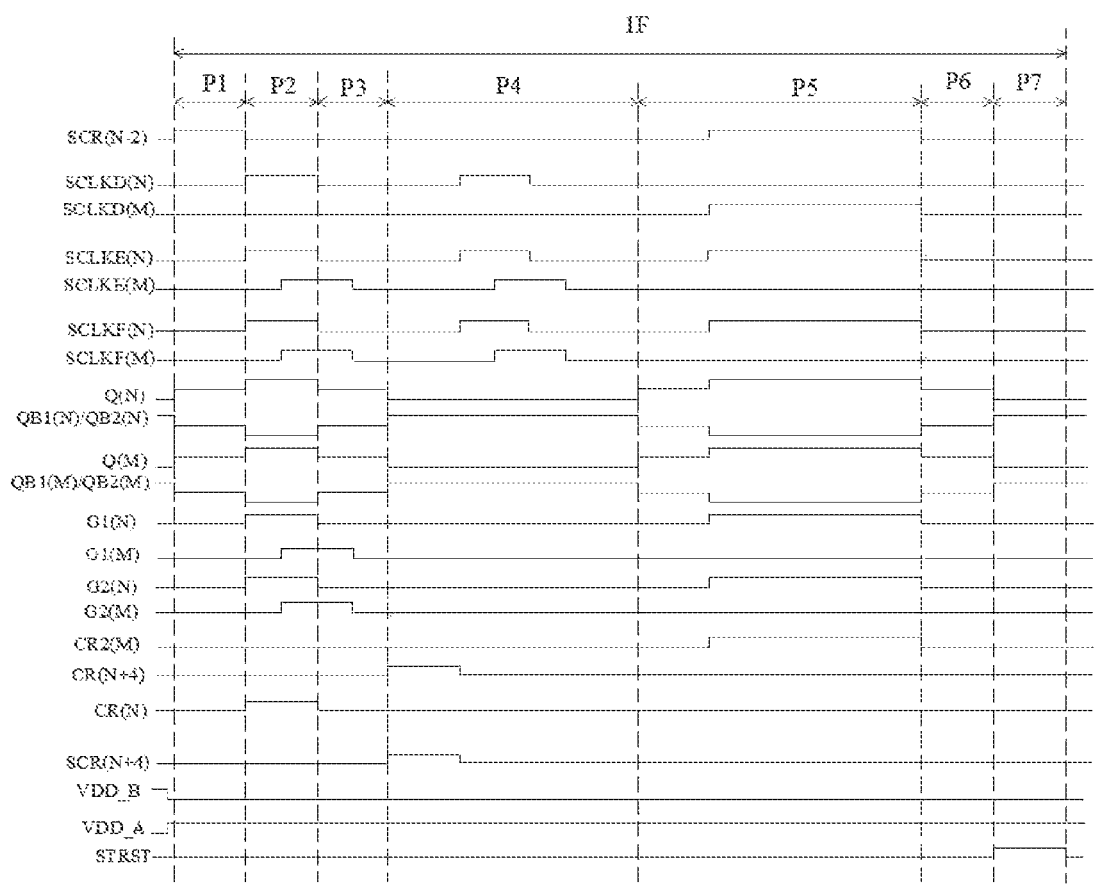
FIG. 30 is yet another replacement timing diagram of the image frame in FIG. 14.

FIG. 30 is yet another replacement timing diagram of the image frame (F) in FIG. 14. Referring to FIGS. 29 and 30, in a driving method of the shift register circuit 10 in this embodiment, for working processes of the first input sub-circuit 101, the Mth stage output sub-circuit 102, the sensing control signal output sub-circuit 103, the Nth stage output sub-circuit 104, the shift signal output sub-circuit 105, the first reset sub-circuit 106, the Mth stage first pull-down control sub-circuit 107, the Mth stage first noise reduction sub-circuit 108, the first sensing control signal noise reduction sub-circuit 109, the Mth stage first pull-up node noise reduction sub-circuit 110, the Nth stage first noise reduction sub-circuit 111, the Nth stage first shift signal noise reduction sub-circuit 112, the Nth stage first pull-up node noise reduction sub-circuit 113, the Mth stage second pull-down control sub-circuit 114, the Mth stage second noise reduction sub-circuit 115, the second sensing control signal noise reduction sub-circuit 116, the Mth stage second pull-up node noise reduction sub-circuit 117, the Nth stage second noise reduction sub-circuit 118, the Nth stage second shift signal noise reduction sub-circuit 119, the Nth stage second pull-up node noise reduction sub-circuit 120, the first control sub-circuit 121 and the second control sub-circuit 122 in S31 to S37, reference is made to the above embodiments. A working process of the second reset sub-circuit 123 in S31 to S37 is as follows.

In S31 to S36, in a first phase (P1) to a sixth phase (P6) of a display phase of an image frame (F) shown in FIG. 30, the description is as follows.

The second reset sub-circuit 123 is turned off in response to the invalid voltage of the second reset signal STRST of the second reset input terminal TRST, and no signal is output from the second reset sub-circuit 123.

For example, the second reset sub-circuit 123 turns off the forty-first transistor M41 and the forty-second transistor M42 in response to the low voltage of the second reset signal STRST. In this case, no signal is output from the twenty-first transistor M21 and the twenty-second transistor M22.

In S37, in a seventh phase (P7) of the display phase of the image frame (F) shown in FIG. 30, the second reset sub-circuit 123 is turned on in response to the valid voltage of the second reset signal STRST, and transmits the voltage of the fourth voltage terminal VGL1 to the Nth stage pull-up node Q(N) and the Mth stage pull-up node Q(M). Thus, potentials of the Mth stage pull-up node Q(M) and the Nth stage pull-up node Q(N) are reset.

For example, the second reset sub-circuit 123 turns on at least one of the forty-first transistor M41 and the forty-second transistor M42 in response to the high voltage of the second reset signal STRST, and transmits the low voltage of the fourth voltage terminal VGL1 to the Nth stage pull-up node Q(N) and the Mth stage pull-up node Q(M). At this time, the potentials of the Nth stage pull-up node Q(N) and the Mth stage pull-up node Q(M) are at the low level.

Figure 31:
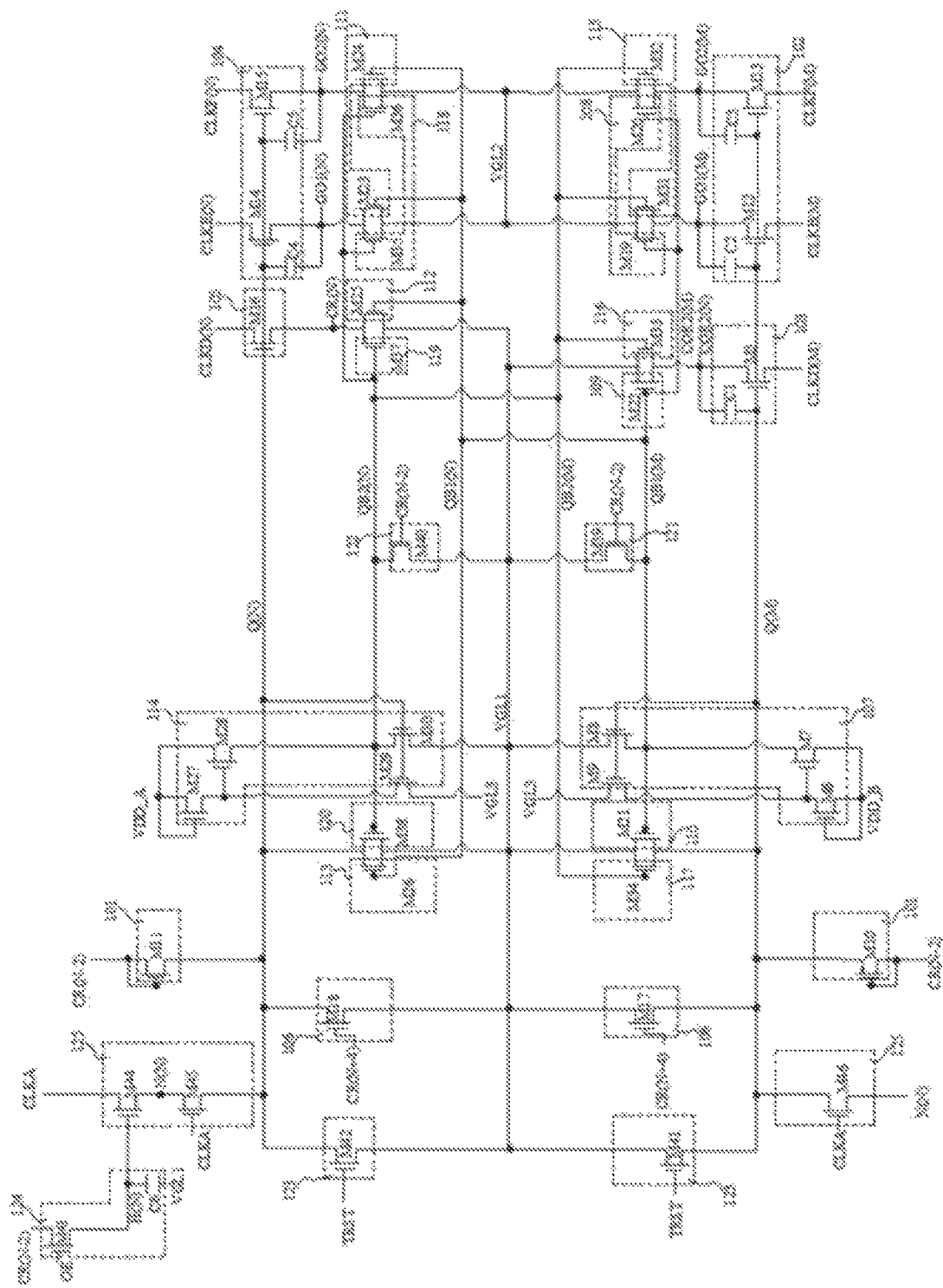
FIG. 31 is yet another replaceable structural diagram of the shift register circuit in FIG. 13.

FIG. 31 is yet another replaceable structural diagram of the shift register circuit 10. Referring to FIG. 31, in some embodiments, the shift register circuit 10 further includes a selection sub-circuit 124 and a second input sub-circuit 125.

The selection sub-circuit 124 is coupled to a control signal terminal OE, the first signal input terminal CR(N−2), and a first node H(N).

The selection sub-circuit 124 is configured to transmit the first input terminal signal SCR(N−2) of the first signal input terminal CR(N−2) to the first node H(N) in response to a control signal SOE of the control signal terminal OE, and maintain a voltage of the first node H(N).

For example, the selection sub-circuit 124 includes a forty-third transistor M43 and a sixth capacitor C6.

The forty-third transistor M43 includes a gate, a first electrode and a second electrode. The gate of the forty-third transistor M43 is coupled to the control signal terminal OE, the first electrode of the forty-third transistor M43 is coupled to the first signal input terminal CR(N−2), and the second electrode of the forty-third transistor M43 is coupled to the first node H(N).

The sixth capacitor C6 includes a first end and a second end. The first end of the sixth capacitor C6 is coupled to the fourth voltage terminal VGL1, and the second end of the sixth capacitor C6 is coupled to the first node H(N) and the second electrode of the forty-third transistor M43.

The second input sub-circuit 125 is coupled to the first node H(N), a fourth clock signal terminal CLKA, the Nth stage pull-up node Q(N) and the Mth stage pull-up node Q(M).

The second input sub-circuit 125 is configured to, in response to the voltage of the first node H(N) and the valid voltage of the fourth clock signal SCLKA of the fourth clock signal terminal CLKA, transmit the voltage of the fourth clock signal SCLKA to the Nth stage pull-up node Q(N) and the Mth stage pull-up node Q(M), so that the Nth stage pull-up node Q(N) and the Mth stage pull-up node Q(M) are set to be at the valid voltage.

For example, the second input sub-circuit 125 includes a forty-fourth transistor M44 and at least one of a forty-fifth transistor M45 and a forty-sixth transistor M46. In a case where the second input sub-circuit 125 includes the forty-fifth transistor M45 or the forty-sixth transistor M46, the Nth stage pull-up node Q(N) is coupled to the Mth stage pull-up node Q(M).

The forty-fourth transistor M44 includes a gate, a first electrode and a second electrode. The gate of the forty-fourth transistor M44 is coupled to the first node H(N) and the second electrode of the forty-third transistor M43, the first electrode of the forty-fourth transistor M44 is coupled to the fourth clock signal terminal CLKA, and the second electrode of the forty-fourth transistor M44 is coupled to a second node N(N).

The forty-fifth transistor M45 includes a gate, a first electrode and a second electrode. The gate of the forty-fifth transistor M45 is coupled to the fourth clock signal terminal CLKA, the first electrode of the forty-fifth transistor M45 is coupled to the second electrode of the forty-fourth transistor M44 and the second node N(N), and the second electrode of the forty-fifth transistor M45 is coupled to the Nth stage pull-up node Q(N).

The forty-sixth transistor M46 includes a gate, a first electrode and a second electrode. The gate of the forty-sixth transistor M46 is coupled to the fourth clock signal terminal CLKA, the first electrode of the forty-sixth transistor M46 is coupled to the second node N(N), and the second electrode of the forty-sixth transistor M46 is coupled to the Mth stage pull-up node Q(N).

Figure 32:
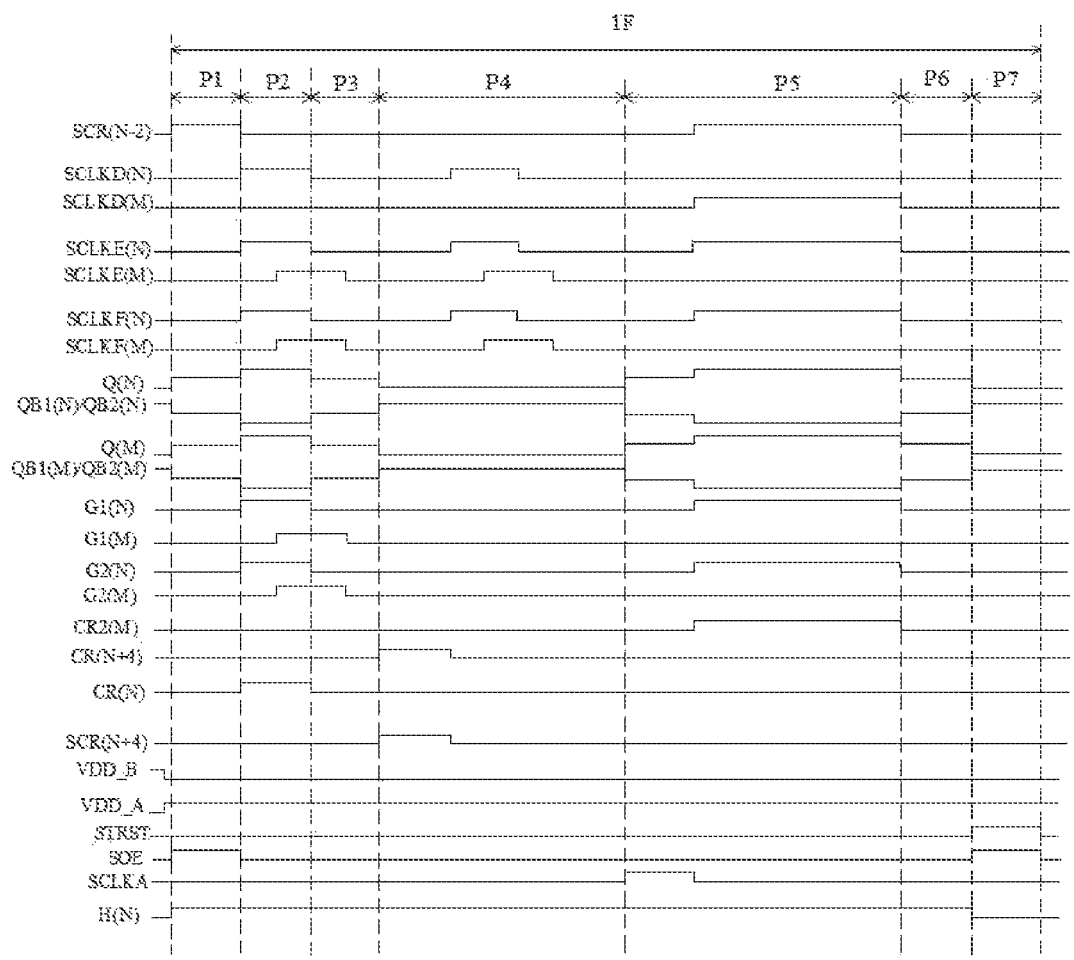
FIG. 32 is yet another replacement timing diagram of the image frame in FIG. 14.

FIG. 32 is yet another replacement timing diagram of the image frame (F) in FIG. 14. Referring to FIGS. 31 and 32, in a driving method of the shift register circuit 10 in this embodiment, for working processes of the first input sub-circuit 101, the Mth stage output sub-circuit 102, the sensing control signal output sub-circuit 103, the Nth stage output sub-circuit 104, the shift signal output sub-circuit 105, the first reset sub-circuit 106, the Mth stage first pull-down control sub-circuit 107, the Mth stage first noise reduction sub-circuit 108, the first sensing control signal noise reduction sub-circuit 109, the Mth stage first pull-up node noise reduction sub-circuit 110, the Nth stage first noise reduction sub-circuit 111, the Nth stage first shift signal noise reduction sub-circuit 112, the Nth stage first pull-up node noise reduction sub-circuit 113, the Mth stage second pull-down control sub-circuit 114, the Mth stage second noise reduction sub-circuit 115, the second sensing control signal noise reduction sub-circuit 116, the Mth stage second pull-up node noise reduction sub-circuit 117, the Nth stage second noise reduction sub-circuit 118, the Nth stage second shift signal noise reduction sub-circuit 119, the Nth stage second pull-up node noise reduction sub-circuit 120, the first control sub-circuit 121, the second control sub-circuit 122, and the second reset sub-circuit 123 in S31 to S37, reference is made to the above embodiments. Working processes of the selection sub-circuit 124 and the second input sub-circuit 125 in S31 to S37 are as follows.

In S31 to S34, in a first phase (P1) to a fourth phase (P4) of a display phase of an image frame (F) shown in FIG. 32, the selection sub-circuit 124 is turned on in response to the valid voltage of the control signal SOE of the control signal terminal OE, transmits the first input terminal signal SCR (N−2) of the first signal input terminal CR(N−2) to the first node H(N), and maintain the voltage of the first node H(N).

For example, the selection sub-circuit 124 turns on the forty-third transistor M43 in response to the high voltage of the control signal SOE of the control signal terminal OE, and transmits the high voltage of the first input terminal signal SCR(N−2) to the first node H(N). At this time, the first node H(N) is at the high voltage. The sixth capacitor C6 stores the high voltage of the first input terminal signal SCR(N−2).

It should be noted that, the sixth capacitor C6 may store the signal from the first input terminal signal SCR(N−2) and maintain it until the end of the display phase of the image frame, so as to be used in the blanking phase.

The second input sub-circuit 125 is turned off in response to the invalid voltage of the fourth clock signal SCLKA of the fourth clock signal terminal CLKA.

For example, the second input sub-circuit 125 turns on the forty-fourth transistor M44 in response to the high voltage at the first node H(N), and transmits the fourth clock signal SCLKA to the second node N(N). In addition, the second input sub-circuit 125 turns off the forty-fifth transistor M45 and the forty-sixth transistor M46 in response to the low voltage of the fourth clock signal SCLKA of the fourth clock signal terminal CLKA. Therefore, the fourth clock signal SCLKA is not transmitted to the Nth stage pull-up node Q(N) and the Mth stage pull-up node Q(M).

In S35, at beginning of a fifth phase (P5) of the display phase of the image frame (F) shown in FIG. 32, the second input sub-circuit 125 is turned on in response to the valid voltage at the first node H(N) and the valid voltage of the fourth clock signal SCLKA of the fourth clock signal terminal CLKA, and transmits the voltage of the fourth clock signal SCLKA to the Nth stage pull-up node Q(N) and the Mth stage pull-up node Q(M).

For example, the second input sub-circuit 125 turns on the forty-fourth transistor M44, the forty-fifth transistor M45 and the forty-sixth transistor M46 in response to the high voltage of the first node H(N) and the high voltage of the fourth clock signal SCLKA, and transmits the high voltage of the fourth clock signal SCLKA to the Nth stage pull-up node Q(N) and the Mth stage pull-up node Q(M). At this time, the Nth stage pull-up node Q(N) and the Mth stage pull-up node Q(M) are at the high voltage, and the first capacitor C1, the second capacitor C2, the third capacitor C3, the fourth capacitor C4 and the fifth capacitor C5 are charged. In addition, the signal output from the Nth stage first output terminal GO1(N) is pulled up by the Nth stage first clock signal SCLKE(N), the signal output from the Nth stage second output terminal GO2(N) is pulled up by the Nth stage second clock signal SCLKF(N), the Mth stage first output terminal GO1(M) outputs the low voltage of the Mth stage first clock signal SCLKE(M), the Mth stage second output terminal GO2(M) outputs the low voltage of the Mth stage second clock signal SCLKF(M), the shift signal output terminal CR(N) output the low voltage of the Nth stage third clock signal SCLKD(N), and the signal output from the sensing control signal output terminal COR2(M) is pulled up by the Mth stage third clock signal SCLKD(M).

Then the signal of the fourth clock signal SCLKA is not transmitted to the Nth stage pull-up node Q(N) and the Mth stage pull-up node Q(M). At this time, potentials of the Nth stage pull-up node Q(N) and the Mth stage pull-up node Q(M) are in a floating state, and the potentials of the Nth stage pull-up node Q(N) and the Mth stage pull-up node Q(M) maintain the high voltage of the previous stage. Moreover, due to the bootstrapping effect of the first capacitor C1, the second capacitor C2, the third capacitor C3, the fourth capacitor C4 and the fifth capacitor C5, the potentials of the Nth stage pull-up node Q(N) and the Mth stage pull-up node Q(M) are pulled up to a higher potential. In this case, the Mth stage output sub-circuit 102, the sensing control signal output sub-circuit 103, the Nth stage output sub-circuit 104, and the shift signal output sub-circuit 105 are all turned on and output respective signals.

After that, due to the bootstrapping effect of the first capacitor C1, the second capacitor C2, the third capacitor C3, the fourth capacitor C4 and the fifth capacitor C5, the potentials of the Nth stage pull-up node Q(N) and the Mth stage pull-up node Q(M) decrease but still maintain a high voltage, the Mth stage output sub-circuit 102, the sensing control signal output sub-circuit 103, the Nth stage output sub-circuit 104, and the shift signal output sub-circuit 105 continue to be turned on, and output respective signals.

In S36 to S37, in a sixth phase (P6) to a seventh phase (P7) of the display phase of the image frame (F) shown in FIG. 32, for a working process of the second input sub-circuit 125, reference may be made to the description of S31 to S34 in this embodiment, and details will not be repeated here.

It should be noted that, in the first phase to the fourth phase described above, the fourth clock signal SCLKA is always maintained at the low level, and the forty-fifth transistor M45 and the forty-sixth transistor M46 are in the off state, thereby isolating the first node H(N) from the Nth stage pull up node Q(N) and the Mth stage pull up node Q(M), and preventing the voltage of the first node H(N) from affecting the output signal during the display phase.

Figure 33:
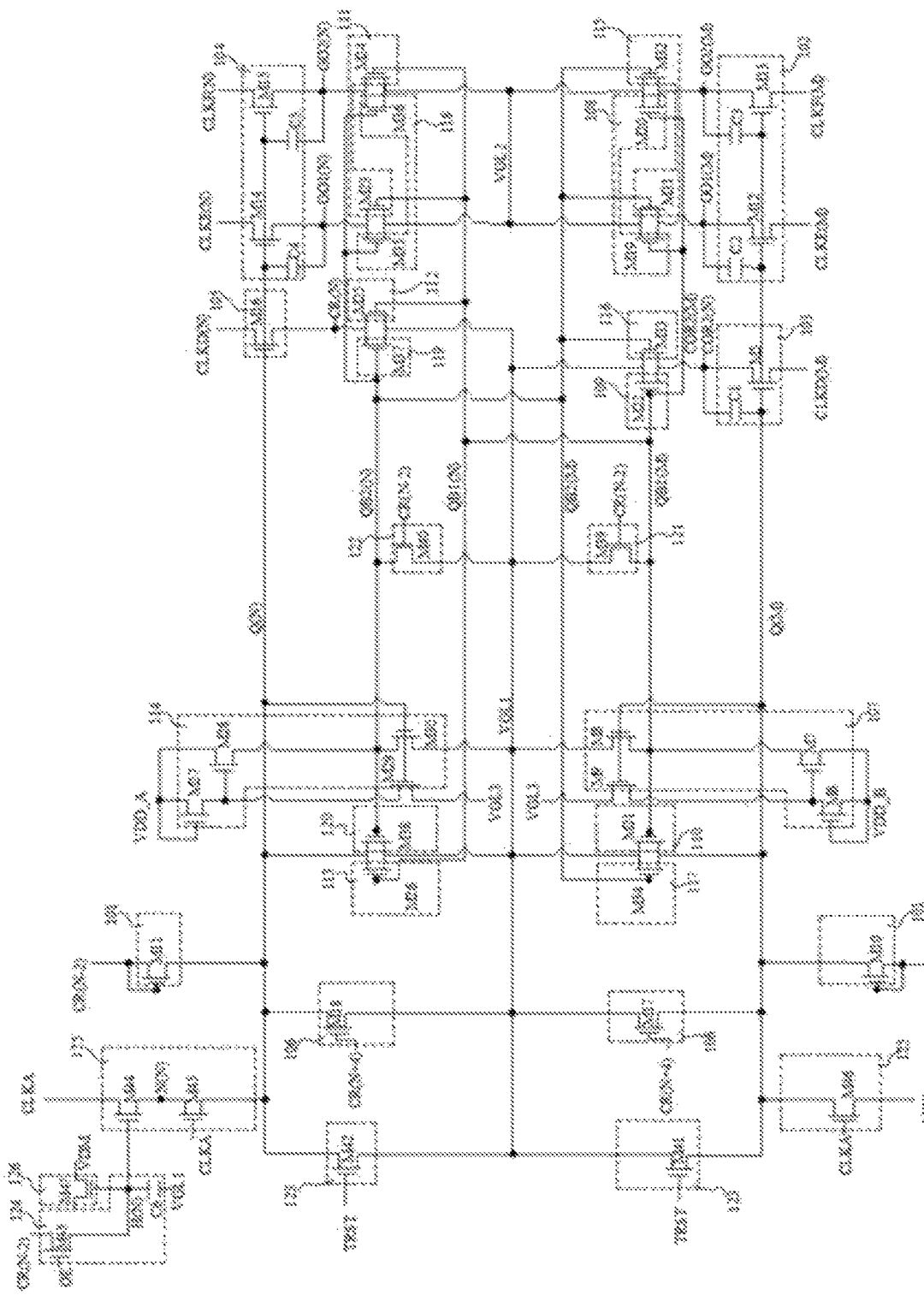
FIG. 33 is yet another replaceable structural diagram of the shift register circuit in FIG. 13.

FIG. 33 is yet another replaceable structural diagram of the shift register circuit 10. Referring to FIG. 33, in some embodiments, the shift register circuit 10 further includes a first potential raising sub-circuit 126.

The first potential raising sub-circuit 126 is coupled to a ninth voltage terminal VDM, the first node H(N) and the selection sub-circuit 124.

The first potential raising sub-circuit 126 is configured to transmit a voltage of the ninth voltage terminal VDM to the selection sub-circuit 124 in response to the voltage of the first node H(N). The first potential raising sub-circuit 126 may reduce the leakage current of the transistor in the first potential raising sub-circuit 126.

It should be noted that the ninth voltage terminal VDM is configured to transmit a fixed-level signal, e.g., a direct current high-level signal.

The two shift register sub-circuits 10_a and 10_b in this embodiment share one first potential raising sub-circuit 126, which reduces wiring and costs.

For example, the first potential raising sub-circuit 126 includes a forty-seventh transistor M47. The forty-seventh transistor M47 includes a gate, a first electrode and a second electrode; in the forty-seventh transistor M47, the gate is coupled to the first node H(N), the first electrode is coupled to the ninth voltage terminal VDM, and the second electrode is coupled to the forty-third transistor M43.

Figure 34:
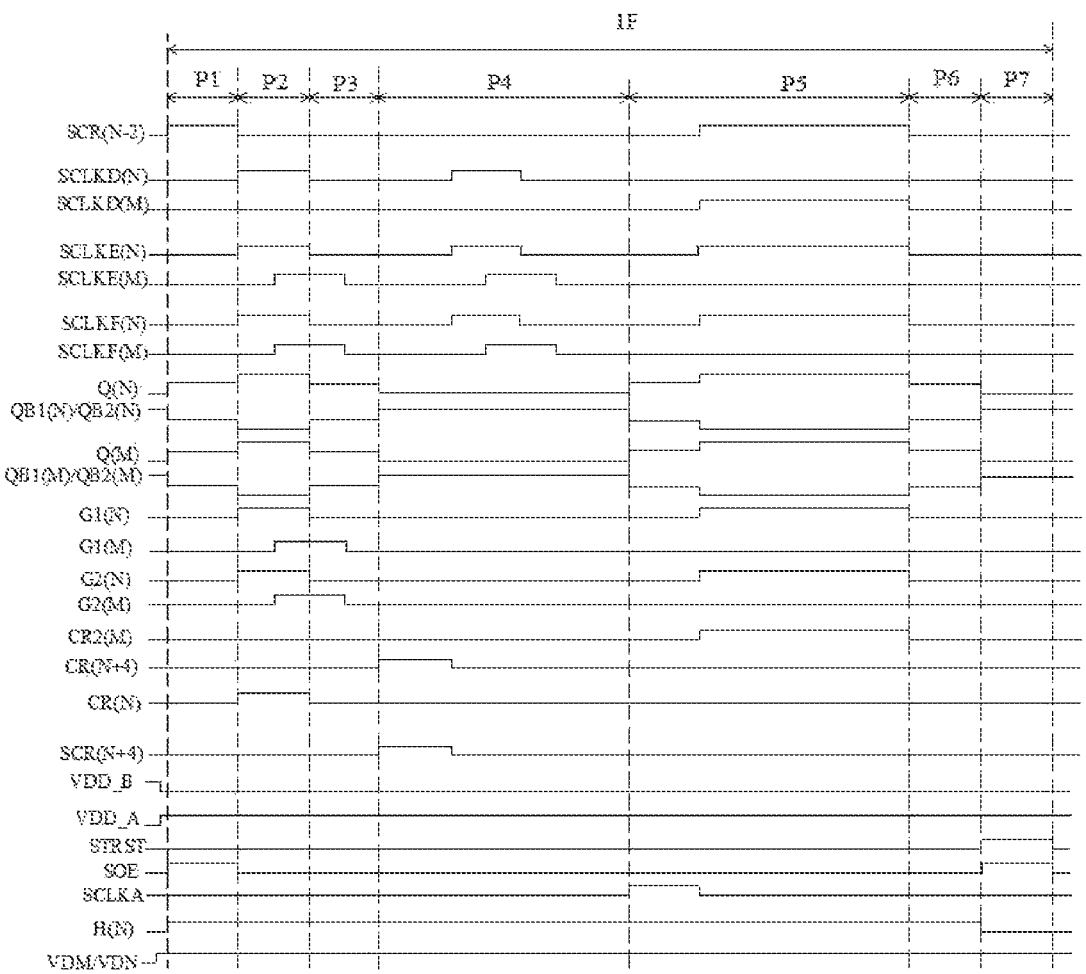
FIG. 34 is yet another replacement timing diagram of the image frame in FIG. 14.

FIG. 34 is yet another replacement timing diagram of the image frame (F) in FIG. 14. Referring to FIGS. 33 and 34, in a driving method of the shift register circuit 10 in this embodiment, for working processes of the first input sub-circuit 101, the Mth stage output sub-circuit 102, the sensing control signal output sub-circuit 103, the Nth stage output sub-circuit 104, the shift signal output sub-circuit 105, the first reset sub-circuit 106, the Mth stage first pull-down control sub-circuit 107, the Mth stage first noise reduction sub-circuit 108, the first sensing control signal noise reduction sub-circuit 109, the Mth stage first pull-up node noise reduction sub-circuit 110, the Nth stage first noise reduction sub-circuit 111, the Nth stage first shift signal noise reduction sub-circuit 112, the Nth stage first pull-up node noise reduction sub-circuit 113, the Mth stage second pull-down control sub-circuit 114, the Mth stage second noise reduction sub-circuit 115, the second sensing control signal noise reduction sub-circuit 116, the Mth stage second pull-up node noise reduction sub-circuit 117, the Nth stage second noise reduction sub-circuit 118, the Nth stage second shift signal noise reduction sub-circuit 119, the Nth stage second pull-up node noise reduction sub-circuit 120, the first control sub-circuit 121, the second control sub-circuit 122, the second reset sub-circuit 123, the selection sub-circuit 124, and the second input sub-circuit 125 in S31 to S37, reference is made to the above embodiments. A working process of the first potential raising sub-circuit 126 in S31 to S37 is as follows.

In S31 to S36, in a first phase (P1) to a sixth phase (P6) of a display phase of an image frame (F) shown in FIG. 34, the first potential raising sub-circuit 126 is turned on in response to the valid voltage of the first node H(N), and transmits the voltage of the ninth voltage terminal VDM to the selection sub-circuit 124.

For example, the first potential raising sub-circuit 126 turns on the forty-seventh transistor M47 in response to the high voltage of the first node H(N), and transmits the voltage of the ninth voltage terminal VDM to the selection sub-circuit 124.

In S37, in a seventh phase (P7) of the display phase of the image frame (F) shown in FIG. 34, the first potential raising sub-circuit 126 is turned off in response to the invalid voltage of the first node H(N). Therefore, a signal cannot be output to the selection sub-circuit 124.

For example, the first potential raising sub-circuit 126 turns off the forty-seventh transistor M47 in response to the low voltage of the first node H(N).

Figure 35:
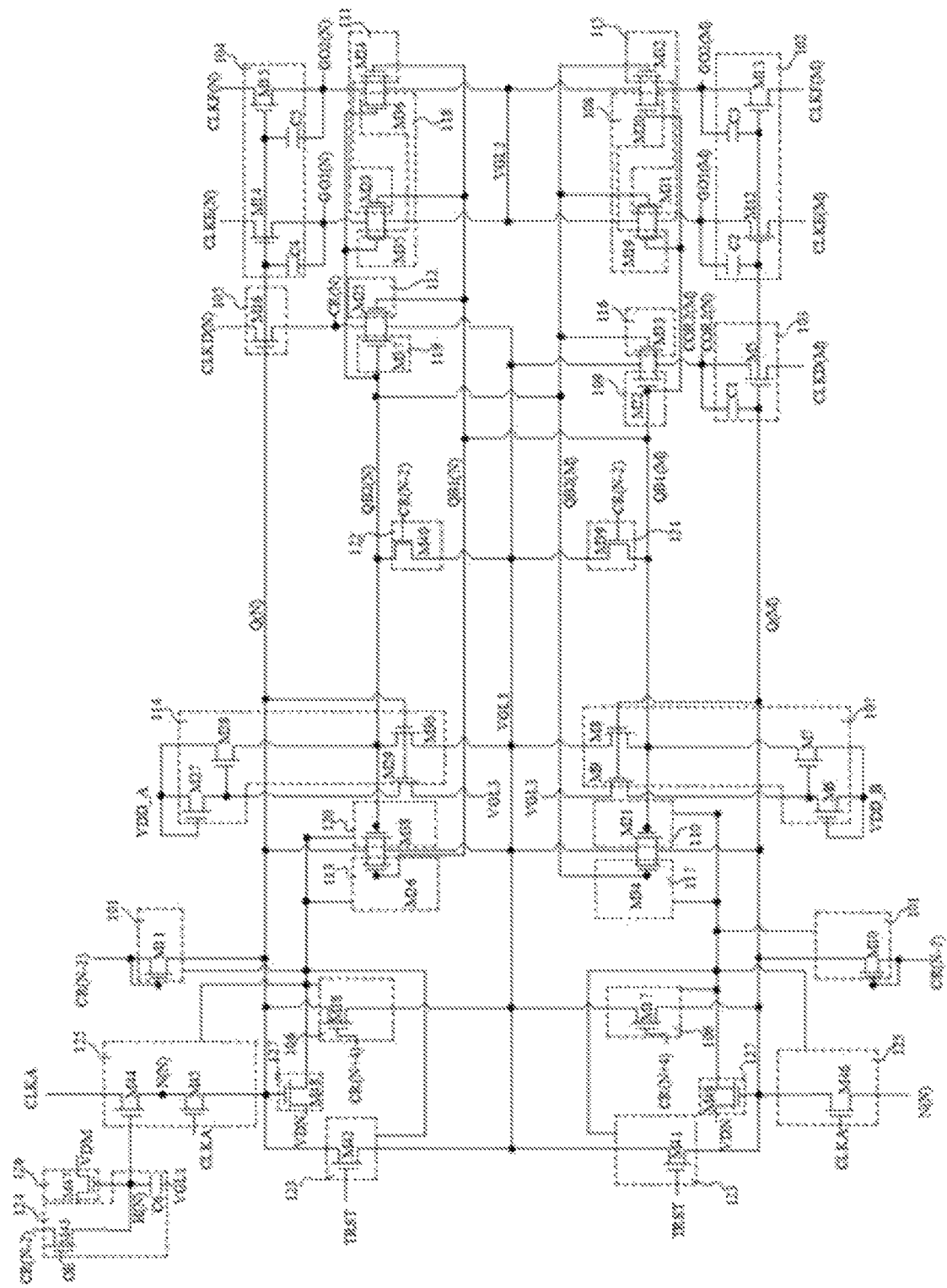
FIG. 35 is yet another replaceable structural diagram of the shift register circuit in FIG. 13.

FIG. 35 is yet another replaceable structural diagram of the shift register circuit 10. Referring to FIG. 35, in some embodiments, the shift register circuit 10 further includes a second potential raising sub-circuit 127.

The second potential raising sub-circuit 127 is coupled to a tenth voltage terminal VDN, the Mth stage pull-up node Q(M), and at least one of the first input sub-circuit 101, the second input sub-circuit 125, the first reset sub-circuit 106 and the second reset sub-circuit 123.

In a case where the shift register circuit further includes the second input sub-circuit 125, the first reset sub-circuit 106 and the second reset sub-circuit 123, the second potential raising sub-circuit 127 is configured to, in response to the valid voltage of the Mth stage pull-up node Q(M), transmit a voltage of the tenth voltage terminal VDN to at least one of the first input sub-circuit 101, the second input sub-circuit 125, the first reset sub-circuit 106, the second reset sub-circuit 123, the Nth stage first pull-up node noise reduction sub-circuit 113, the Nth stage second pull-up node noise reduction sub-circuit 120, the Mth stage second pull-up node noise reduction sub-circuit 117, and the Mth stage first pull-up node noise reduction sub-circuit 110. The second potential raising sub-circuit 127 may reduce the leakage currents of transistors in the first input sub-circuit 101, the second input sub-circuit 125, the first reset sub-circuit 106, the second reset sub-circuit 123, the Nth stage first pull-up node noise reduction sub-circuit 113, the Nth stage second pull-up node noise reduction sub-circuit 120, the Mth stage second pull-up node noise reduction sub-circuit 117 and the Mth stage first pull-up node noise reduction sub-circuit 110 coupled thereto.

It should be noted that the tenth voltage terminal VDN may be the same voltage terminal as the ninth voltage terminal VDM.

It should be noted that the tenth voltage terminal VDN is configured to transmit a fixed-level signal, e.g., a direct current high-level signal.

For example, the second potential raising sub-circuit 127 includes at least one of a forty-eighth transistor M48 and a forty-ninth transistor M49.

The forty-eighth transistor M48 includes a gate, a first electrode and a second electrode. The gate of the forty-eighth transistor M48 is coupled to the Nth stage pull-up node Q(N), the first electrode of the forty-eighth transistor M48 is coupled to the tenth voltage terminal VDN, and the second electrode of the forty-eighth transistor M48 is coupled to the forty-second transistor M42, the eighteenth transistor M18 and the forty-fifth transistor M45.

The forty-ninth transistor M49 includes a gate, a first electrode and a second electrode. The gate of the forty-ninth transistor M49 is coupled to the Mth stage pull-up node Q(M), the first electrode of the forty-ninth transistor M49 is coupled to the tenth voltage terminal VDN, the second electrode of the forty-ninth transistor M49 is coupled to the forty-sixth transistor M46, the seventeenth transistor M17 and the tenth transistor M10.

FIG. 34 is yet another replacement timing diagram of the image frame (F) in FIG. 14. Referring to FIGS. 35 and 34, in a driving method of the shift register circuit 10 in this embodiment, for working processes of the first input sub-circuit 101, the Mth stage output sub-circuit 102, the sensing control signal output sub-circuit 103, the Nth stage output sub-circuit 104, the shift signal output sub-circuit 105, the first reset sub-circuit 106, the Mth stage first pull-down control sub-circuit 107, the Mth stage first noise reduction sub-circuit 108, the first sensing control signal noise reduction sub-circuit 109, the Mth stage first pull-up node noise reduction sub-circuit 110, the Nth stage first noise reduction sub-circuit 111, the Nth stage first shift signal noise reduction sub-circuit 112, the Nth stage first pull-up node noise reduction sub-circuit 113, the Mth stage second pull-down control sub-circuit 114, the Mth stage second noise reduction sub-circuit 115, the second sensing control signal noise reduction sub-circuit 116, the Mth stage second pull-up node noise reduction sub-circuit 117, the Nth stage second noise reduction sub-circuit 118, the Nth stage second shift signal noise reduction sub-circuit 119, the Nth stage second pull-up node noise reduction sub-circuit 120, the first control sub-circuit 121, the second control sub-circuit 122, the second reset sub-circuit 123, the selection sub-circuit 124, the second input sub-circuit 125, and the first potential raising sub-circuit 126 in S31 to S37, reference is made to the above embodiments. A working process of the second potential raising sub-circuit 127 in S31 to S37 is as follows.

In S31 to S33, in the first phase (P1) to the third phase (P3) of the display phase of the image frame (F) shown in FIG. 34, the second potential raising sub-circuit 127 transmits the voltage of the tenth voltage terminal VDN to at least one of the first input sub-circuit 101, the second input sub-circuit 125, the first reset sub-circuit 106, the second reset sub-circuit 123, the Nth stage first pull-up node noise reduction sub-circuit 113, the Nth stage second pull-up node noise reduction sub-circuit 120, the Mth stage second pull-up node noise reduction sub-circuit 117, and the Mth stage first pull-up node noise reduction sub-circuit 110 in response to the valid voltage of the Mth stage pull-up node Q(M).

For example, the second potential raising sub-circuit 127 turns on at least one of the forty-eighth transistor M48 and the forty-ninth transistor M49 in response to the high voltage of the Mth stage pull-up node Q(M), and transmits the voltage of the tenth voltage terminal VDN to at least one of the first input sub-circuit 101, the second input sub-circuit 125, the first reset sub-circuit 106, the second reset sub-circuit 123, the Nth stage first pull-up node noise reduction sub-circuit 113, the Nth stage second pull-up node noise reduction sub-circuit 120, the Mth stage second pull-up node noise reduction sub-circuit 117, and the Mth stage first pull-up node noise reduction sub-circuit 110.

In S34, in the fourth phase (P4) of the display phase of the image frame (F) shown in FIG. 34, the second potential raising sub-circuit 127 is turned off in response to the invalid voltage of the Mth stage pull-up node Q(M).

For example, the second potential raising sub-circuit 127 turns off the forty-eighth transistor M48 and the forty-ninth transistor M49 in response to the low voltage of the Mth stage pull-up node Q(M).

In S35 and S36, in the fifth phase (P5) and the sixth phase (P6) of the display phase of the image frame (F) shown in FIG. 34, for a working process of the second potential raising sub-circuit 127, reference may be made to the description of S31 to S33 in this embodiment, and details will not be repeated here.

In S37, in the seventh phase (P7) of the display phase of the image frame (F) shown in FIG. 34, for a working process of the second potential raising sub-circuit 127, reference may be made to the description of S34 in this embodiment, and details will not be repeated here.

Figure 36:
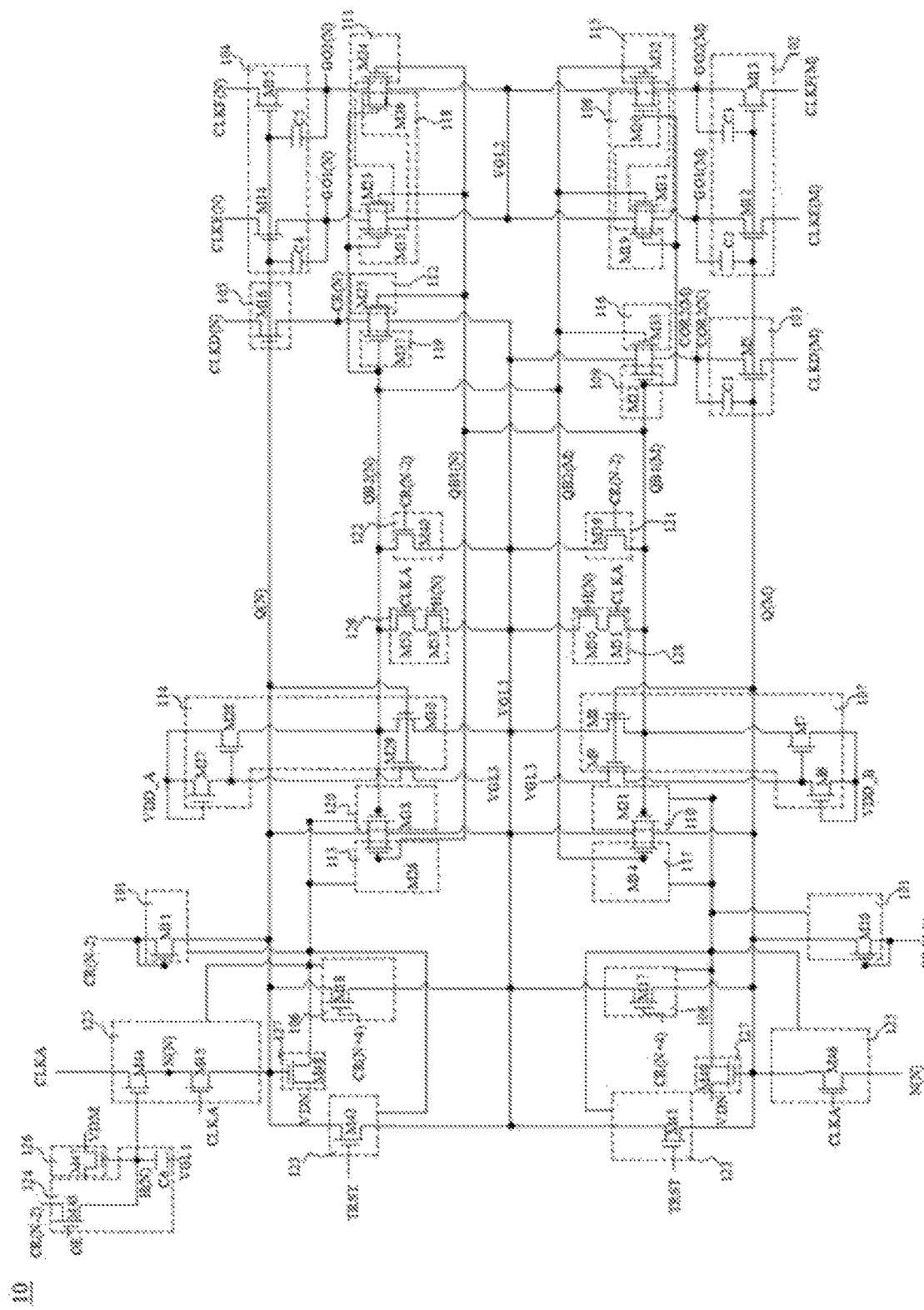
FIG. 36 is yet another replaceable structural diagram of the shift register circuit in FIG. 13.

FIG. 36 is yet another replaceable structural diagram of the shift register circuit 10. Referring to FIG. 36, in some embodiments, the shift register circuit 10 further includes a third control sub-circuit 128 and a fourth control sub-circuit 129.

The third control sub-circuit 128 is coupled to the fourth clock signal terminal CLKA, the first node H(N), the fourth voltage terminal VGL1, and at least one of the Mth stage first pull-down node QB1(M) and the Nth stage first pull-down node QB1(N).

The third control sub-circuit 128 is configured to, in response to the voltage of the first node H(N) and the fourth clock signal SCLKA applied to the fourth clock signal terminal CLKA, transmit the voltage of the fourth voltage terminal VGL1 to at least one of the Mth stage first pull-down node QB1(M) and the Nth stage first pull-down node QB1(N), so that the at least one of the Mth stage first pull-down node QB1(M) and the Nth stage first pull-down node QB1(N) is set to be at the invalid voltage.

For example, the third control sub-circuit 128 includes a fiftieth transistor M50 and a fifty-first transistor M51.

The fiftieth transistor M50 includes a gate, a first electrode and a second electrode. The gate of the fiftieth transistor M50 is coupled to the first node H(N), and the first electrode of the fiftieth transistor M50 is coupled to the fourth voltage terminal VGL1.

The fifty-first transistor M51 includes a gate, a first electrode and a second electrode. The gate of the fifty-first transistor M51 is coupled to the fourth clock signal terminal CLKA, the first electrode of the fifty-first transistor M51 is coupled to the second electrode of the fiftieth transistor M50, and the second electrode of the fifty-first transistor M51 is coupled to the Mth stage first pull-down node QB1(M).

The fourth control sub-circuit 129 is coupled to the fourth clock signal terminal CLKA, the first node H(N), the fourth voltage terminal VGL1, and at least one of the Mth stage second pull-down node QB2(M) and the Nth stage second pull-down node QB2(N).

The fourth control sub-circuit 129 is configured to, in response to the voltage of the first node H(N) and the fourth clock signal SCLKA of the fourth clock signal terminal CLKA, transmit the voltage of the fourth voltage terminal VGL1 to at least one of the Mth stage second pull-down node QB2(M) and the Nth stage second pull-down node QB2(N), so that the at least one of the Mth stage second pull-down node QB2(M) and the Nth stage second pull-down node QB2(N) is set to be at the invalid voltage.

For example, the fourth control sub-circuit 129 includes a fifty-second transistor M52 and a fifty-third transistor M53.

The fifty-second transistor M52 includes a gate, a first electrode and a second electrode. The gate of the fifty-second transistor M52 is coupled to the first node H(N), and the first electrode of the fifty-second transistor M52 is coupled to the fourth voltage terminal VGL1.

The fifty-third transistor M53 includes a gate, a first electrode and a second electrode. The gate of the fifty-third transistor M53 is coupled to the fourth clock signal terminal CLKA, the first electrode of the fifty-third transistor M53 is coupled to the second electrode of the fifty-second transistor M52, and the second electrode of the fifty-third transistor M53 is coupled to the Nth stage second pull-down node QB1(N).

Referring to FIGS. 34 and 36, in a driving method of the shift register circuit 10 in this embodiment, for working processes of the first input sub-circuit 101, the Mth stage output sub-circuit 102, the sensing control signal output sub-circuit 103, the Nth stage output sub-circuit 104, the shift signal output sub-circuit 105, the first reset sub-circuit 106, the Mth stage first pull-down control sub-circuit 107, the Mth stage first noise reduction sub-circuit 108, the first sensing control signal noise reduction sub-circuit 109, the Mth stage first pull-up node noise reduction sub-circuit 110, the Nth stage first noise reduction sub-circuit 111, the Nth stage first shift signal noise reduction sub-circuit 112, the Nth stage first pull-up node noise reduction sub-circuit 113, the Mth stage second pull-down control sub-circuit 114, the Mth stage second noise reduction sub-circuit 115, the second sensing control signal noise reduction sub-circuit 116, the Mth stage second pull-up node noise reduction sub-circuit 117, the Nth stage second noise reduction sub-circuit 118, the Nth stage second shift signal noise reduction sub-circuit 119, the Nth stage second pull-up node noise reduction sub-circuit 120, the first control sub-circuit 121, the second control sub-circuit 122, the second reset sub-circuit 123, the selection sub-circuit 124, the second input sub-circuit 125, the first potential raising sub-circuit 126, and the second potential raising sub-circuit 127 in S31 to S37, reference is made to the above embodiments. Working processes of the third control sub-circuit 128 and the fourth control sub-circuit 129 in S31 to S37 are as follows.

In S31 to S34, in the first phase (P1) to the fourth phase (P4) of the display phase of the image frame (F) shown in FIG. 34, the third control sub-circuit 128 is turned off in response to the voltage of the first node H(N) and the invalid voltage of the fourth clock signal SCLKA.

For example, the third control sub-circuit 128 turns off the fiftieth transistor M50 and the fifty-first transistor M51 in response to the high voltage of the first node H(N) and the low voltage of the fourth clock signal SCLKA.

The fourth control sub-circuit 129 is turned off in response to the voltage of the first node H(N) and the invalid voltage of the fourth clock signal SCLKA.

For example, the fourth control sub-circuit 129 turns off the fifty-second transistor M52 and the fifty-third transistor M53 in response to the high voltage of the first node H(N) and the low voltage of the fourth clock signal SCLKA.

In S35, in the fifth phase (P5) of the display phase of the image frame (F) shown in FIG. 34, the third control sub-circuit 128 is turned on in response to the valid voltage of the first node H(N) and the valid voltage of the fourth clock signal SCLKA applied to the fourth clock signal terminal CLKA, and transmits the voltage of the fourth voltage terminal VGL1 to at least one of the Mth stage first pull-down node QB1(M) and the Nth stage first pull-down node QB1(N). Therefore, noise reduction is performed on the at least one of the Mth stage first pull-down node QB1(M) and the Nth stage first pull-down node QB1(N).

For example, the third control sub-circuit 128 turns on the fiftieth transistor M50 and the fifty-first transistor M51 in response to the high voltage of the first node H(N) and the high voltage of the fourth clock signal SCLKA, and transmits the voltage of the fourth voltage terminal VGL1 to at least one of the Mth stage first pull-down node QB1(M) and the Nth stage first pull-down node QB1(N).

The fourth control sub-circuit 129 is turned on in response to the valid voltage of the first node H(N) and the valid voltage of the fourth clock signal SCLKA applied to the fourth clock signal terminal CLKA, and transmits the voltage of the fourth voltage terminal VGL1 to at least one of the Mth stage second pull-down node QB2(M) and the Nth stage second pull-down node QB2(N). Therefore, noise reduction is performed on the at least one of the Mth stage second pull-down node QB2(M) and the Nth stage second pull-down node QB2(N).

For example, the fourth control sub-circuit 129 turns on the fifty-second transistor M52 and the fifty-third transistor M53 in response to the high voltage of the first node H(N) and the high voltage of the fourth clock signal SCLKA, and transmits the voltage of the fourth voltage terminal VGL1 to at least one of the Mth stage second pull-down node QB2(M) and the Nth stage second pull-down node QB2(N).

In S35 to S37, in the fifth phase (P5) to the seventh phase (P7) of the display phase of the image frame (F) shown in FIG. 34, for working processes of the third control sub-circuit 128 and the fourth control sub-circuit 129, reference may be made to the description of S31 to S33 in this embodiment, and details will not be repeated here.

Figure 37:
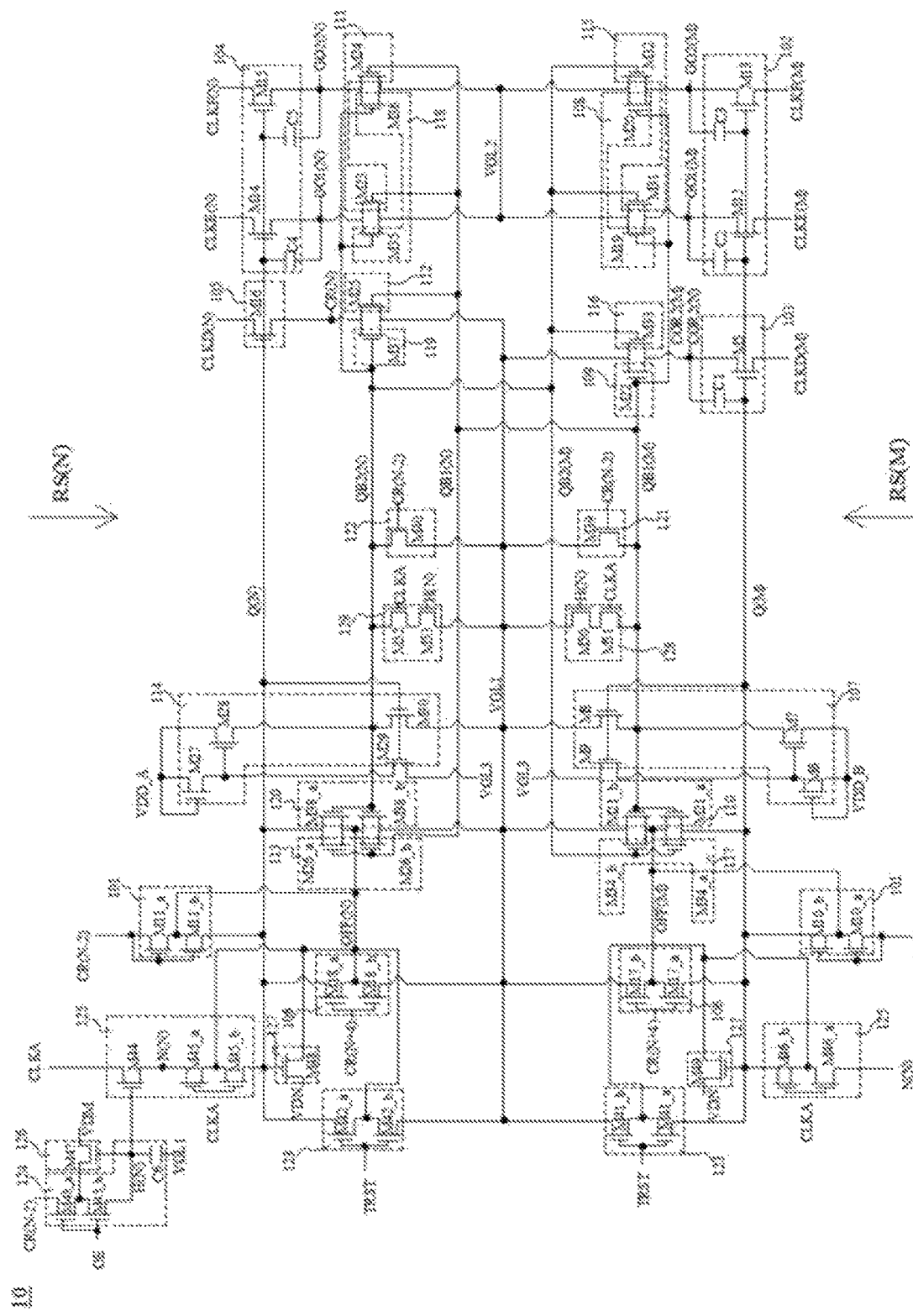
FIG. 37 is yet another replaceable structural diagram of the shift register circuit in FIG. 13.

FIG. 37 is yet another replaceable structural diagram of the shift register circuit 10. Referring to FIG. 37, in some embodiments, in a case where the shift register circuit 10 includes the second input sub-circuit 125, the forty-fifth transistor M45 in the second input sub-circuit 125 is replaced by a transistor M45_a and a transistor M45_b that are connected in series, and the forty-sixth transistor M46 in the second input sub-circuit 125 is replaced by a transistor M46_a and a transistor M46_b that are connected in series. A gate of the transistor M45_a and a gate of the transistor M45_b are coupled to the fourth clock signal terminal CLKA, and a first electrode of the transistor M45_a is coupled to the second node N(N) and the second electrode of the forty-fourth transistor M44. A second electrode of the transistor M45_a is coupled to a first electrode of the transistor M45_b and the third node OFF(N), and a second electrode of the transistor M45_b is coupled to the Nth stage pull-up node Q(N). A gate of the transistor M46_a and a gate of the transistor M46_b are coupled to the fourth clock signal terminal CLKA, and a first electrode of the transistor M46_a is coupled to the second node N(N). A second electrode of the transistor M46_a is coupled to a first electrode of the transistor M46_b and the fourth node OFF(M), and a second electrode of the transistor M46_b is coupled to the Mth stage pull-up node Q(M).

In a case where the shift register circuit 10 includes the second potential raising sub-circuit 127, when the forty-eighth transistor M48 transmits the voltage of the tenth voltage terminal VDN to the third node OFF(N) in response to the valid voltage of the Nth stage pull-up node Q(N), potentials of the first electrode and the second electrode of the transistor M45_b are the same, so that the leakage current of the transistor M45_b may be reduced.

With continued reference to FIG. 37, in some embodiments, in a case where the shift register circuit 10 includes the Mth stage first pull-up node noise reduction sub-circuit 110, the Mth stage first pull-up node noise reduction sub-circuit 110 is further coupled to the fourth node OFF(M).

For example, the twenty-first transistor M21 in the Mth stage first pull-up node noise reduction sub-circuit 110 is replaced by a transistor M21_a and a transistor M21_b that are connected in series. A gate of the transistor M21_a and a gate of the transistor M21_b are coupled to the Mth stage first pull-down node QB1(M), a first electrode of the transistor M21_a is coupled to the Mth stage pull-up node Q(M), and a second electrode of the transistor M21_a is coupled to a first electrode of the transistor M21_b and the fourth node OFF(M); and a second electrode of the transistor M21_b is coupled to the fourth voltage terminal VGL1.

In the case where the shift register circuit 10 includes the second potential raising sub-circuit 127, when the forty-ninth transistor M49 transmits the voltage of the tenth voltage terminal VDN to the fourth node OFF(M) in response to the valid voltage of the Mth stage pull-up node Q(M), potentials of the first electrode and the second electrode of the transistor M21_a are the same, so that the leakage current of the transistor M21_a may be reduced.

With continued reference to FIG. 37, in some embodiments, in a case where the shift register circuit 10 includes the Nth stage first pull-up node noise reduction sub-circuit 113, the Nth stage first pull-up node noise reduction sub-circuit 113 is further coupled to the third node OFF(N).

For example, the twenty-sixth transistor M26 in the Nth stage first pull-up node noise reduction sub-circuit 113 is replaced by a transistor M26_a and a transistor M26_b that are connected in series. A gate of the transistor M26_a and a gate of the transistor M26_b are coupled to the Nth stage first pull-down node QB1(N), a first electrode of the transistor M26_a is coupled to the Nth stage pull-up node Q(N), and a second electrode of the transistor M26_a is coupled to a first electrode of the transistor M26_b and the third node OFF(N); and a second electrode of the transistor M26_b is coupled to the fourth voltage terminal VGL1.

In the case where the shift register circuit 10 includes the second potential raising sub-circuit 127, when the forty-eighth transistor M48 transmits the voltage of the tenth voltage terminal VDN to the third node OFF(N) in response to the valid voltage of the Nth stage pull-up node Q(N), potentials of the first electrode and the second electrode of the transistor M26_a are the same, so that the leakage current of the transistor M26_a may be reduced.

With continued reference to FIG. 37, in some embodiments, in a case where the shift register circuit 10 includes the Mth stage second pull-up node noise reduction sub-circuit 117, the Mth stage second pull-up node noise reduction sub-circuit 117 is further coupled to the fourth node OFF(M).

For example, the thirty-fourth transistor M34 in the Mth stage second pull-up node noise reduction sub-circuit 117 is replaced by a transistor M34_a and a transistor M34_b that are connected in series. A gate of the transistor M34_a and a gate of the transistor M34_b are coupled to the Mth stage second pull-down node QB2(M), a first electrode of the transistor M34_a is coupled to the Mth stage pull-up node Q(M), and a second electrode of the transistor M34_a is coupled to a first electrode of the transistor M34_b and the fourth node OFF(M); and a second electrode of the transistor M34_b is coupled to the fourth voltage terminal VGL1.

In the case where the shift register circuit 10 includes the second potential raising sub-circuit 127, when the forty-ninth transistor M49 transmits the voltage of the tenth voltage terminal VDN to the fourth node OFF(M) in response to the valid voltage of the Mth stage pull-up node Q(M), potentials of the first electrode and the second electrode of the transistor M34_a are the same, so that the leakage current of the transistor M34_a may be reduced.

With continued reference to FIG. 37, in some embodiments, in a case where the shift register circuit 10 includes the Nth stage second pull-up node noise reduction sub-circuit 120, the Nth stage second pull-up node noise reduction sub-circuit 120 is further coupled to the third node OFF(N).

For example, the thirty-eighth transistor M38 in the Nth stage second pull-up node noise reduction sub-circuit 120 is replaced by a transistor M38_a and a transistor M38_b that are connected in series. A gate of the transistor M38_a and a gate of the transistor M38_b are coupled to the Nth stage second pull-down node QB2(N), a first electrode of the transistor M38_a is coupled to the Nth stage pull-up node Q(N), and a second electrode of the transistor M38_a is coupled to a first electrode of the transistor M38_b and the third node OFF(N); and a second electrode of the transistor M38_*b* is coupled to the fourth voltage terminal VGL1.

In the case where the shift register circuit 10 includes the second potential raising sub-circuit 127, when the forty-eighth transistor M48 transmits the voltage of the tenth voltage terminal VDN to the third node OFF(N) in response to the valid voltage of the Nth stage pull-up node Q(N), potentials of the first electrode and the second electrode of the transistor M38_*a* are the same, so that the leakage current of the transistor M38_*a* may be reduced.

With continued reference to FIG. 37, in some embodiments, in a case where the shift register circuit 10 includes a first reset sub-circuit 106, the first reset sub-circuit 106 is further coupled to the third node OFF(N) and the fourth node OFF(M).

For example, the seventeenth transistor M17 in the first reset sub-circuit 106 is replaced by a transistor M17_*a* and a transistor M17_*b* that are connected in series, and the eighteenth transistor M18 in the first reset sub-circuit 106 is replaced by a transistor M18_*a* and a transistor M18_*b* that are connected in series. A gate of the transistor M17_*a* and a gate of the transistor M17_*b* are coupled to the first reset input terminal CR(N+4), a first electrode of the transistor M17_*a* is coupled to the Mth stage pull-up node Q(M), and a second electrode of the transistor M17_*a* is coupled to a first electrode of the transistor M17_*b* and the fourth node OFF(M); and a second electrode of the transistor M17_*b* is coupled to the fourth voltage terminal VGL1. A gate of the transistor M18_*a* and a gate of the transistor M18_*b* are coupled to the first reset input terminal CR(N+4), a first electrode of the transistor M18_*a* is coupled to the Nth pull-up node Q(N), and a second electrode of the transistor M18_*a* is coupled to a first electrode of the transistor M18_*b* and the third node OFF(N); and a second electrode of the transistor M18_*b* is coupled to the fourth voltage terminal VGL1.

In the case where the shift register circuit 10 includes the second potential raising sub-circuit 127, when the forty-ninth transistor M49 transmits the voltage of the tenth voltage terminal VDN to the fourth node OFF(M) in response to the valid voltage of the Mth stage pull-up node Q(M), potentials of the first electrode and the second electrode of the transistor M17_*a* are the same, so that the leakage current of the transistor M17_*a* may be reduced.

In the case where the shift register circuit 10 includes the second potential raising sub-circuit 127, when the forty-eighth transistor M48 transmits the voltage of the tenth voltage terminal VDN to the third node OFF(N) in response to the valid voltage of the Nth stage pull-up node Q(N), potentials of the first electrode and the second electrode of the transistor M18_*a* are the same, so that the leakage current of the transistor M18_*a* may be reduced.

With continued reference to FIG. 37, in some embodiments, in a case where the shift register circuit 10 includes a second reset sub-circuit 123, the second reset sub-circuit 123 is further coupled to the third node OFF(N) and the fourth node OFF(M).

For example, the forty-first transistor M41 in the second reset sub-circuit 123 is replaced by a transistor M41_*a* and a transistor M41_*b* that are connected in series, and the forty-second transistor M42 in the second reset sub-circuit 123 is replaced by a transistor M42_*a* and a transistor M42_*b* that are connected in series. A gate of the transistor M41_*a* and a gate of the transistor M41_*b* are coupled to the second reset signal terminal TRST, a first electrode of the transistor M41_*a* is coupled to the Mth stage pull-up node Q(M), and a second electrode of the transistor M41_*a* is coupled to a first electrode of the transistor M41_*b* and the fourth node OFF(M); and a second electrode of the transistor M41_*b* is coupled to the fourth voltage terminal VGL1. A gate of the transistor M42_*a* and a gate of the transistor M42_*b* are coupled to the second reset signal terminal TRST, a first electrode of the transistor M42_*a* is coupled to the Nth stage pull-up node Q(N), a second electrode of the transistor M42_*a* is coupled to a first electrode of the transistor M42_*b* and the third node OFF(N); and a second electrode of the transistor M42_*b* is coupled to the fourth voltage terminal VGL1.

In the case where the shift register circuit 10 includes the second potential raising sub-circuit 127, when the forty-ninth transistor M49 transmits the voltage of the tenth voltage terminal VDN to the fourth node OFF(M) in response to the valid voltage of the Mth stage pull-up node Q(M), potentials of the first electrode and the second electrode of the transistor M41_*a* are the same, so that the leakage current of the transistor M41_*a* may be reduced.

In the case where the shift register circuit 10 includes the second potential raising sub-circuit 127, when the forty-eighth transistor M48 transmits the voltage of the tenth voltage terminal VDN to the third node OFF(N) in response to the valid voltage of the Nth stage pull-up node Q(N), potentials of the first electrode and the second electrode of the transistor M42_*a* are the same, so that the leakage current of the transistor M42_*a* may be reduced.

With continued reference to FIG. 37, in some embodiments, in a case where the shift register circuit 10 includes the first input sub-circuit 101, the first input sub-circuit 101 is further coupled to the third node OFF(N) and the fourth node OFF(M).

For example, the eleventh transistor M11 in the first input sub-circuit 101 is replaced by a transistor M11_*a* and a transistor M11_*b* that are connected in series, and the tenth transistor M10 in the first input sub-circuit 101 is replaced by a transistor M10_*a* and a transistor M10_*b* that are connected in series. A gate of the transistor M11_*a*, a gate of the transistor M11_*b* and a first electrode of the transistor M11_*a* are coupled to the first signal input terminal CR(N−2), and a second electrode of the transistor M11_*a* is coupled to a first electrode of the transistor M11_*b* and the third node OFF(N); a second electrode of the transistor M11_*b* is coupled to the Nth stage pull-up node Q(N). A gate of the transistor M10_*a*, a gate of the transistor M10_*b* and a first electrode of the transistor M10_*a* are coupled to the first signal input terminal CR(N−2), and a second electrode of the transistor M10_*a* is coupled to a first electrode of the transistor M10_*b* and the fourth node OFF(M); a second electrode of the transistor M10_*b* is coupled to the Mth stage pull-up node Q(M).

In the case where the shift register circuit 10 includes the second potential raising sub-circuit 127, when the forty-eighth transistor M48 transmits the voltage of the tenth voltage terminal VDN to the third node OFF(N) in response to the valid voltage of the Nth stage pull-up node Q(N), potentials of the first electrode and the second electrode of the transistor M11_*b* are the same, so that the leakage current of the transistor M11_*b* may be reduced.

In the case where the shift register circuit 10 includes the second potential raising sub-circuit 127, when the forty-ninth transistor M49 transmits the voltage of the tenth voltage terminal VDN to the fourth node OFF(M) in response to the valid voltage of the Mth stage pull-up node Q(M), potentials of the first electrode and the second electrode of the transistor M10_*b* are the same, so that the leakage current of the transistor M10_*b* may be reduced.

With continued reference to FIG. 37, in some embodiments, in a case where the shift register circuit 10 includes the selection sub-circuit 124 and a first potential raising sub-circuit 126, the selection sub-circuit 124 is further coupled to the second electrode of the forty-seventh transistor M47 in the first potential raising sub-circuit 126.

For example, the forty-third transistor M43 in the selection sub-circuit 124 may be replaced by a transistor M43_a and a transistor M43_b. A gate of the transistor M43_a and a gate of the transistor M43_b are coupled to the control signal terminal OE, a first electrode of the transistor M43_a is coupled to the first signal input terminal CR(N−2), and a second electrode of the transistor M43_a is coupled to a first electrode of the transistor M43_b and the second electrode of the forty-seventh transistor M47; and a second electrode of the transistor M43_b is coupled to the first node H(N).

In the case where the shift register circuit 10 includes the first potential raising sub-circuit 126, when the forty-seventh transistor M47 transmits the voltage of the ninth voltage terminal VDM to the second electrode of the transistor M43_a and the first electrode of the transistor M43_b in response to the valid voltage of the first node H(N), potentials of the first electrode and the second electrode of the transistor M43_b are the same, so that the leakage current of the transistor M43_b may be reduced.

Referring to FIGS. 34 and 37, the second potential raising sub-circuit 127 transmits the voltage of the tenth voltage terminal VDN to the third node OFF(N) and the fourth node OFF(M) in response to the valid voltages of the Mth stage pull-up node Q(M) and the Nth stage pull-up node Q(N).

For example, the second potential raising sub-circuit 127 turns on the forty-eighth transistor M48 and the forty-ninth transistor M49 in response to the high voltages of the Mth stage pull-up node Q(M) and the Nth stage pull-up node Q(N), and transmits the voltage of the tenth voltage terminal VDN to the third node OFF(N) and the fourth node OFF(M). At this time, potentials of the third node OFF(N) and the fourth node OFF(M) are high voltages.

For example, potentials of the first electrode and the second electrode of the transistor M45_b in the second input sub-circuit 125 are both at the high level, which reduces the leakage current of the transistor M45_b; and potentials of the first electrode and the second electrode of the transistor M46_b are both at the high level, which reduces the leakage current of the transistor M46_b. In addition, in the fifth phase (P5), when the voltage of the first electrode of the transistor M45_a is the high voltage from the fourth clock signal SCLKA, potentials of the first electrode and the second electrode of the transistor M45_a are the same, thereby reducing the leakage current of the transistors in the second input sub-circuit 125, and improving the stability of the potentials of the Mth stage pull-up node Q(M) and the Nth stage pull-up node Q(N).

Similarly, for example, respective first electrodes and second electrodes of the transistor M21_a in the Mth stage first pull-up node noise reduction sub-circuit 110, the transistor M26_a in the Nth stage first pull-up node noise reduction sub-circuit 113, the transistor M34_a in the Mth stage second pull-up node noise reduction sub-circuit 117, the transistor M38_a in the Nth stage second pull-up node noise reduction sub-circuit 120 included in the shift register circuit 10, the transistor M17_a and the transistor M18_a in the first reset sub-circuit 106, the transistor M41_a and the transistor M42_a in the second reset sub-circuit 123, and the transistor M11_b and the transistor M10_b in the first input sub-circuit 101 are all at the high potential, thereby reducing the leakage currents of the transistors in the Mth stage first pull-up node noise reduction sub-circuit 110, the Nth stage first pull-up node noise reduction sub-circuit 113, the M stage second pull-up node noise reduction sub-circuit 117, and the Nth stage second pull-up node noise reduction sub-circuit 120, the first reset sub-circuit 106, the second reset sub-circuit 123 and the first input sub-circuit 101 included in the shift register circuit 10, and improving the stability of the potentials of the Mth stage pull-up node Q(M) and the Nth stage pull-up node Q(N).

The first potential raising sub-circuit 126 transmits the voltage of the ninth voltage terminal VDM to the selection sub-circuit 124 in response to the voltage of the first node H(N).

For example, when the first node H(N) is at the high voltage, the forty-seventh transistor M47 is turned on, and transmits the high voltage of the ninth voltage terminal VDM to the second electrode of the transistor M43_a and the first electrode of the transistor M43_b. Since the potential of the second electrode of the transistor M43_b is the high voltage of the first node H(N), the potentials of the first electrode and the second electrode of the transistor M43_b are equal, thereby reducing the leakage current of the transistor M43_b and improving the stability of the potential of the first node H(N). In addition, in the first phase (P1), when the first signal input terminal CR(N−2) is at a high voltage, the voltage of the first electrode of the transistor M43_a is the high voltage of the first signal input terminal CR(N−2); the voltage of the second electrode of the transistor M43_a is the high voltage of the ninth voltage terminal VDM, and the voltages of the first electrode and the second electrode of the transistor M43_a are equal, thereby reducing the leakage current of the transistor M43_a and improving the stability of the potential of the first node H(N).

It should be noted that, the transistors used in the shift register circuit 10 provided in the embodiments of the present disclosure may be thin film transistors (TFTs), field effect transistors (FETs), or other switching devices with the same characteristics, which is not limited in the embodiments of the present disclosure. In some embodiments, in each transistor used in the shift register circuit 10, the first electrode is one of a source and a drain of the transistor, and the second electrode is another one of the source and the drain of the transistor. Since the source and the drain of the transistor may be symmetrical in structure, there may be no difference in structure between the source and drain. That is, the first electrode and the second electrode of the transistor in the embodiments of the present disclosure may be indistinguishable in structure. For example, in a case where the transistor is a P-type transistor, the first electrode of the transistor is the source, and the second electrode of the transistor is the drain. For example, in a case where the transistor is an N-type transistor, the first electrode of the transistor is the drain, and the second electrode of the transistor is the source.

In the circuits provided in the embodiments of the present disclosure, the Mth stage first pull-down node QB1(M), the Nth stage first pull-down node QB1(N), the Mth stage pull-up node Q(M), the Nth stage pull-up node Q(N), the Mth stage second pull-down node QB2(M), the Nth stage second pull-down node QB2(N), the first node H(N), the second node N(N), the third node OFF(N), and the fourth node OFF(M) do not represent actual components, but represent junction points of relevant electrical connections in the circuit diagrams. That is, these nodes are nodes equivalent to the junction points of the relevant electrical connections in the circuit diagrams.

In the shift register circuits 10 provided in the embodiments of the present disclosure, the specific implementation of each sub-circuit is not limited to the manner described above, and may be any implementation manner used, such as the conventional connection manner well known to those skilled in the art, as long as the corresponding function is ensured to be realized. The above examples are not intended to limit the protection scope of the present disclosure. In practical applications, those skilled in the art may choose to use or not to use one or more of the above circuits according to the situations, and variations based on various combinations of the above circuits do not depart from the principle of the present disclosure, which will not be described in detail herein.

Figure 38:
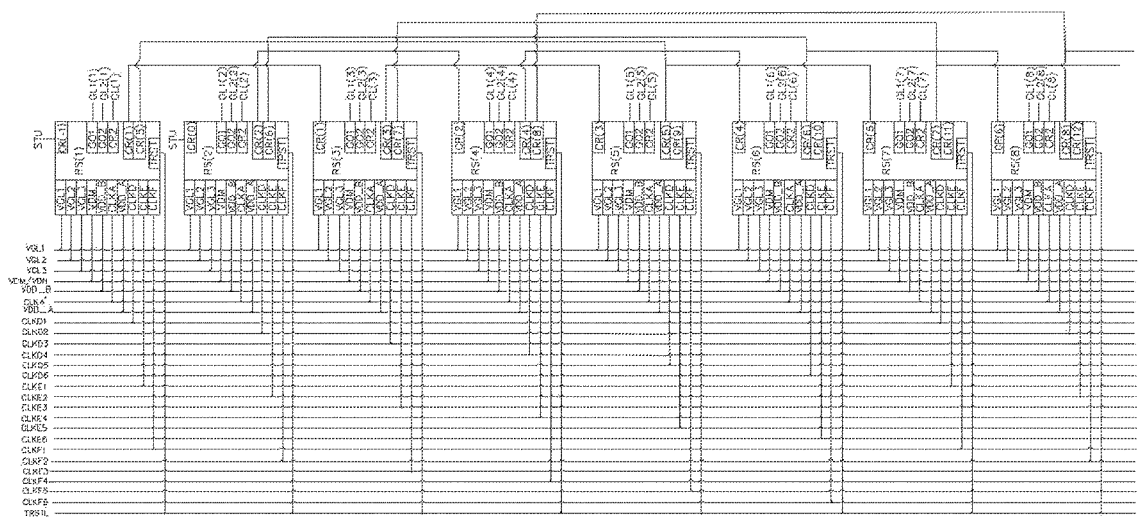
FIG. 38 is a cascade diagram of shift register units.

FIG. 38 is a cascade diagram of shift register units. Referring to FIG. 38, in a type of shift register circuits provided in the above embodiments, each shift register circuit 10 includes two shift register units RS, e.g., RS(1) and RS(2), or RS(M) and RS(N). M is N+1, or M is N−1, or M and N are not adjacent. For the convenience of description below, this embodiment is described by taking an example where M is N+1.

The gate driving circuit includes z stages of shift register units (RS(1), RS(2), RS(3), RS(4), . . . . RS(M), RS(N), . . . . RS(z−1), and RS(z)) that are cascaded. z is an integer multiple of O, such as 2 times, 3 times, 4 times.

For example, the first signal input terminal CR(N−2) of the first stage shift register unit RS(1) is coupled to a start signal line STU. The start signal line STU is configured to transmit a start signal, and the first stage shift register unit RS(1) of the gate driving circuit starts to work when receiving the start signal. The second reset input terminals TRST of all the shift register units RS are coupled to the reset signal line TRSTL.

Referring to FIG. 38, in some embodiments, the shift register units are cascaded sequentially. Other than the first stage shift register unit RS(1) and the second stage shift register unit RS(2), the first signal input terminal CR(N−2) of each stage shift register unit is coupled to the shift signal output terminal CR(N) of a shift register unit of a previous second stage. For example, the first signal input terminal CR(x−2) of the xth stage shift register unit RS(x) is coupled to the shift signal output terminal CR(x−2) of the (x−2)th stage shift register unit RS(x−2).

It should be noted that, any six adjacent cascaded shift register units RS are coupled to different first clock signal lines CLKE1 to CLKE6, different second clock signal lines CLKF1 to CLKF6, and different third clock signal lines CLKD1 to CLKD6. The first clock signal terminal CLKE of the xth stage shift register unit RS(x) is coupled to the first clock signal line CLKE(x−6y), the second clock signal terminal CLKF of the xth stage shift register unit RS(x) is coupled to the second clock signal line CLKF(x−6y), and the third clock signal terminal CLKD of the xth stage shift register unit RS(x) is coupled to the third clock signal line CLKD(x−6y), where y is an integer. For example, the first clock signal terminal CLKE of the first stage shift register unit RS(1) is coupled to the first clock signal line CLKE1, the second clock signal terminal CLKF of the first stage shift register unit RS(1) is coupled to the second clock signal line CLKF1, and the third clock signal terminal CLKD of the first stage shift register unit RS(1) is coupled to the third clock signal line CLKD1. The first clock signal terminal CLKE of the second stage shift register unit RS(2) is coupled to the first clock signal line CLKE2, the second clock signal terminal CLKF of the second stage shift register unit RS(2) is coupled to the second clock signal line CLKF2, and the third clock signal terminal CLKD of the second stage shift register unit RS(2) is coupled to the third clock signal line CLKD2. The first clock signal terminal CLKE of the third stage shift register unit RS(3) is coupled to the first clock signal line CLKE3, the second clock signal terminal CLKF of the third stage shift register unit RS(3) is coupled to the second clock signal line CLKF3, and the third clock signal terminal CLKD of the third stage shift register unit RS(3) is coupled to the third clock signal line CLKD3. The first clock signal terminal CLKE of the fourth stage shift register unit RS(4) is coupled to the first clock signal line CLKE4, the second clock signal terminal CLKF of the fourth stage shift register unit RS(4) is coupled to the second clock signal line CLKF4, and the third clock signal terminal CLKD of the fourth stage shift register unit RS(4) is coupled to the third clock signal line CLKD4. The first clock signal terminal CLKE of the fifth stage shift register unit RS(5) is coupled to the first clock signal line CLKE5, the second clock signal terminal CLKF of the fifth stage shift register unit RS(5) is coupled to the second clock signal line CLKF5, and the third clock signal terminal CLKD of the fifth stage shift register unit RS(5) is coupled to the third clock signal line CLKD5. The first clock signal terminal CLKE of the sixth stage shift register unit RS(6) is coupled to the first clock signal line CLKE6, the second clock signal terminal CLKF of the sixth stage shift register unit RS(6) is coupled to the second clock signal line CLKF6, and the third clock signal terminal CLKD of the sixth stage shift register unit RS(6) is coupled to the third clock signal line CLKD6. The first clock signal terminal CLKE of the seventh stage shift register unit RS(7) is coupled to the first clock signal line CLKE1, the second clock signal terminal CLKF of the seventh stage shift register unit RS(7) is coupled to the second clock signal line CLKF1, and the third clock signal terminal CLKD of the seventh stage shift register unit RS(7) is coupled to the third clock signal line CLKD1. The first clock signal terminal CLKE of the eighth stage shift register unit RS(8) is coupled to the first clock signal line CLKE2, the second clock signal terminal CLKF of the eighth stage shift register unit RS(8) is coupled to the second clock signal line CLKF2, and the third clock signal terminal CLKD of the eighth stage shift register unit RS(8) is coupled to the third clock signal line CLKD2. In the first clock signal lines CLKE1 to CLKE6, there is a certain phase difference between signals transmitted by the first first clock signal line to the sixth first clock signal line.

In the second clock signal lines CLKF1 to CLKF6, there is a certain phase difference between signals transmitted by the first second clock signal line to the sixth second clock signal line. In the third clock signal lines CLKD1 to CLKD6, there is a certain phase difference between signals transmitted by the first third clock signal line to the sixth third clock signal line.

The fourth clock signal terminal CLKA in each stage shift register unit RS is coupled to a same fourth clock signal line CLKA'.

In some embodiments, in a case where the gate driving circuit includes a plurality of shift register units RS, the first signal input terminal CR(x−2) of the xth stage shift register unit RS(x) is coupled to the shift signal output terminal CR of the (x−2)th stage shift register unit RS(x−2). The first reset input terminal CR(x+4) of the xth stage shift register unit RS(x) is coupled to the shift signal output terminal CR of the (x+4)th stage shift register unit RS(x+4). x is greater than or equal to 3, and less than or equal to z (3≤x≤z), and x is a positive integer.

For example, the first signal input terminal CR(3-2) of the third stage shift register unit RS(3) is coupled to the shift signal output terminal CR of the first stage shift register unit RS(1), and the first signal input terminal CR(5-2) of the fifth stage shift register unit RS(5) is coupled to the shift signal output terminal CR of the third stage shift register unit RS(3). The first reset input terminal CR(1+4) of the first stage shift register unit RS(1) is coupled to the shift signal output terminal CR of the fifth stage shift register unit RS(5). In this case, both the first signal input terminal CR(1-2) of the first stage shift register unit RS(1) and the first signal input terminal CR(2-2) of the second stage shift register unit RS(2) are coupled to the start signal line STU; at this time, the start signal transmitted by the start signal line STU is used to control working of the first stage shift register unit RS(1) and the second stage shift register unit RS(2).

The foregoing descriptions are merely specific implementations of the present disclosure, but the protection scope of the present disclosure is not limited thereto, any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A driving method of a pixel circuit, wherein the pixel circuit comprises:
   a light-emitting device and a sensing terminal;
   a driving sub-circuit including a first terminal and a second terminal coupled to the light-emitting device, wherein the driving sub-circuit is configured to write a data signal into the driving sub-circuit in response to a first scan signal and control an electrical signal flowing through the first terminal and the second terminal of the driving sub-circuit according to the data signal;
   a sensing sub-circuit configured to connect the second terminal of the driving sub-circuit to the sensing terminal in response to a second scan signal;
   a light-emitting control sub-circuit configured to connect a first voltage terminal to the first terminal of the driving sub-circuit in response to a light-emitting control signal; and
   a sensing control sub-circuit configured to connect a second voltage terminal to the first terminal of the driving sub-circuit in response to a sensing control signal provided by a sensing control terminal;
   wherein the method comprises:
   transmitting, by the sensing control sub-circuit, a voltage applied to the second voltage terminal to the first terminal of the driving sub-circuit in response to the sensing control signal being at a valid voltage;
   writing, by the driving sub-circuit, the data signal into the driving sub-circuit in response to the first scan signal;
   writing, by the sensing sub-circuit, a sensing signal applied to the sensing terminal into the second terminal of the driving sub-circuit in response to the second scan signal;
   gradually changing a voltage of the sensing signal until the driving sub-circuit reaches an off state; and
   detecting a voltage of the second terminal of the driving sub-circuit.

2. The driving method of the pixel circuit according to claim 1, wherein
   the sensing control sub-circuit includes a first transistor, the driving sub-circuit includes a third transistor and a driving transistor, and the sensing sub-circuit includes a fourth transistor; in the first transistor, a gate is coupled to the sensing control terminal, a first electrode is coupled to the second voltage terminal, and a second electrode is coupled to the first terminal of the driving sub-circuit; in the third transistor, a gate is configured to receive the first scan signal, and a first electrode is configured to receive the data signal; in the driving transistor, a gate is coupled to a second electrode of the third transistor, a first electrode serves as the first terminal of the driving sub-circuit, and a second electrode serves as the second terminal of the driving sub-circuit and is coupled to the light-emitting device; and in the fourth transistor, a gate is configured to receive the second scan signal, a first electrode is coupled to the second terminal of the driving sub-circuit, and a second electrode is coupled to the sensing terminal;
   the first transistor is turned on in response to the sensing control signal being at the valid voltage, so as to transmit the voltage of the second voltage terminal to the first electrode of the driving transistor;
   the third transistor is turned on in response to the first scan signal being at a valid voltage, so as to write the data signal into the gate of the drive transistor; and the fourth transistor is turned on in response to the second scan signal being at a valid voltage, so as to transmit the sensing signal received by the sensing terminal to the second electrode of the driving transistor;
   the voltage of the sensing signal is gradually changed until a voltage difference between the gate and the second electrode of the driving transistor is substantially equal to a threshold voltage of the driving transistor; and
   the voltage of the second electrode of the driving transistor is detected.

3. A display apparatus, comprising:
   data lines;
   first pixel circuits and second pixel circuits; both a first pixel circuit in the first pixel circuits and a second pixel circuit in the second pixel circuits being coupled to a data line in the data lines; wherein a sensing control terminal of the first pixel circuit is coupled to a sensing control terminal of the second pixel circuit; and
   a shift register circuit configured to: output an Nth stage first scan signal and an Nth stage second scan signal to the first pixel circuit; and output an Mth stage first scan signal and an Mth stage second scan signal to the second pixel circuit; wherein the shift register circuit is further configured to output the sensing control signal to at least one of a sensing control terminal of the first pixel circuit and a sensing control terminal of the second pixel circuit, wherein M and N are different natural numbers;
   wherein each of the first pixel circuits and second pixel circuits includes:
   a light-emitting device and a sensing terminal;
   a driving sub-circuit including a first terminal and a second terminal coupled to the light-emitting device, wherein the driving sub-circuit is configured to write a data signal into the driving sub-circuit in response to a first scan signal and control an electrical signal flowing through the first terminal and the second terminal of the driving sub-circuit according to the data signal;
   a sensing sub-circuit configured to connect the second terminal of the driving sub-circuit to the sensing terminal in response to a second scan signal;

a light-emitting control sub-circuit configured to connect a first voltage terminal to the first terminal of the driving sub-circuit in response to a light-emitting control signal; and a sensing control sub-circuit configured to connect a second voltage terminal to the first terminal of the driving sub-circuit in response to a sensing control signal provided by a sensing control terminal;

wherein the shift register circuit includes:

a first input sub-circuit configured to, in response to an input signal applied to a first signal input terminal, set an Nth stage pull-up node and an Mth stage pull-up node to be at a valid voltage;

an Mth stage output sub-circuit configured to, in response to the valid voltage at the Mth stage pull-up node, transmit an Mth stage first clock signal applied to an Mth stage first clock signal terminal to an Mth stage first output terminal as the Mth stage first scan signal, and transmit an Mth stage second clock signal applied to an Mth stage second clock signal terminal to an Mth stage second output terminal as the Mth stage second scan signal, wherein both the Mth stage first output terminal and the Mth stage second output terminal are coupled to the second pixel circuit;

a sensing control signal output sub-circuit configured to, in response to the valid voltage at the Mth stage pull-up node, transmit an Mth stage third clock signal of an Mth stage third clock signal terminal to a sensing control signal output terminal as the sensing control signal, wherein the sensing control signal output terminal is coupled to at least one of the sensing control terminal of the second pixel circuit and the sensing control terminal of the first pixel circuit;

an Nth stage output sub-circuit configured to, in response to the valid voltage at the Nth stage pull-up node, transmit an Nth stage first clock signal of an Nth stage first clock signal terminal to an Nth stage first output terminal as the Nth stage first scan signal, and transmit an Nth stage second clock signal applied to an Nth stage second clock signal terminal to an Nth stage second output terminal as the Nth stage second scan signal, wherein both the Nth stage first output terminal and the Nth stage second output terminal are coupled to the first pixel circuit.

4. The display apparatus according to claim 3, wherein the sensing control signal output sub-circuit includes:

a fifth transistor including a gate, a first electrode and a second electrode, wherein in the fifth transistor, the gate is coupled to the Mth stage pull-up node, the first electrode is coupled to the Mth stage third clock signal terminal, and the second electrode is coupled to the sensing control signal output terminal.

5. The display apparatus according to claim 4, wherein the sensing control signal output sub-circuit further includes:

a first capacitor including a first end and a second end, wherein in the first capacitor, the first end is coupled to the gate of the fifth transistor and the Mth stage pull-up node, and the second end is coupled to the second electrode of the fifth transistor and the sensing control signal output terminal.

6. The display apparatus according to claim 3, wherein the shift register circuit further includes:

a shift signal output sub-circuit configured to, in response to the valid voltage at the Nth stage pull-up node, transmit an Nth stage third clock signal applied to an Nth stage third clock signal terminal to a shift signal output terminal.

7. The display apparatus according to claim 3, wherein the shift register circuit further includes:

a first reset sub-circuit configured to set the Mth stage pull-up node and the Nth stage pull-up node to be at an invalid voltage in response to a first reset signal of a first reset input terminal.

8. The display apparatus according to claim 3, wherein the shift register circuit further includes:

an Mth stage first pull-down control sub-circuit configured to, in response to the valid voltage at the Mth stage pull-up node, set an Mth stage first pull-down node to be at an invalid voltage;

an Mth stage first noise reduction sub-circuit is configured to, in response to the Mth stage first pull-down node being at a valid voltage, set at least one of the Mth stage first output terminal and the Mth stage second output terminal to be at an invalid voltage.

9. The display apparatus according to claim 8, wherein the Mth stage first pull-down control sub-circuit includes:

a sixth transistor including a gate, a first electrode and a second electrode, wherein in the sixth transistor, both the gate and the first electrode are coupled to a fifth voltage terminal;

a seventh transistor including a gate, a first electrode and a second electrode, wherein in the seventh transistor, the gate is coupled to the second electrode of the sixth transistor, the first electrode is coupled to the fifth voltage terminal, and the second electrode is coupled to the Mth stage first pull-down node;

an eighth transistor including a gate, a first electrode and a second electrode, wherein in the eighth transistor, the gate is coupled to the Mth stage pull-up node, the first electrode is coupled to the second electrode of the seventh transistor and the Mth stage first pull-down node, and the second electrode is coupled to a fourth voltage terminal; and a ninth transistor including a gate, a first electrode and a second electrode, wherein in the ninth transistor, the gate is coupled to the Mth stage pull-up node, the first electrode is coupled to the second electrode of the sixth transistor and the gate of the seventh transistor, and the second electrode is coupled to a sixth voltage terminal.

10. The display apparatus according to claim 8, wherein the shift register circuit further includes at least one of a first sensing control signal noise reduction sub-circuit and an M stage first pull-up node noise reduction sub-circuit;

the first sensing control signal noise reduction sub-circuit is configured to set the sensing control signal output terminal to be at an invalid voltage in response to the valid voltage at the Mth stage first pull-down node; and the M stage first pull-up node noise reduction sub-circuit is configured to set the Mth stage pull-up node to be at an invalid voltage in response to the valid voltage at the Mth stage first pull-down node.

11. The display apparatus according to claim 3, wherein the first voltage terminal is coupled to the second voltage terminal.

12. The display apparatus according to claim 3, wherein the sensing control sub-circuit includes:

a first transistor including a gate, a first electrode and a second electrode, wherein in the first transistor, the gate is coupled to the sensing control terminal, the first electrode is coupled to the second voltage terminal, and the second electrode is coupled to the first terminal of the driving sub-circuit.

13. The display apparatus according to claim 3, wherein the light-emitting control sub-circuit includes:
a second transistor including a gate, a first electrode and a second electrode, wherein in the second transistor, the gate is configured to receive the light-emitting control signal, the first electrode is coupled to the first voltage terminal, and the second electrode is coupled to the first terminal of the driving sub-circuit.

14. The display apparatus according to claim 13, wherein the sensing control sub-circuit includes a first transistor; and in the first transistor, a gate is coupled to the sensing control terminal, a first electrode is coupled to the second voltage terminal, and a second electrode is coupled to the first terminal of the driving sub-circuit;
a width-to-length ratio of the first transistor is greater than that of the second transistor.

15. The display apparatus according to claim 3, wherein the driving sub-circuit includes:
a third transistor including a gate, a first electrode and a second electrode, wherein in the third transistor, the gate is configured to receive the first scan signal, and the first electrode is configured to receive the data signal;
a driving transistor including a gate, a first electrode and a second electrode, wherein in the driving transistor, the gate is coupled to the second electrode of the third transistor, the first electrode serves as the first terminal of the driving sub-circuit, and the second electrode serves as the second terminal of the driving sub-circuit and is coupled to the light-emitting device; and
a storage capacitor includes a first end and a second end; the first end and the second end of the storage capacitor are respectively coupled to the gate and the second electrode of the driving transistor.

16. The display apparatus according to claim 3, wherein the sensing sub-circuit includes:
a fourth transistor including a gate, a first electrode and a second electrode, wherein in the fourth transistor, the gate is configured to receive the second scan signal, the first electrode is coupled to the second terminal of the driving sub-circuit, and the second electrode is coupled to the sensing terminal.

* * * * *